United States Patent
Ooishi et al.

(10) Patent No.: US 6,351,178 B1
(45) Date of Patent: Feb. 26, 2002

(54) REFERENCE POTENTIAL GENERATING CIRCUIT

(75) Inventors: Tsukasa Ooishi; Yuichiro Komiya, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/126,709

(22) Filed: Jul. 31, 1998

Related U.S. Application Data

(62) Division of application No. 08/755,933, filed on Nov. 25, 1996, now Pat. No. 5,847,597, which is a continuation of application No. 08/393,798, filed on Feb. 24, 1995, now abandoned.

(30) Foreign Application Priority Data

| Feb. 28, 1994 | (JP) | ................................. 6-029873 |
| Oct. 17, 1994 | (JP) | ................................. 6-251002 |
| Jan. 4, 1995 | (JP) | ................................. 7-00071 |

(51) Int. Cl.[7] ................................ G05F 3/16
(52) U.S. Cl. .................. 327/541; 327/543; 323/313
(58) Field of Search ................. 327/538, 539, 327/540, 541, 542, 543, 143, 198; 323/313, 314, 315

(56) References Cited

U.S. PATENT DOCUMENTS

| 4,634,894 A | * | 1/1987 | Shu et al. .................... 327/537 |
| 4,663,584 A | * | 5/1987 | Okada et al. ................. 327/537 |
| 4,670,706 A | | 6/1987 | Tobita ......................... 323/313 |
| 4,706,011 A | | 11/1987 | Vergara et al. ............... 327/77 |
| 4,788,455 A | | 11/1988 | Mori et al. ................... 327/537 |
| 4,994,688 A | | 2/1991 | Horiguchi et al. ........... 327/541 |
| 5,034,625 A | | 7/1991 | Min et al. .................... 327/537 |
| 5,059,890 A | | 10/1991 | Yoshikawa et al. .......... 327/541 |
| 5,187,386 A | * | 2/1993 | Chang et al. ................. 327/537 |
| 5,187,685 A | * | 2/1993 | Sato et al. ............... 365/189.09 |
| 5,191,235 A | | 3/1993 | Hara ........................... 327/534 |
| 5,202,587 A | | 4/1993 | McLaury ..................... 327/536 |
| 5,227,675 A | | 7/1993 | Taguchi ....................... 327/534 |
| 5,262,989 A | | 11/1993 | Lee et al. ............... 365/189.01 |
| 5,270,591 A | | 12/1993 | Ross ........................... 327/77 |
| 5,329,169 A | * | 7/1994 | Ihara .......................... 327/544 |

(List continued on next page.)

FOREIGN PATENT DOCUMENTS

| JP | 60-103827 | 6/1985 | ........... H03F/19/00 |
| JP | 63-174115 | 7/1988 | ............. G05F/3/24 |

OTHER PUBLICATIONS

"CMOS Analog Integrated Circuits Based on Weak Inversion Operation", Vittoz et al., IEEE Journal of Solid State Circuits, vol. SC–12, No. 3, June 1977, pp. 224–231.

"An Experimental 1.5–V 64–Mb DRAM", Nakagome et al., IEEE Journal of Solid–State Circuits, vol. 26, No. 4, April 1991, pp. 465–472.

Primary Examiner—Timothy P. Callahan
Assistant Examiner—Terry L. Englund
(74) Attorney, Agent, or Firm—McDermott, Will & Emery

(57) ABSTRACT

Reference potential generating circuit includes an output N channel MOS transistor connected between a power supply node and an output node; an output P channel MOS transistor connected between output node and ground node; a control P channel MOS transistor having its source connected to a power supply node and its gate connected to the output node; a control N channel MOS transistor having its source connected to the ground node and its gate connected to the output node; a diode connected reference N channel MOS transistor connected in series with the control P channel MOS transistor; and a diode connected reference P channel MOS transistor connected in series between the control N channel MOS transistor and the reference N channel MOS transistor.

20 Claims, 61 Drawing Sheets

U.S. PATENT DOCUMENTS

| | | | |
|---|---|---|---|
| 5,341,340 A | 8/1994 | Hagura | 365/189.09 |
| 5,347,170 A | 9/1994 | Hayakawa et al. | 327/541 |
| 5,362,988 A * | 11/1994 | Hellums | 327/543 |
| 5,369,354 A * | 11/1994 | Mori | 323/313 |
| 5,382,839 A | 1/1995 | Shinohara | 327/545 |
| 5,394,026 A | 2/1995 | Yu et al. | 327/536 |
| 5,414,669 A | 5/1995 | Tedrow et al. | 365/189.09 |
| 5,436,552 A | 7/1995 | Kajimoto | 323/313 |
| 5,446,418 A | 8/1995 | Hara et al. | 365/189.09 |
| 5,451,891 A | 9/1995 | Tanabe | 327/89 |
| 5,463,333 A | 10/1995 | Calder et al. | 327/78 |
| 5,467,050 A | 11/1995 | Clapp, III et al. | 327/108 |
| 5,510,749 A | 4/1996 | Arimoto | 327/170 |
| 5,534,817 A * | 7/1996 | Suzuki et al. | 327/545 |
| 5,592,119 A * | 1/1997 | Yoo | 327/530 |
| 5,610,550 A * | 3/1997 | Furutani | 327/543 |
| 5,703,475 A * | 12/1997 | Lee et al. | 323/313 |
| 5,734,292 A * | 3/1998 | Shirai et al. | 327/541 |
| 5,757,225 A * | 5/1998 | Tobita | 327/540 |

\* cited by examiner

REFERENCE POTENTIAL GENERATING CIRCUIT

CROSS-REFERENCE TO RELATED APPLICATION

This application is a Divisional Application of application Ser. No. 08/755,933 filed on Nov. 25, 1996 now U.S. Pat. No. 5,847,597, and abandoned which is a Continuation Application of 08/393,798 filed on Feb. 24, 1995 which has been abandoned. The copending application Ser. No. 08/190,329, filed on Jan. 31, 1994 has been issued as U.S. Pat. No. 5,610,550, commonly assigned with the present invention.

BACKGROUND OF THE INVENTION

1. Field of the Invention

The present invention relates to a reference potential generating circuit, a potential detecting circuit and a semiconductor integrated circuit device. More specifically, it relates to an intermediate potential generating circuit used in a semiconductor memory device, an internal potential detecting circuit for controlling an internal potential generating circuit used in a semiconductor memory device, and to a semiconductor integrated circuit device including the internal potential generating circuit.

2. Description of the Background Art

FIG. 81 is a schematic diagram showing a main structure of a dynamic random access memory (hereinafter referred to as a "DRAM") which is one of semiconductor memory devices.

Referring to FIG. 81, the DRAM includes a bit line pair BL and /BL, word lines WL arranged in a direction orthogonal to the bit line pair BL and /BL, memory cells arranged corresponding to crossings between bit line pair BL and /BL and word lines WL, sense amplifiers SAn and SAp amplifying the voltage generated between the bit line pair BL and /BL, and a precharge circuit PC for precharging the bit line pair BL and /BL to an intermediate potential (½) Vcc of the power supply potential Vcc.

The memory cell MC includes a transfer gate TG and a capacitor C, and it is adapted such that when the potential at word line WL rises, data generated on the bit line pair BL and /BL is written to the capacitor C, or the data stored in capacitor C is read to bit line pair BL and /BL.

Sense amplifiers SAn and SAp are formed by an N channel sense amplifier SAn and a P channel sense amplifier SAp. N channel sense amplifier SAn includes cross coupled two N channel MOS transistors. P channel sense amplifier SAp includes two cross coupled P channel MOS transistors.

Precharge circuit PC supplies the intermediate potential (½) Vcc from precharge line VBL to bit line pair BL and /BL, and equalizes both potentials of the bit line pair BL and /BL in response to a control signal from a equalizing line EQ.

Reading operation of the DRAM will be described with reference to a timing chart of FIG. 82.

Before reading the data, bit line pair BL and /BL are precharged to the intermediate potential (½) Vcc. Then, when the potential of the word line WL increases to the boosted potential Vpp, the data in capacitor C is read to bit line BL through transfer gate TG, and therefore the potential of the bit line BL is shifted to the power supply potential Vcc or the ground potential Vss.

Then, when transfer gates S0 and /S0 (not shown) connected to sense amplifier driving lines SN and SP are rendered conductive, the potential of bit line BL attains to the ground potential Vss and the potential of bit line /BL attains to the power supply potential Vcc, for example.

As described above, in the DRAM, it is necessary to precharge the bit line pair BL and /BL to the intermediate potential (½) Vcc.

FIG. 83 is a schematic diagram showing the whole structure of a conventional intermediate potential generating circuit disclosed in U.S. Pat. No. 4,788,455.

Referring to FIG. 83, the intermediate potential generating circuit includes a reference potential generating stage 1 generating a reference potential $V_{ref}1$, a reference potential generating stage 2 generating a reference potential $V_{ref}2$, an output stage 3 responsive to these reference potential $V_{ref}1$ and $V_{ref}2$ for generating an intermediate potential (½) Vcc, and an output node 4.

Reference potential generating stage 1 includes a resistance element 1a, an N channel MOS transistor 1b, an N channel MOS transistor 1c and a resistance element 1d connected in series between a power supply node 100 to which the power supply potential Vcc is applied and a ground node 200 to which the ground potential Vss is applied. Reference potential generating stage 2 includes a resistance element 2a, a P channel MOS transistor 2b, a P channel MOS transistor 2c and a resistance element 2d connected in series between power supply node 100 and ground node 200. Output stage 3 includes an N channel MOS transistor 3a and a P channel MOS transistor 3b connected in series between power supply node 100 and ground node 200.

The reference potential $V_{ref}1$ generated at node N1 is determined by a threshold voltage $V_{dn}$ of diode connected N channel MOS transistor 1b. The reference potential $V_{ref}2$ generated at node N2 is determined by the absolute value $|V_{tp}|$ of the threshold voltage of diode connected P channel MOS transistor 2c.

Therefore, at the gate electrode of P channel MOS transistor 3a in output stage 3, a voltage (½) Vcc+$V_{tn}$ higher than the intermediate potential by the threshold voltage is applied. To the gate electrode of P channel MOS transistor 3b, a potential (½) Vcc−$|V_{tp}|$ lower than the intermediate potential by the absolute value of the threshold voltage is applied. Therefore, an intermediate potential (½) Vcc is generated as the output potential $V_{out}$ at output node 4.

FIG. 85 shows the whole structure of an intermediate potential generating circuit shown in FIG. 4 of Japanese Patent Laying-Open No. 63-174115.

Referring to FIG. 85, the intermediate potential generating circuit includes reference potential generating stage 5 for generating two reference potentials, an output stage 3 and an output node 4. The output stage 3 is the same as that shown in FIG. 83.

The reference potential generating stage 5 of the intermediate potential generating circuit includes a P channel MOS transistor 5a having its gate electrode connected to ground node 200, a diode connected N channel MOS transistor 5b, a diode connected P channel MOS transistor 5c, and an N channel MOS transistor 5d having its gate connected to power supply node 100.

Similar to the one described above, in this intermediate potential generating circuit, a potential higher than the intermediate potential by the threshold voltage is applied to the gate electrode of N channel MOS transistor 3a in output stage 3, and a potential lower than the intermediate potential by the absolute value of the threshold voltage is applied to the gate electrode of P channel MOS transistor 3b, and hence the intermediate potential (½) Vcc is generated at the output node 4.

FIG. 86 is a schematic diagram showing an example of a boosted potential detecting circuit used in a DRAM. The boosted potential Vpp is supplied as power supply to a word driver driving a word line, for example. Referring to FIG. 86, the boosted potential detecting circuit includes P channel MOS transistors 6a to 6d connected in series between a detecting node 804 and ground node 200, and an inverter 7. Transistors 6a to 6d are each diode connected. Inverter 7 consists of P channel MOS transistor 7a and an N channel MOS transistor 7b.

In the boosted potential detecting circuit, when the potential at node NA is lower than the logical threshold value of inverter 7, an enable signal GE at the H (logic high) level is generated at output node 801. In response to the H level enable signal GE, the boosted potential generating circuit (not shown) is activated. Meanwhile, when the potential at node NA becomes higher than the logical threshold value of inverter 7, an enable signal GE at the L (logic low) level is generated at output node 801. In response to the L level enable signal GE, the boosted potential generating circuit is inactivated.

However, in the intermediate potential generating circuit shown in FIG. 83, in order to reduce through current flowing from power supply node 100 to ground node 200 in reference potential generating stage 1, the values of resistance elements 1a and 1d must be set as high as several MΩ. The same applies to reference potential generating stage 2.

In contrast, in the DRAM, in order to increase the speed of signal transmission, interconnection material having smaller resistance value per unit length tends to be used. Therefore, when such a material that has small resistance value per unit length is used for forming the resistance elements 1a, 1d, 2a and 2d, the layout area would be considerably large.

FIG. 84 is a graph showing time change of potentials at various nodes immediately after power on of the intermediate potential generating circuit shown in FIG. 83.

Referring to FIG. 84, when the power is turned on, initially the potential at power supply node 100 gradually increases from 0V to Vcc. The dotted line in the graph represents half the potential of the power supply node 100.

Since resistance element 1a of reference potential generating stage 1 has very large value, the potential at node N1 does not rapidly increase even when the potential at power supply node 100 increases. Further, since resistance element 2a in reference potential generating stage 2 also has large value, the potential at node N2 does not rapidly increase, either. Therefore, it takes very long for the output potential $V_{out}$ to reach the intermediate potential (½) Vcc.

The current I flowing in reference potential generating stage 5 of the intermediate potential generating circuit shown in FIG. 85 is represented by the following equation (1):

$$I = \beta_p(Vcc - V_{tn})(Vcc - V_{tp}) \quad (1)$$

where $\beta_p$ represents the degree of movement of holes in P channel MOS transistor. $V_{tn}$ represents the threshold voltage of the N channel MOS transistor. $V_{tp}$ represents the threshold voltage of the P channel MOS transistor.

In the intermediate potential generating circuit, when the current I represented by the equation (1) flows in reference potential generating stage 5, the intermediate potential (½) Vcc is generated at output node 4. Therefore, the current I does not have the desired value unless the threshold voltages $V_{tn}$ and $V_{tp}$ are set accurately, causing deviation of the output potential $V_{out}$ from the intermediate potential (½) Vcc.

FIG. 3 is a graph showing a result of simulation of output potential $V_{out}$ with respect to the deviation of the threshold voltage $V_{tn}$, when the power supply potential Vcc is set to 2.5V. As is apparent from the graph, when the threshold voltage $V_{tn}$ deviates, the output potential $V_{out}$ varies significantly.

In the boosted potential detecting circuit shown in FIG. 86, when the power supply potential Vcc fluctuates, the logical threshold value of inverter 7 varies, and therefore the detection level of the boosted potential detecting circuit is not stable. Further, since the boosted potential Vpp is applied to node NA through diode connected three transistors 6a to 6c, the detection level of the boosted potential detecting circuit also varies when the operational temperature varies. This is because the threshold voltage of the transistor varies when the operational temperature changes. Since three transistors are connected in series in the boosted potential detecting circuit, the fluctuation of the threshold voltage is amplified three times.

SUMMARY OF THE INVENTION

An object of the present invention is to provide a reference potential generating circuit which is capable of generating more stable reference potential.

Another object of the present invention is to provide a reference potential generating circuit capable of generating a desired reference potential accurately.

A still further object of the present invention is to provide a reference potential generating circuit capable of generating a desired reference potential quickly after power on.

A still further object of the present invention is to provide a reference potential generating circuit of which layout area is sufficiently small.

A still further object of the present invention is to provide an internal potential detecting circuit having a stable detection level.

A still further object of the present invention is to provide an internal potential detecting circuit of which detection level does not fluctuate with the fluctuation of the power supply potential.

A still further object of the present invention is to provide an internal potential detecting circuit of which detection level does not fluctuate with the fluctuation of operational temperature.

The reference potential generating circuit according to one aspect of the present invention is for generating a reference potential between a first potential and a second potential, and it includes an output node, a first transistor of a first conductivity type, for example, an N channel MOS transistor, a first transistor of a second conductivity type, for example a P channel MOS transistor, a second transistor of the second conductivity type, a second transistor of the first conductivity type, a third transistor of the first conductivity type and a third transistor of the second conductivity type. The aforementioned reference potential is generated at the output node. The aforementioned first transistor of the first conductivity type has one conduction electrode connected to the output node, and another conduction electrode connected to a first node to which a third potential is applied. The first transistor of the second conductivity type has one conduction electrode connected to the output node, and another conduction electrode connected to a second node to which a fourth potential is applied. The second transistor of the second conductivity type has one conduction electrode connected to a third node to which the first potential is applied, another conduction electrode connected to a control electrode of the first transistor of the first conductivity type, and a control electrode connected to the output node. The second transistor of the first conductivity type has one conduction terminal connected to a fourth node to which the second potential is applied, another conduction electrode connected to a control electrode of the first transistor of the second conductivity type, and a control electrode connected to the output node. The third transistor of the first conductivity type has one conduction electrode, and another conduction electrode and a control electrode connected to each other and to said another conduction electrode of the second transistor of the second conductivity type. The third transistor of the second conductivity type has one conduction electrode connected to the aforementioned one conduction electrode of the third transistor of the first conductivity type, and another conduction electrode and a control electrode connected to each other and to the aforementioned another conduction electrode of the second transistor of the first conductivity type.

The reference potential generating circuit according to another aspect of the present invention includes an output node, a transistor of a first conductivity type, for example a P channel MOS transistor, an output resistance element, and a control potential generating circuit. A reference potential is generated at the output node. The transistor of the first conductivity type has one conduction electrode connected to a first node to which the first potential is applied, and another conduction electrode connected to the aforementioned output node. The output resistance element is connected between the output node and a second node to which a second potential is applied. The control potential generating circuit includes a first path from a third node to which a third potential is applied to a fourth node to which a fourth potential is applied; a second path from a fifth node to which a fifth potential is applied to a sixth node to which a sixth potential is applied; a first current mirror circuit responsive to a current flowing through the first path for controlling current flowing through the second path; a second current mirror circuit responsive to the current flowing through the second path for controlling the current flowing through the first path; a control node positioned in the first path between the first and second current mirror circuits and connected to the control electrode of the transistor of the first conductivity type; a first resistance element connected in the first path between the control node and the first current mirror circuit; and a second resistance element connected in the first path between the second current mirror circuit and the fourth node.

According to a still further aspect of the present invention, the potential detecting circuit detects a potential to be detected, and determines whether or not the detected internal potential has reached a prescribed detection level, and it includes an output node, a reference current supplying circuit, a detection node, and comparing current supplying circuit. The reference current supplying circuit supplies a prescribed reference current to the output node. To the detection node, a potential to be detected is applied. The comparing current supplying circuit supplies a comparing current to the output node, in response to the potential applied to the detection node. At this time, when a positive reference current is applied to the output node, a negative comparing current is supplied to the output node.

Conversely, when a negative reference current is supplied to the output node, a positive comparing current is applied to the output node.

Therefore, in the reference potential generating circuit described above, the reference potential generated at the output node is fed back to the control electrode of the second transistor of the second conductivity type and the control electrode of the second transistor of the first conductivity type, and therefore even when the reference potential varies, it quickly returns to the original value. Therefore, a more stable reference potential can be generated. When the power is turned on, initially the potential at the output node is 0V. This potential is also fed back to the control electrode of the second transistor of the second conductivity type and the control electrode of the second transistor of the first conductivity type. Therefore, the potential at the output node quickly attains the reference potential. Further, the second transistor of the second conductivity type and the third transistor of the first conductivity type are arranged in symmetry with respect to the second transistor of the first conductivity type and the third transistor of the second conductivity type. Therefore, the potential at the node at which one conduction electrode of the third transistor of the first conductivity type and one conduction electrode of the third transistor of the second conductivity type are connected to each other assumes exactly the intermediate potential between the first and second potentials. Therefore, an accurate intermediate potential can be generated as the reference potential. Further, since the second transistor of the second conductivity type and the second transistor of the first conductivity type are used for supplying current to the third transistor of the first conductivity type and the third transistor of the second conductivity type, the layout area can be reduced as compared with an example employing a resistance element.

In the reference potential generating circuit according to another aspect of the present invention, when the value of the first resistance element is appropriately changed, the control potential supplied to the control electrode of the transistor of the first conductivity type varies in response to the change of the resistance value, and therefore current flowing through the output resistance element also varies. Therefore, the desired reference potential can be generated at the output node.

In the internal potential detecting circuit according to the still further aspect of the present invention, the relation of magnitude of the reference current and a comparing current varies in response to the internal potential applied to the detection node. Therefore, when the internal potential attains to the detection level, the potential at the output node changes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
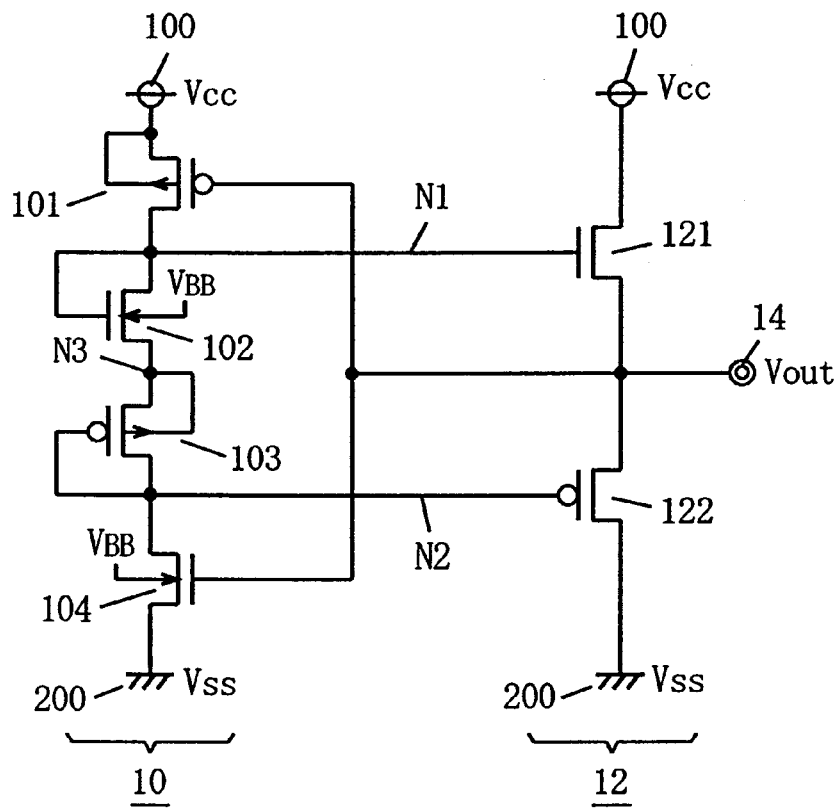
FIG. 1 is a schematic diagram showing a whole structure of an intermediate potential generating circuit in accordance with Embodiment 1 of the present invention.

Embodiments of the present invention will be described in detail with reference to the figures. In the figures, the same reference characters denote the same or corresponding portions.

[Embodiment 1]

FIG. 1 is a circuit diagram showing the whole structure of an intermediate potential generating circuit in accordance with Embodiment 1 of the present invention.

Referring to FIG. 1, the intermediate potential generating circuit includes a reference potential generating stage 10 for generating two reference potentials $V_{ref}1$ and $V_{ref}2$, an output stage 12 responsive to these reference potentials $V_{ref}1$ and $V_{ref}2$ for generating an intermediate potential (½) Vcc between power supply potential Vcc and ground potential Vss, and an output node 14.

Reference potential generating stage 10 includes a P channel MOS transistor 101, an N channel MOS transistor 102, a P channel MOS transistor 103 and an N channel MOS transistor 104. These transistors 101 to 104 are connected in series between a power supply node 100 to which power supply potential Vcc is applied, and ground node 200 to which ground potential Vss is applied.

P channel MOS transistor 101 has a source electrode connected to power supply node 100 and a gate electrode connected to output node 14. A back gate electrode is commonly connected to the source electrode.

N channel MOS transistor 102 has drain and gate electrodes connected to drain electrode of P channel MOS transistor 101. These drain and gate electrodes are connected to each other. Namely, N channel MOS transistor 102 is diode connected.

P channel MOS transistor 103 has its source electrode connected to source electrode of N channel MOS transistor, 102, and drain and gate electrodes connected to each other. Namely, P channel MOS transistor 103 is diode connected. The back gate electrode is commonly connected to the source.

N channel MOS transistor 104 has its drain electrode connected to the source and gate electrodes of P channel MOS transistor 103, its source electrode connected to ground node 200, and its gate electrode connected to output node 14.

To the back gates of N channel MOS transistors 102 and 104, a substrate potential $V_{BB}$ which is lower than the ground potential Vss is applied. The structure of P channel MOS transistor 101 is identical with that of P channel MOS transistor 103. N channel MOS transistor 102 has identical structure as N channel MOS transistor 104.

Output stage 12 includes an N channel MOS transistor 121 and a P channel MOS transistor 122. These transistors 121 and 122 are connected in series between power supply node 100 and ground node 200.

N channel MOS transistor 121 has its drain electrode connected to power supply node 100, its source electrode connected to output node 14, and gate electrode connected to the drain and gate electrodes of N channel MOS transistor 102. The threshold voltage of N channel MOS transistor 121 is approximately equal to or larger than the threshold voltage $V_{tn}$ of N channel MOS transistor 102.

P channel MOS transistor 122 has a source electrode connected to output node 14, drain electrode connected to ground node 200, and gate electrode connected to the drain and gate electrodes of P channel MOS transistor 103. The threshold voltage of P channel MOS transistor 122 is set to be equal to or larger than the absolute value $|V_{tp}|$ of the threshold voltage of P channel MOS transistor 103.

The operation of the intermediate potential generating circuit will be described in detail.

In reference potential generating stage 10, four transistors 101 to 104 are arranged in symmetry with node N3 being the center, and therefore an intermediate potential (½) Vcc exactly in the middle of power supply potential Vcc and ground potential Vss is generated at node N3.

Further, since N channel MOS transistor 102 is diode connected, a potential (½) Vcc+$V_{tn}$ higher than the potential at node N3, that is, higher than the intermediate potential by the threshold voltage $V_{tn}$ is generated at node N1, as reference potential $V_{ref}1$.

Meanwhile, since P channel MOS transistor 103 is also diode connected, a potential (½) Vcc−$|V_{tp}|$ lower than the potential at node N3, that is, lower than the intermediate potential by the absolute value of the threshold voltage $|V_{tp}|$ is generated at node N2, as reference potential $V_{ref}2$.

The reference potential $V_{ref}1$ generated in reference potential generating stage 10 is applied to the gate electrode of N channel MOS transistor 121 of output stage 12. Reference potential $V_{ref}2$ is applied to the gate electrode of P channel MOS transistor 122.

Since the threshold voltage of N channel MOS transistor 121 is set equal to or slightly larger than the threshold voltage of N channel MOS transistor 102, N channel MOS transistor 121 is slightly rendered conductive. Since the absolute value of the threshold voltage of P channel MOS transistor 122 is set to be equal to or slightly larger than the absolute value $|V_{tp}|$ of the threshold voltage of P channel MOS transistor 103, P channel MOS transistor 122 is also slightly rendered conductive.

In this output stage 12 also, since transistors 121 and 122 are arranged in symmetry, an intermediate potential (½) Vcc is generated at output node 14.

An operation when the potential at output node 14 (hereinafter referred to as "output potential") $V_{out}$ is to be shifted from the intermediate potential (½) Vcc in the intermediate potential generating circuit will be described.

When the output potential $V_{out}$ lowers, the gate potential with respect to the source potential rises in N channel MOS transistor 121, and therefore conduction resistance of N channel MOS transistor 121 decreases, and a current flows from power supply node 100 through transistor 121 to output node 14. Therefore, output potential $V_{out}$ rises.

Further, at this time, the output potential $V_{out}$ is applied to the gate electrode of P channel MOS transistor 101, and hence conduction resistance of transistor 101 decreases and a current flows from power supply node 100 through transistor 101 to node N1. Therefore, when output potential $V_{out}$ lowers, the gate potential of N channel MOS transistor 121 increases quickly, and thus output potential $V_{out}$ quickly returns to the original intermediate potential (½) Vcc.

Meanwhile, if output potential $V_{out}$ rises, gate potential with respect to the source potential decreases in P channel MOS transistor 122, and therefore conduction resistance of transistor 122 decreases. Therefore, output potential $V_{out}$ lowers.

Further, since the output potential $V_{out}$ is applied to the gate electrode of N channel MOS transistor 104 at this time, conduction resistance of transistor 104 decreases, and the potential at node N2 lowers quickly. Therefore, when the output potential $V_{out}$ rises from the intermediate potential (½) Vcc, it returns to the original value quickly.

Figure 85:
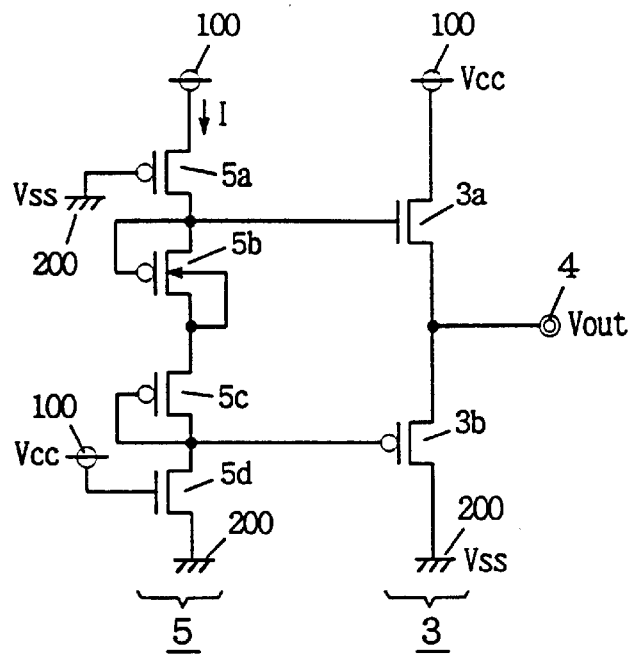
FIG. 85 is a schematic diagram showing a whole structure of another conventional intermediate potential generating circuit.
Figure 86:
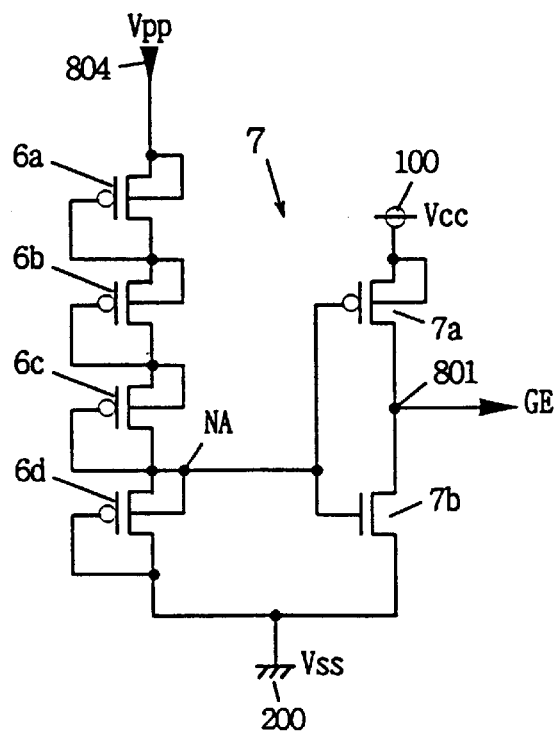
FIG. 86 is a schematic diagram showing a structure of a conventional boosted potential detecting circuit.

In this manner, in the intermediate potential generating circuit according to Embodiment 1, since the output potential $V_{out}$ is fed back to reference potential generating stage 10, even when output potential $V_{out}$ deviates from the intermediate potential (½) Vcc, it quickly returns to the original intermediate potential (½) Vcc. Therefore, the intermediate potential generating circuit can generate a stable intermediate potential (½) Vcc as compared with the conventional intermediate potential generating circuit shown in FIGS. 83 and 85.

Figure 2:
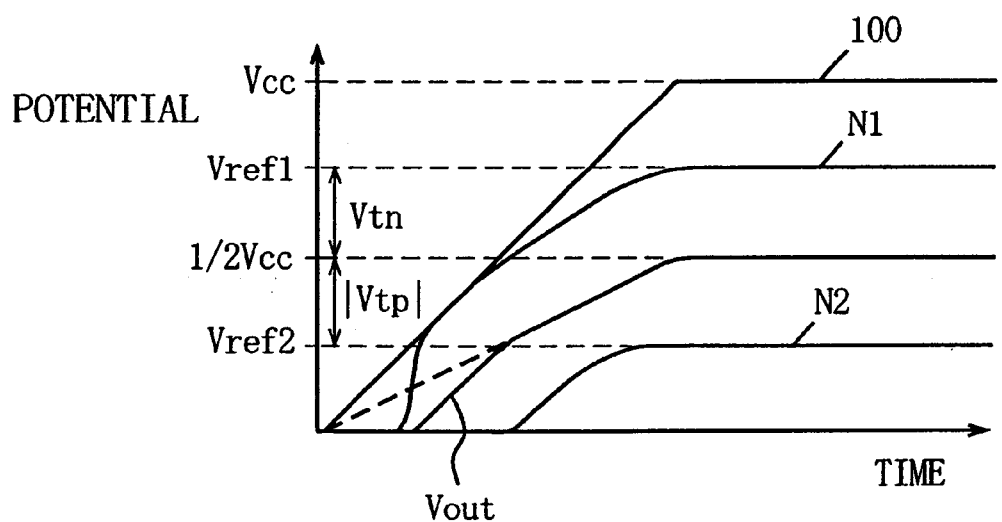
FIG. 2 is a graph showing the manner of change of potentials at various nodes with time, immediately after power on of the intermediate potential generating circuit shown in FIG. 1.

FIG. 2 is a graph showing the manner of change of potentials at nodes 100, N1, 14 and N2 with time, immediately after power on of the intermediate potential generating circuit.

Referring to FIG. 2, when power is turned on, the potential at power supply node 100 increases from 0V to power supply potential Vcc. The dotted line in FIG. 2 shows a half of the potential at power supply node 100. Since output potential $V_{out}$ is initially at 0V, the conduction resistance of P channel MOS transistor 101 is sufficiently small. Therefore, the potential at node N1 rises quickly, and N channel MOS transistor 121 is rendered fully conductive quickly. Therefore, output potential $V_{out}$ quickly attains one half the potential of power supply node 100. Therefore, output potential $V_{out}$ attains the intermediate potential (½) Vcc in a short period of time from power on. Therefore, in the intermediate potential generating circuit, the intermediate potential (½) can be attained faster than in the conventional intermediate potential generating circuit shown in FIG. 83.

Figure 83:
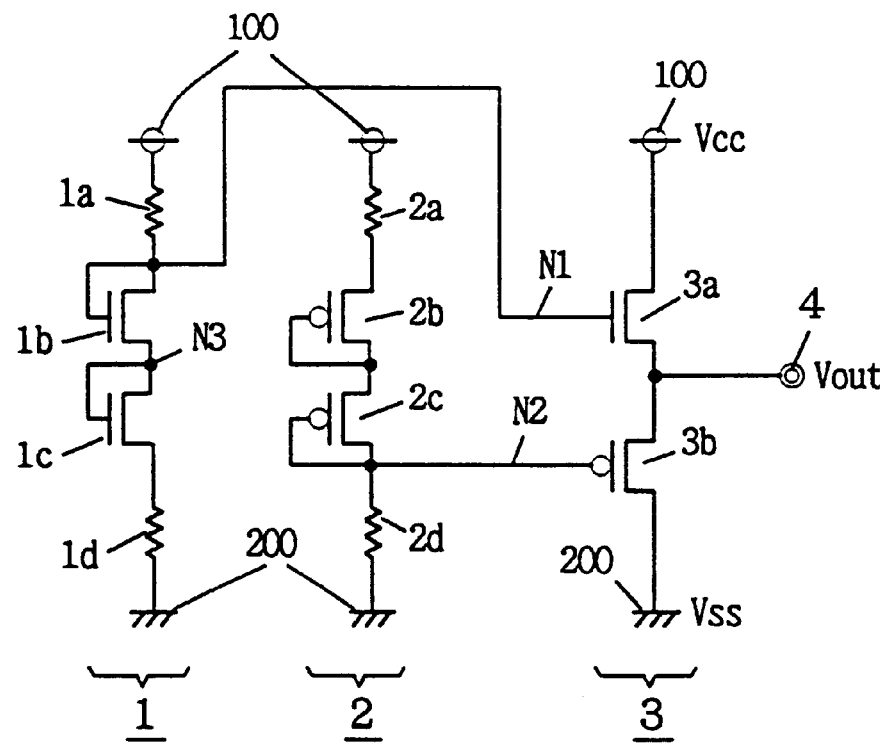
FIG. 83 shows a whole structure of a conventional intermediate potential generating circuit.
Figure 84:
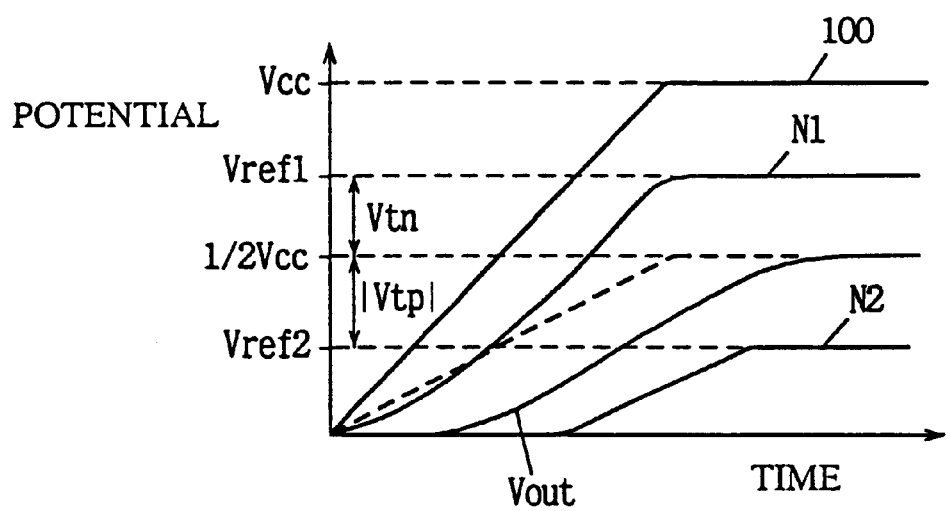
FIG. 84 is a graph showing the manner of change of potentials at various nodes with time, immediately after power on of the intermediate potential generating circuit shown in FIG. 83.

In reference potential generating stages 1 and 2 of the conventional intermediate potential generating circuit shown in FIG. 83, resistance elements 1a, 1d, 2a and 2d are provided. By contrast, reference potential generating stage 10 of the intermediate potential generating circuit in accordance with Embodiment 1 includes transistors 101 and 104. Therefore, larger resistance value can be realized by smaller area of occupation than resistance elements 1a, 1d, 2a and 2d. Therefore, the layout area of the intermediate potential generating circuit can be reduced from the conventional area.

Figure 3:
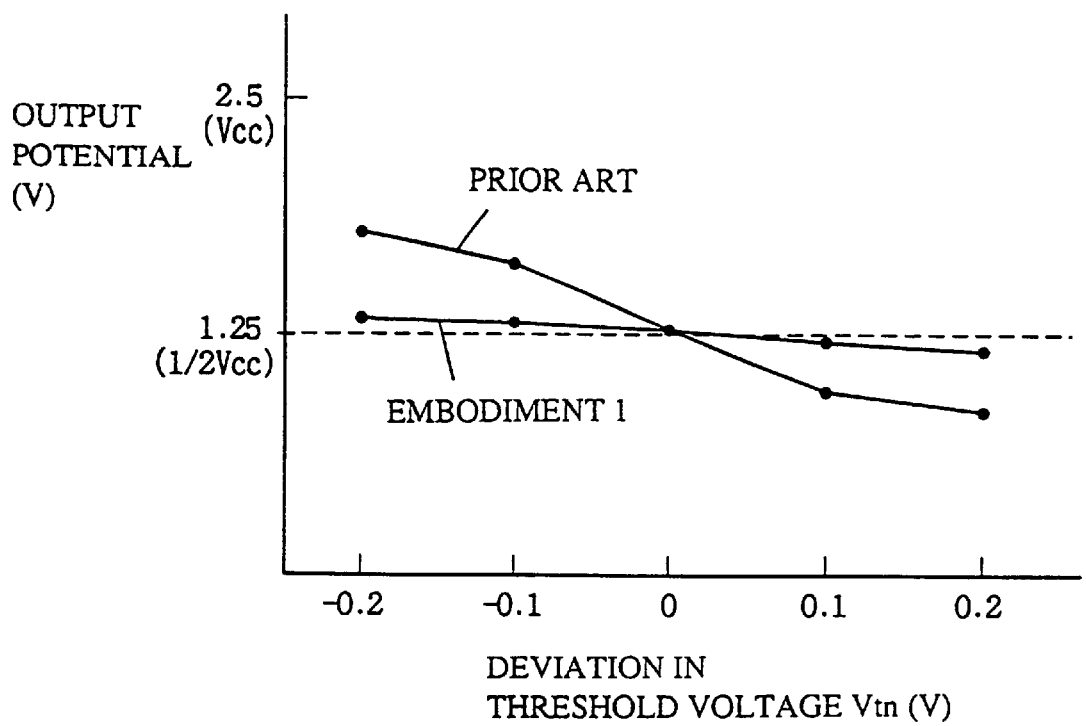
FIG. 3 is a graph showing a manner of change of the output potential with respect to deviation of the threshold voltage of a transistor in the intermediate potential generating circuit shown in FIG. 1.

FIG. 3 is a graph showing how much the output potential $V_{out}$ deviates when the threshold voltage $V_{tn}$ of N channel MOS transistors 102 and 104 deviate from a desired threshold voltage. This graph shows the result of simulation when power supply potential Vcc is set to 2.5V.

In the intermediate potential generating circuit, when the degree of movement of the holes in N channel MOS transistor is equal to that of P channel MOS transistor, an intermediate potential (½) Vcc is generated at output node 14. Therefore, even if the threshold voltage of the transistor deviates from the desired value as in the conventional intermediate potential generating circuit shown in FIG. 85, the output potential $V_{out}$ hardly deviates from the intermediate potential (½) Vcc. Therefore, the intermediate potential generating circuit can generate more accurate intermediate potential (½) Vcc than the prior art.

In Embodiment 1, interconnection from output node 14 to the gate electrodes of transistors 101 and 104 constitute control potential applying means for applying the intermediate potential (½) Vcc as the control potential to the gate electrodes of transistors 101 and 104.

[Embodiment 2]

Figure 4:
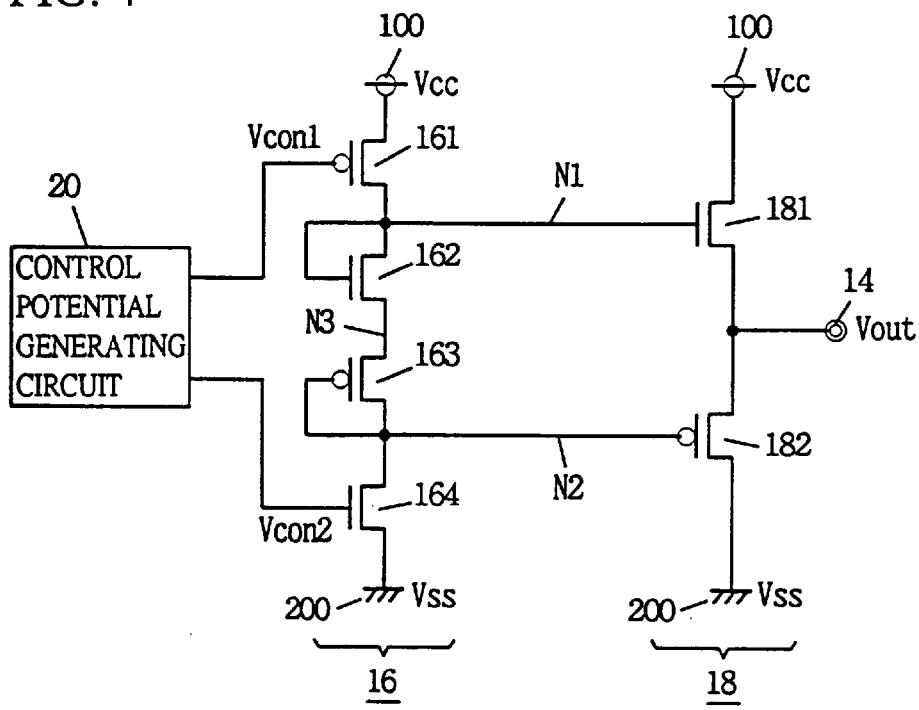
FIG. 4 is a block diagram showing a whole structure of the intermediate potential generating circuit in accordance with Embodiment 2 of the present invention.

FIG. 4 is a block diagram showing a whole structure of an intermediate potential generating circuit in accordance with Embodiment 2 of the present invention.

Referring to FIG. 4, the intermediate potential generating circuit includes a control potential generating circuit 20 for generating two control potentials $V_{con}1$ and $V_{con}2$; a reference potential generating stage 16 responsive to these control potentials $V_{con}1$ and $V_{con}2$ for generating two reference potentials $V_{ref}1$ and $V_{ref}2$; an output stage 18 responsive to these reference potentials $V_{ref}1$ and $V_{ref}2$ for generating an output potential $V_{out}$; and an output node 14. Reference potential generating stage 16 includes, similar to reference potential generating stage 10 of Embodiment 1 above, a P channel MOS transistor 161, a diode connected N channel MOS transistor 162, a diode connected P channel MOS transistor 163 and an N channel MOS transistor 164, and these transistors 161 to 164 are connected in series between power supply node 100 and ground node 200.

However, different from reference potential generating stage 10 of Embodiment 1 above, control potential $V_{con}1$ from control potential generating circuit 20 is applied to the gate electrode of P channel MOS transistor 161, and control potential $V_{con}2$ from control potential generating circuit 20 is applied to the gate electrode of N channel MOS transistor 164.

Similar to output stage 12 of Embodiment 1 above, output stage 18 includes an N channel MOS transistor 181 and a P channel MOS transistor 182, and these transistors 181 and 182 are connected in series between power supply node and ground node 200.

However, different from output node 14 of Embodiment 1 above, the output node 14 is not connected to the gate electrodes of transistors 161 and 164 of reference potential generating stage 16.

In the intermediate potential generating circuit, when intermediate potential (½) Vcc is applied as control potentials $V_{con}1$ and $V_{con}2$ to the gate electrodes of transistors 161 and 164 from control potential generating circuit 20, an intermediate potential (½) Vcc is generated at output node 14 as in Embodiment 1 above. However, the intermediate potential (½) Vcc applied to the gate electrodes of transistors 161 and 164 is generated by control potential generating circuit 20, and therefore different from the intermediate potential (½) Vcc generated at output node 14, it does not fluctuate.

In the intermediate potential generating circuit, control potential generating circuit 20 can generate desired control potentials $V_{con}1$ and $V_{con}2$. Therefore, even if reference potential generating stage 16 is not formed symmetrically, the potential at node N3 can be set at the intermediate potential (½) Vcc. Therefore, a desired intermediate potential (½) Vcc can be generated by the intermediate potential generating circuit by adjusting the control potential generating circuit 20.

[Embodiment 3]

Figure 5:
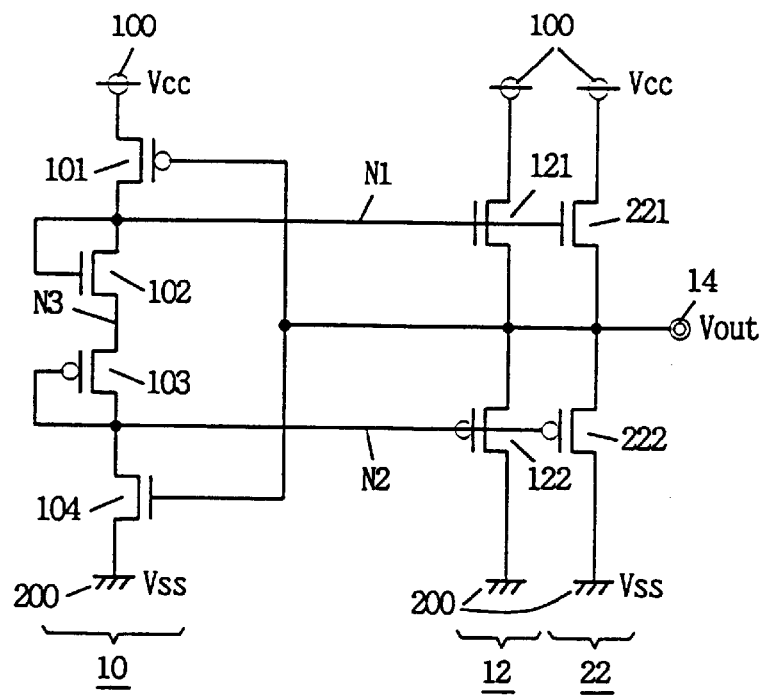
FIG. 5 is a schematic diagram showing a whole structure of an intermediate potential generating circuit in accordance with Embodiment 3 of the present invention.

FIG. 5 is a circuit diagram showing a whole structure of an intermediate potential generating circuit in accordance with Embodiment 3 of the present invention.

Referring to FIG. 5, the intermediate potential generating circuit includes a reference potential generating stage 10, a first output stage 10, a second output stage 22, and an output node 14. The intermediate potential generating circuit differs from the intermediate potential generating circuit of Embodiment 1 in that a second output stage 22 is newly provided.

The second output stage 22 includes an N channel MOS transistor 221 and a P channel MOS transistor 222, and these transistors 221 and 222 are connected in series between power supply node 100 and ground node 200.

N channel MOS transistor 221 has drain electrode connected to power supply node 100, source electrode connected to output node 14 and gate electrode connected to drain and gate electrodes of N channel MOS transistor 102 in reference potential generating stage 10. The channel length of N channel MOS transistor 221 is made longer than that of N channel MOS transistor 121 in the first output stage 12. Therefore, the threshold voltage of N channel MOS transistor 221 is larger than that of N channel MOS transistor 121.

The channel width of N channel MOS transistor 221 is made wider than that of N channel MOS transistor 121.

Therefore, drivability of N channel MOS transistor 221 is larger than that of N channel MOS transistor 121.

Meanwhile, P channel MOS transistor 222 has source electrode connected to output node 14, drain electrode connected to ground node 200, and gate electrode connected to drain and gate electrodes of P channel MOS transistor 103. The channel length of P channel MOS transistor 222 is made longer than that of P channel MOS transistor 122. Therefore, the threshold voltage of P channel MOS transistor 222 is larger than that of P channel MOS transistor 122.

The channel width of P channel MOS transistor 222 is made wider than that of P channel MOS transistor 122. Therefore, drivability of P channel MOS transistor 222 is made larger than that of P channel MOS transistor 122.

When the intermediate potential generating circuit is in a state of equilibrium, that is, when an intermediate potential (½) Vcc is generated at output node 14, a through current of about the sub threshold current flows through the first output stage 12. However, current does not flow at all in the second output stage 22.

Now, when the output potential $V_{out}$ slightly deviates from the intermediate potential (½) Vcc, transistor 121 or 122 of the first output stage 12 is rendered conductive, and the output potential $V_{out}$ returns to the intermediate potential (½) Vcc.

When the output potential $V_{out}$ largely deviates from intermediate potential (½) Vcc, not only the first output stage 12 but also transistor 221 or 222 of the second output stage 22 is rendered conductive, and the output potential $V_{out}$ returns to the intermediate potential (½) Vcc.

The drivability of transistors 221 and 222 of the second output stage 12 is larger than that of transistors 121 and 122 of the first output stage 22, and therefore even when the output potential $V_{out}$ fluctuates significantly, its quickly returns to the original value.

The intermediate potential generating circuit is adapted such that the fluctuated output potential $V_{out}$ is returned to the original intermediate potential (½) Vcc in accordance with the level of fluctuation of the output potential $V_{out}$. Therefore, the output potential $V_{out}$ does not oscillate near the intermediate potential (½) Vcc but quickly returns to the original intermediate potential (½) Vcc.

In Embodiment 3, the channel length and channel width of transistors 221 and 222 in the second output stage 22 are made longer than those of the first output stage 12. However, even when the length and width are the same as those in the first stage, the intermediate potential (½) Vcc is generated at output node 14. Though two output stages 12 and 22 are provided in Embodiment 3, three or more output stages may be provided.

[Embodiment 4]

Figure 6:
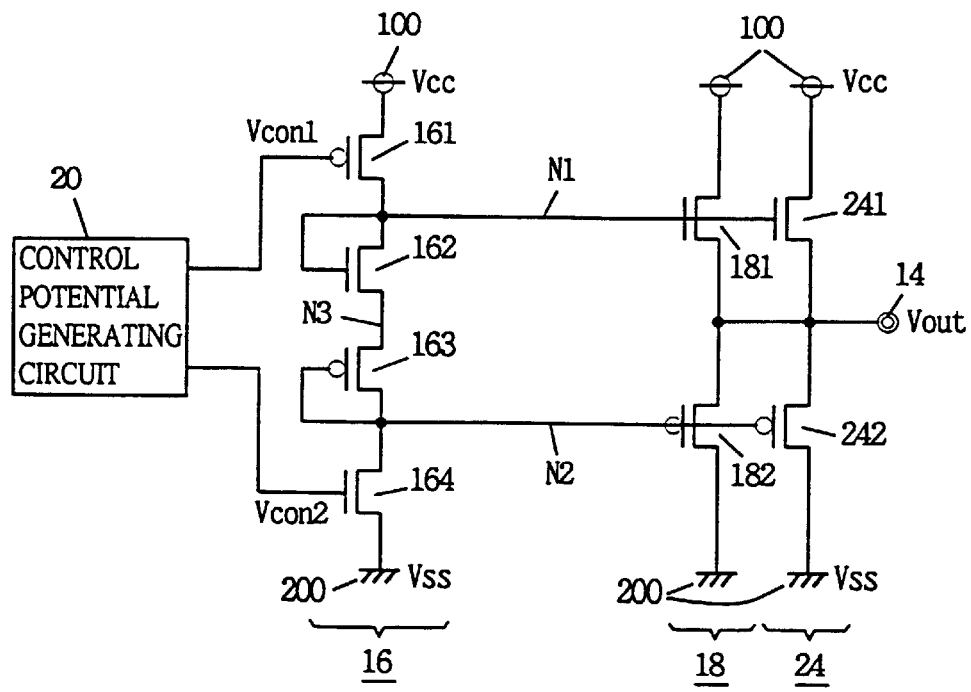
FIG. 6 is a block diagram showing a whole structure of an intermediate potential generating circuit in accordance with Embodiment 4 of the present invention.

FIG. 6 is a block diagram showing a whole structure of the intermediate potential generating circuit in accordance with Embodiment 4 of the present invention. Embodiment 4 is an application of Embodiment 3 to Embodiment 2.

Referring to FIG. 6, the intermediate potential generating circuit includes a control potential generating circuit 20, a reference potential generating stage 16, two output stages 18 and 24, and an output node. The threshold voltage of N channel MOS transistor 241 in the second output stage 24 is made larger than that of N channel MOS transistor 181 in the first output stage 18, and drivability of transistor 241 is made larger than that of transistor 181. The absolute value of the threshold voltage of P channel MOS transistor 242 in the second output stage 24 is made larger than that of P channel MOS transistor 182 of the first output stage 18, and drivability of transistor 242 is made larger than that of transistor 182.

In the intermediate potential generating circuit, by appropriately changing control potentials $V_{con}1$ and $V_{con}2$ generated by control potential generating circuit 20, the potential at node N3 can be set to the intermediate potential (½) Vcc, and therefore accurate intermediate potential (½) Vcc can be generated at output node 14.

Further, since first and second output stages 18 and 24 operate to return the output potential $V_{out}$ to the intermediate potential (½) Vcc in accordance with the level of fluctuation of the output potential $V_{out}$, a stable intermediate potential (½) Vcc can be generated constantly.

[Embodiment 5]

Figure 7:
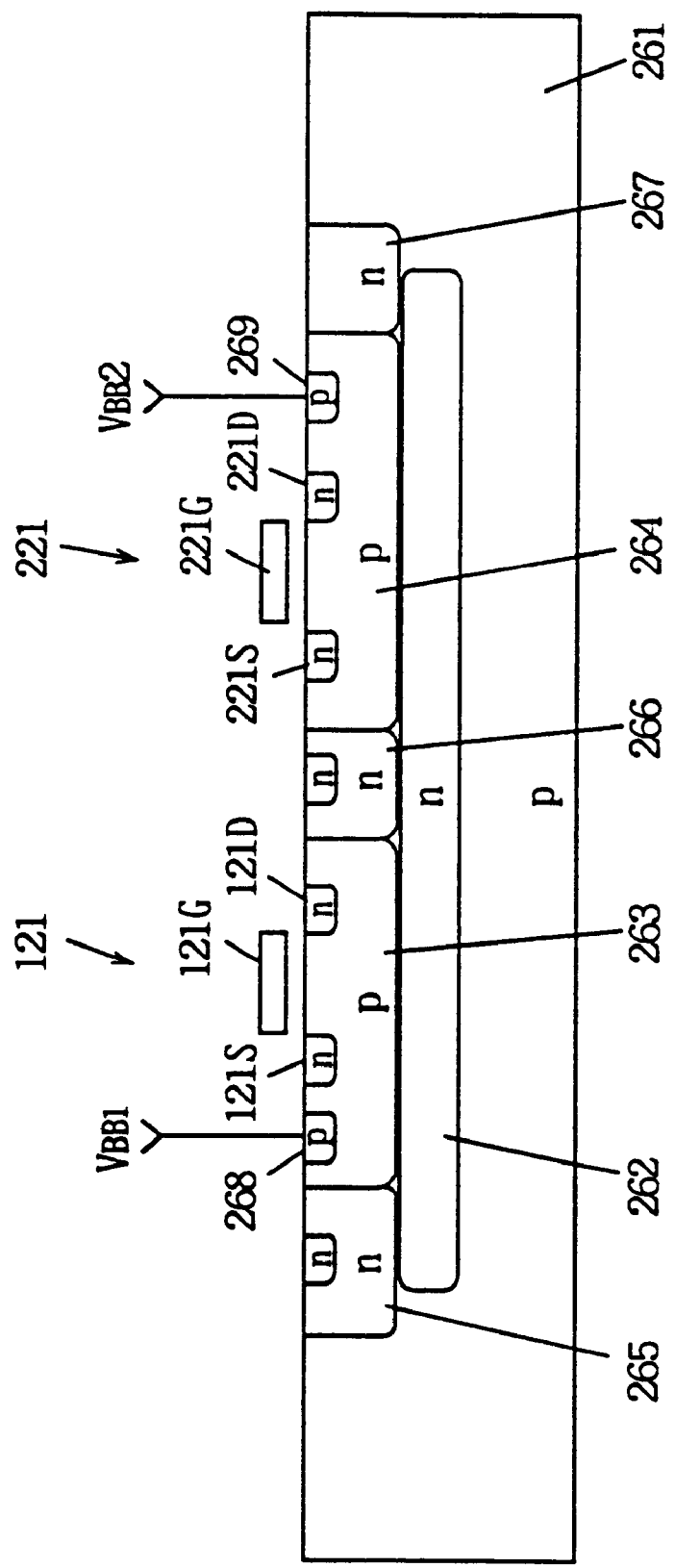
FIG. 7 is a cross section showing a transistor structure in an intermediate potential generating circuit in accordance with Embodiment 5 of the present invention.

FIG. 7 is a cross section showing a structure of a transistor in an intermediate potential generating circuit in accordance with Embodiment 5 of the present invention.

In Embodiment 3 above, the threshold voltage of transistors 221 and 222 of the second output stage 22 is set higher than that of transistors 121 and 122 as the channel length is made longer than that of transistors 121 and 122 of the first output stage 12. However, the threshold voltage of the transistor may be changed by varying back bias.

Referring to FIG. 7, N channel MOS transistors 121 and 221 of Embodiment 5 are formed in P type wells 263 and 264 formed in a semiconductor substrate 261.

More specifically, N channel MOS transistor 121 includes source region 121S and drain region 121D formed in P type well 263 and a gate electrode 121G formed on the channel region with an insulating film therebetween. N channel MOS transistor 221 includes source region 221S and drain region 221D formed in P type well 264 and a gate electrode 221G.

In order to separate the P type wells 263 and 264 from p type semiconductor substrate 261, an N type buried layer 262 and three N type wells 265 to 267 are formed. On P type well 263, a contact region 268 is formed for applying a substrate potential $V_{BB}1$. On P type well 264, a contact region 269 is formed for applying substrate potential $V_{BB}2$.

Accordingly, substrate potentials $V_{BB}1$ and $V_{BB}2$ can be applied independent from each other to the back gates of two N channel MOS transistors 121 and 221. Therefore, by setting substrate potential $V_{BB}2$ lower than substrate potential $V_{BB}1$, the threshold voltage of transistor 221 can be made larger than that of transistor 121.

As is apparent from Embodiment 5, by applying different substrate potentials $V_{BB}1$ and $V_{BB}2$ to the transistors in the first and second output stages, the threshold voltages may be made different from each other. However, the structure of the transistor is simplified when the threshold voltage is changed by changing the channel length, than by applying different substrate potentials.

[Embodiment 6]

Figure 8:
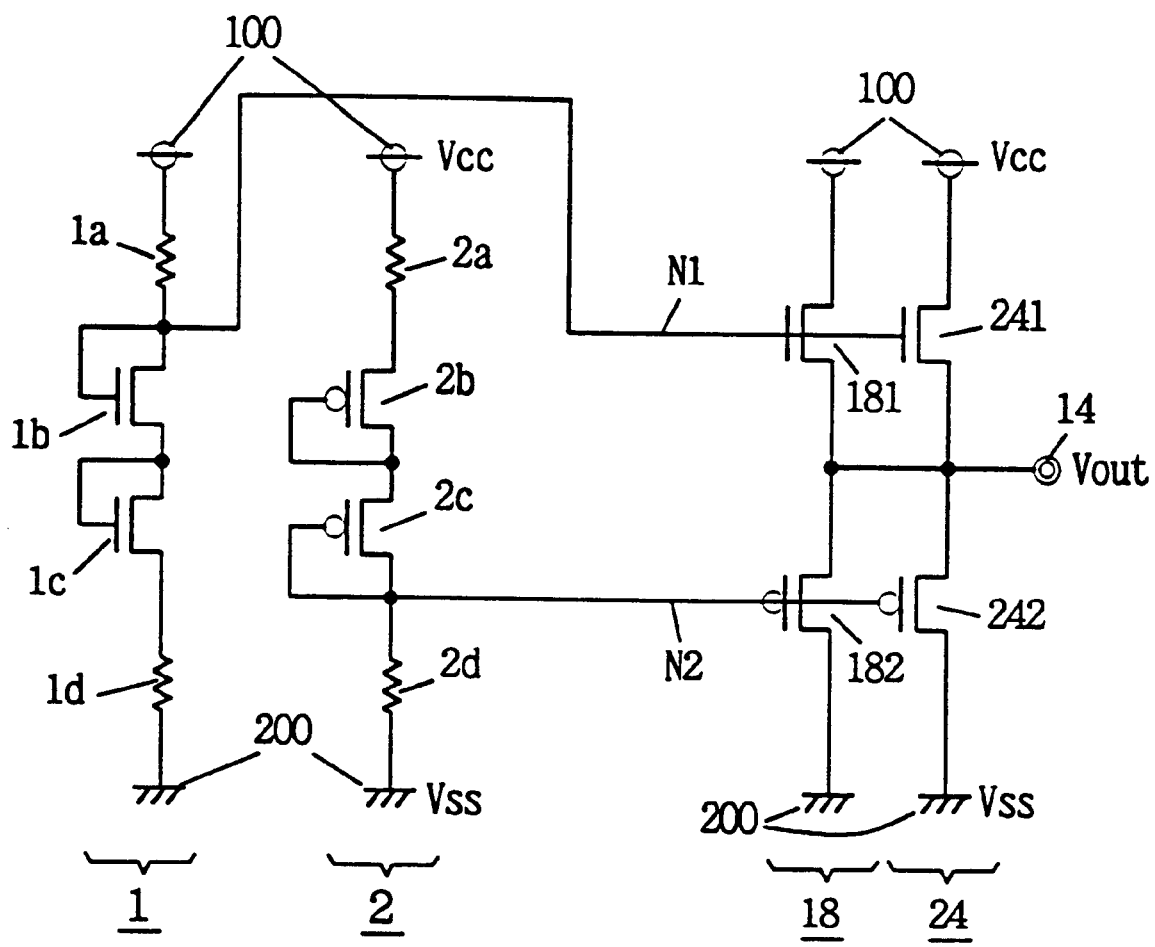
FIG. 8 is a schematic diagram showing a whole structure of an intermediate potential generating circuit in accordance with Embodiment 6 of the present invention.

FIG. 8 is a circuit diagram showing the whole structure of an intermediate potential generating circuit in accordance with Embodiment 6 of the present invention. In Embodiment 6, reference potential generating stages 1 and 2 of the conventional intermediate potential generating circuit shown in FIG. 83 are provided in place of control potential generating circuit 20 and reference potential generating stage 16 of Embodiment 4 above.

Referring to FIG. 8, the intermediate potential generating circuit includes two reference potential generating stages 1 and 2, two output stages 18 and 24, and an output node 14.

The channel length of N channel MOS transistor 241 of the second output stage 24 is made longer than that of N channel MOS transistor 181 of the first output stage 18, and the channel length of P channel MOS transistor 242 is made longer than that of P channel MOS transistor 182.

Therefore, as in Embodiment 4 above, the first and second output stages 18 and 24 operate appropriately in accordance with the fluctuation level of output potential $V_{out}$, and hence a stable intermediate potential (½) Vcc is constantly generated at output node 14.

[Embodiment 7]

Figure 9:
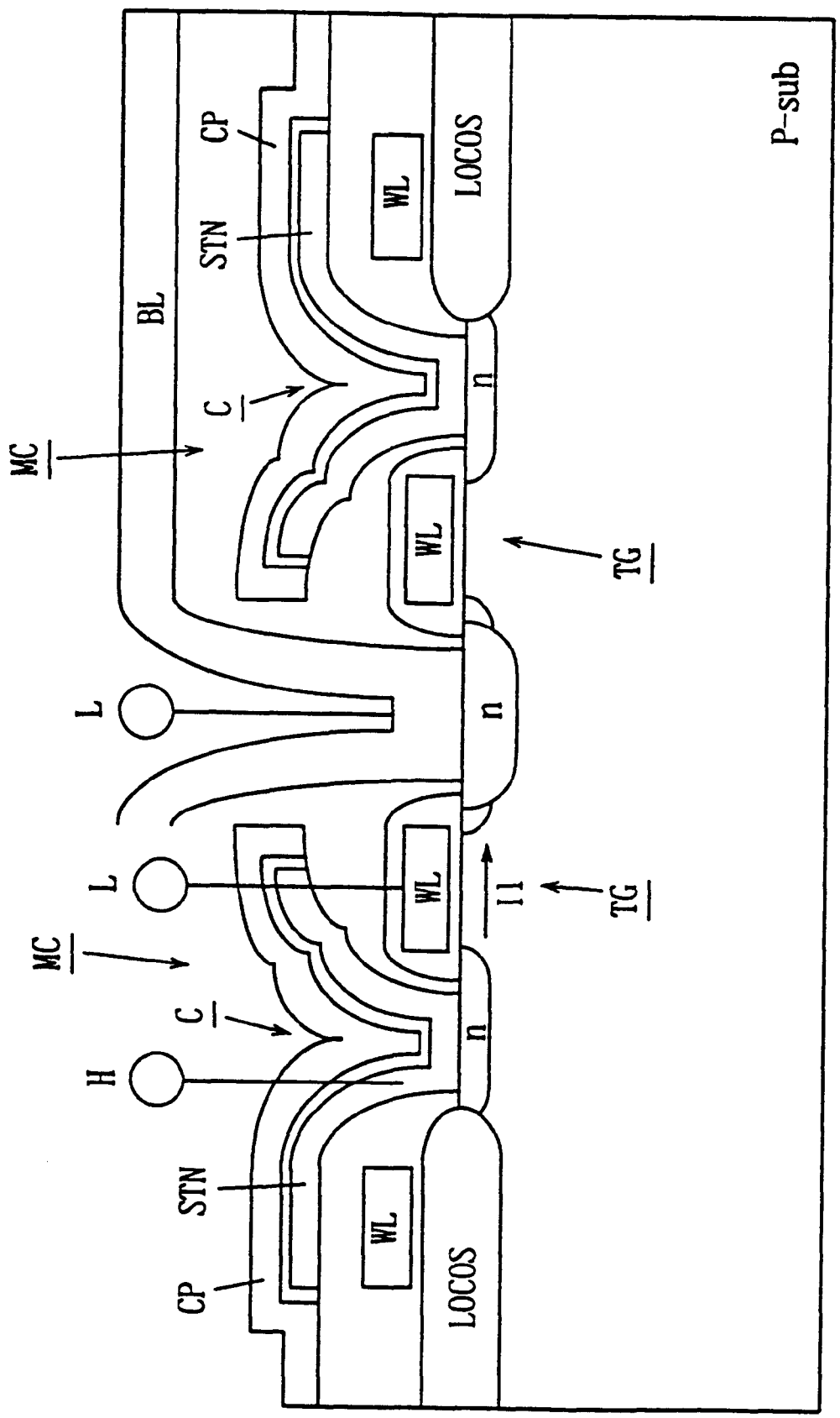
FIG. 9 is a cross section showing a structure of a memory cell of a DRAM.
Figure 10:
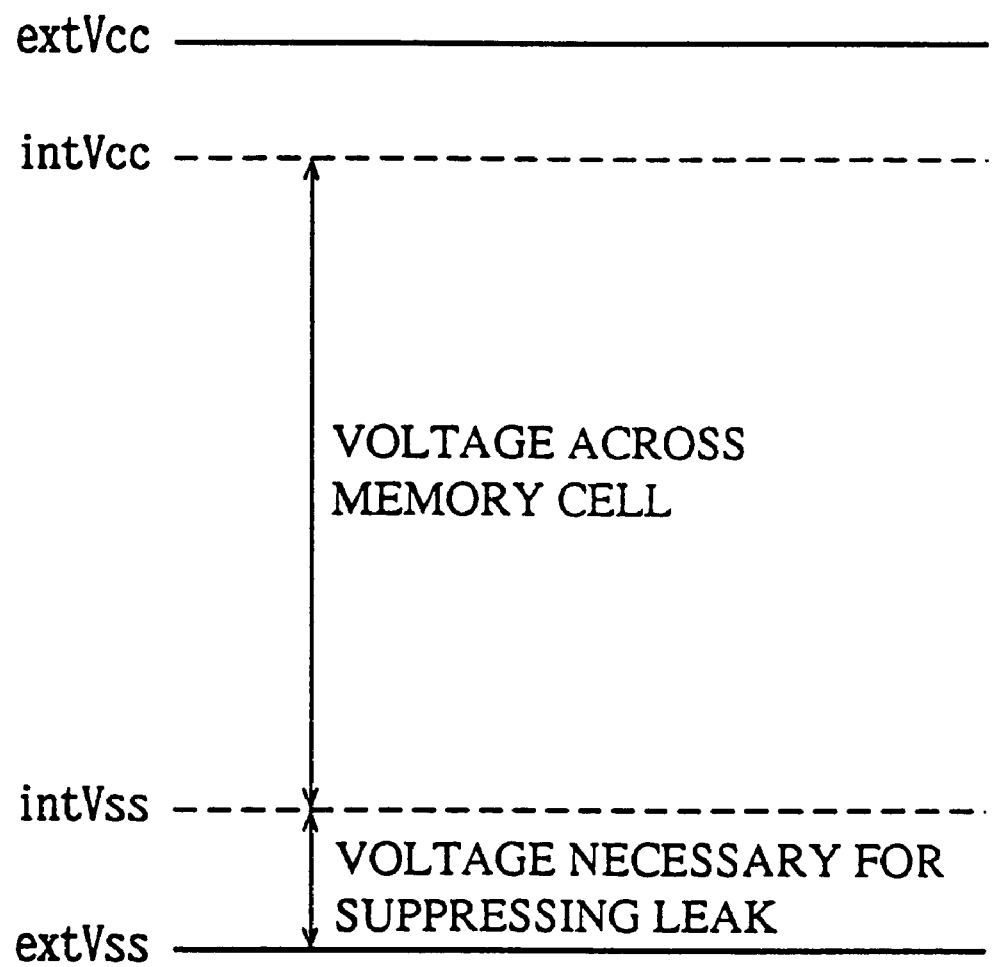
FIG. 10 is a graph showing relation between power supply potentials in a hierarchical power supply method.

FIG. 9 is a cross section showing a memory cell structure of a DRAM. Two memory cells are shown in FIG. 9.

Referring to FIG. 9, a capacitor C in memory cell MC is formed by a storage node STN and a cell plate CP. A transfer gate TG of memory cell MC is formed by a gate electrode, which is the word line WL, an N type source region, and an N type drain region. A bit line BL is connected to the N type source region.

Here, when the storage node STN is at the H level, the word line WL is at the L level and the bit line BL is at the L level, sub threshold current $I_1$ flows in the channel region below the word line WL, which may possibly destroy the data stored in capacitor C.

Therefore, there has been proposed a method in which the potential of the word line WL is made substantially lower than the bit line BL even when the word line WL and bit line BL both attain to the L level, by setting the L level of the bit line BL higher than that of the word line WL. This method is referred to as hierarchical power supply method.

More specifically, in such hierarchical power supply method, the potential at word line WL swings between a boosted potential Vpp and an external ground potential extVss, while the potential at bit line BL swings between an internal power supply potential intVcc which is lower than the external power supply potential extVcc and an internal ground potential intVss which is higher than the external ground potential extVss. Therefore, even when the potential at storage node STN attains to the H level, the potential at word line WL attains to the L level and the potential at bit line BL attains to the L level, the potential at word line WL becomes substantially lower than the potential of bit line BL, and therefore leakage of the sub threshold current in the channel region can be suppressed. Therefore, destruction of data stored in capacitor C is not likely.

Figure 11:
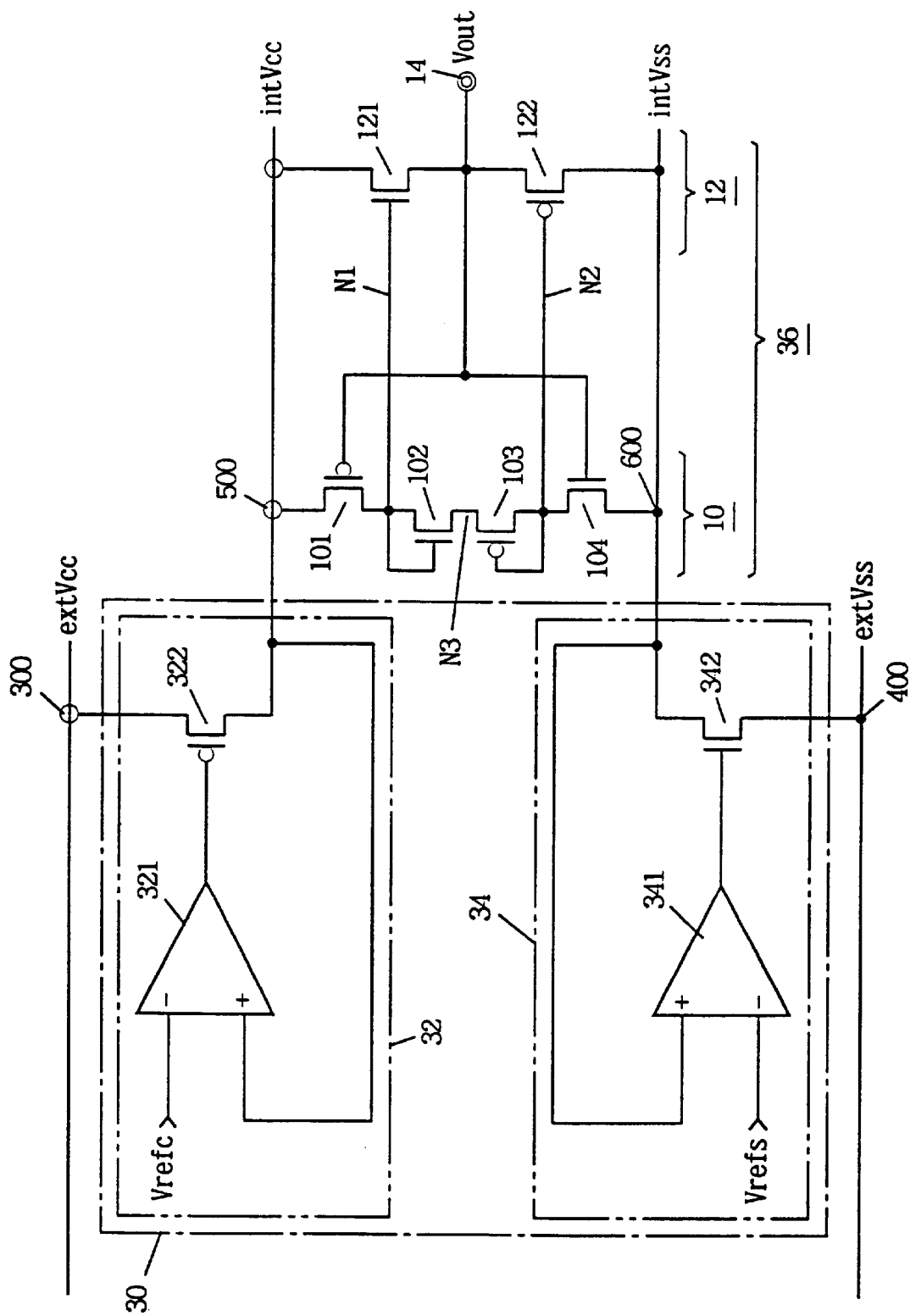
FIG. 11 is a schematic diagram showing a whole structure of an intermediate potential generating circuit in accordance with Embodiment 7 of the present invention.

FIG. 11 is a circuit diagram showing the whole structure of the internal potential generating circuit in accordance with Embodiment 7 of the present invention.

In the above described hierarchical power supply method, the potential of bit line BL swings between internal power supply potential intVcc and internal ground potential intVss. Therefore, the bit line BL must be precharged to the intermediate potential (½) (intVcc−intVss) (hereinafter referred to as "(½) Vcc" for convenience), between internal power supply potential intVcc and internal ground potential Vss.

Intermediate potential generating circuit 36 shown in FIG. 11 generates the above described intermediate potential (½) Vcc. Referring to FIG. 11, intermediate potential generating circuit 36 includes, as Embodiment 1, a reference potential generating stage 10 and an output stage 12. Intermediate potential generating circuit 36 differs from Embodiment 1 in that reference potential generating stage 10 and output stage 12 are both connected between internal power supply node 500 to which internal power supply potential intVcc is applied, and a ground node 600 to which internal ground potential intVss is applied.

Internal power supply potential intVcc is generated by a voltage lowering circuit 32 based on an external power supply potential extVcc. Internal ground potential intVss is generated by a boosting circuit 34 based on an external ground potential extVss.

Voltage lowering circuit 32 and boosting circuit 34 constitute a power supply voltage converting circuit 30 for converting an external power supply voltage to an internal power supply voltage. Voltage lowering circuit 32 includes a differential amplifier 321 comparing a basic reference potential $V_{refc}$ with internal power supply potential intVcc, and a P channel MOS transistor 322 operating in response to an output signal from the differential amplifier 321. By voltage lowering circuit 32, an internal power supply potential intVcc which is equal to the base reference potential $V_{refc}$ is generated at internal power supply node 500.

Meanwhile, boosting circuit 34 includes a differential amplifier 341 comparing a base reference potential $V_{refs}$ with internal ground potential intVss, and an N channel MOS transistor 342 operating in response to an output signal from differential amplifier 341. By boosting circuit 34, an internal ground potential intVss which is equal to the base reference potential $V_{refs}$ is generated at internal ground node 600.

As is apparent from Embodiment 7, when an intermediate potential (½) Vcc between internal power supply potential intVcc and internal ground potential intVss is necessary, the intermediate potential generating circuit may be connected between internal power supply node 500 and internal ground node 600.

Figure 12:
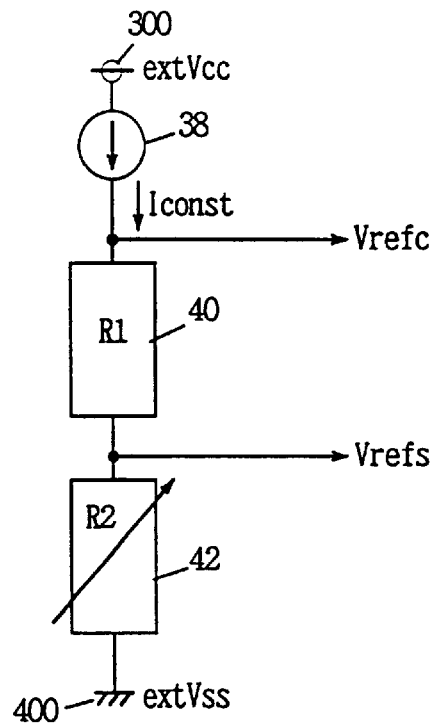
FIG. 12 shows a concept of a basic reference potential generating circuit in the intermediate potential generating circuit in accordance with Embodiment 7 of the present invention.

FIG. 12 is an illustration showing an example of the base reference potential generating circuit for generating two base reference potentials $V_{refc}$ and $V_{refs}$. In this example, the transistor 121 or 122 of FIG. 11 may have its drain electrode connected to a power supply node other than the internal power supply node 500 or internal ground node 600, for example, it may be connected to external power supply node 300 or external ground node 400. Transistor 121 and 122 may have their electrodes connected to power supply nodes other than nodes 500 and 600.

Referring to FIG. 12, the base reference potential generating circuit includes a constant current source 38 capable of supplying a constant reference current $I_{const}$, and two resistance elements 40 and 42 connected in series. Resistance element 40 has a constant resistance value R1. Resistance value R2 of resistance element 42 may be appropriately changed.

Figure 13:
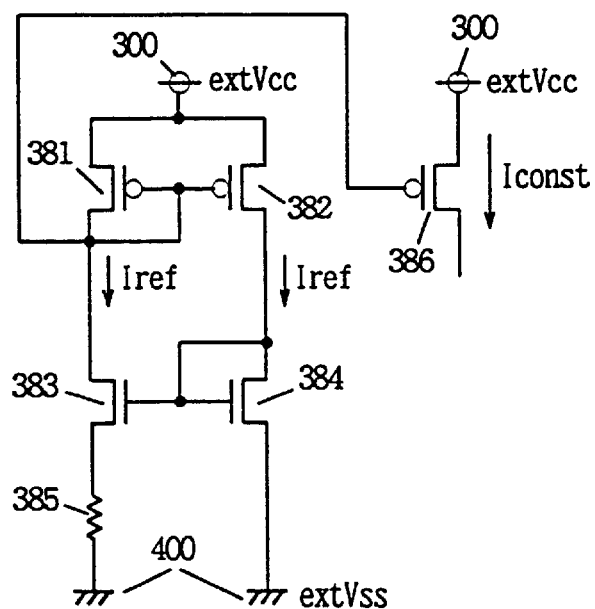
FIG. 13 is a schematic diagram showing specific structure of a constant current source in the basic reference potential generating circuit shown in FIG. 12.

FIG. 13 shows an example of constant current source 38 shown in FIG. 12.

Referring to FIG. 13, constant current source 38 includes a current mirror circuit consisting of two P channel MOS transistors 381 and 382, a current mirror circuit consisting of two N channel MOS transistors 383 and 384, a resistance element 385 connected between N channel MOS transistor 383 and an external ground node 400, and a P channel MOS transistor 386 for supplying a constant reference current $I_{const}$.

Since the two current mirror circuits described above are cross coupled, reference current $I_{ref}$ flowing from external power supply node 300 through transistors 381, 383 and resistance element 385 to external ground node 400 is constant and equal to reference current $I_{ref}$ flowing from external power supply node 300 through transistor 382 and 384 to external ground node 400. The magnitude of reference current $I_{ref}$ is determined by the size of resistance element 385.

Further, since P channel MOS transistor 383 forms, together with P channel MOS transistor 381, a current mirror circuit, a constant reference current $I_{const}$ which is equal to the reference current $I_{ref}$ flows in transistor 386.

Figure 14:
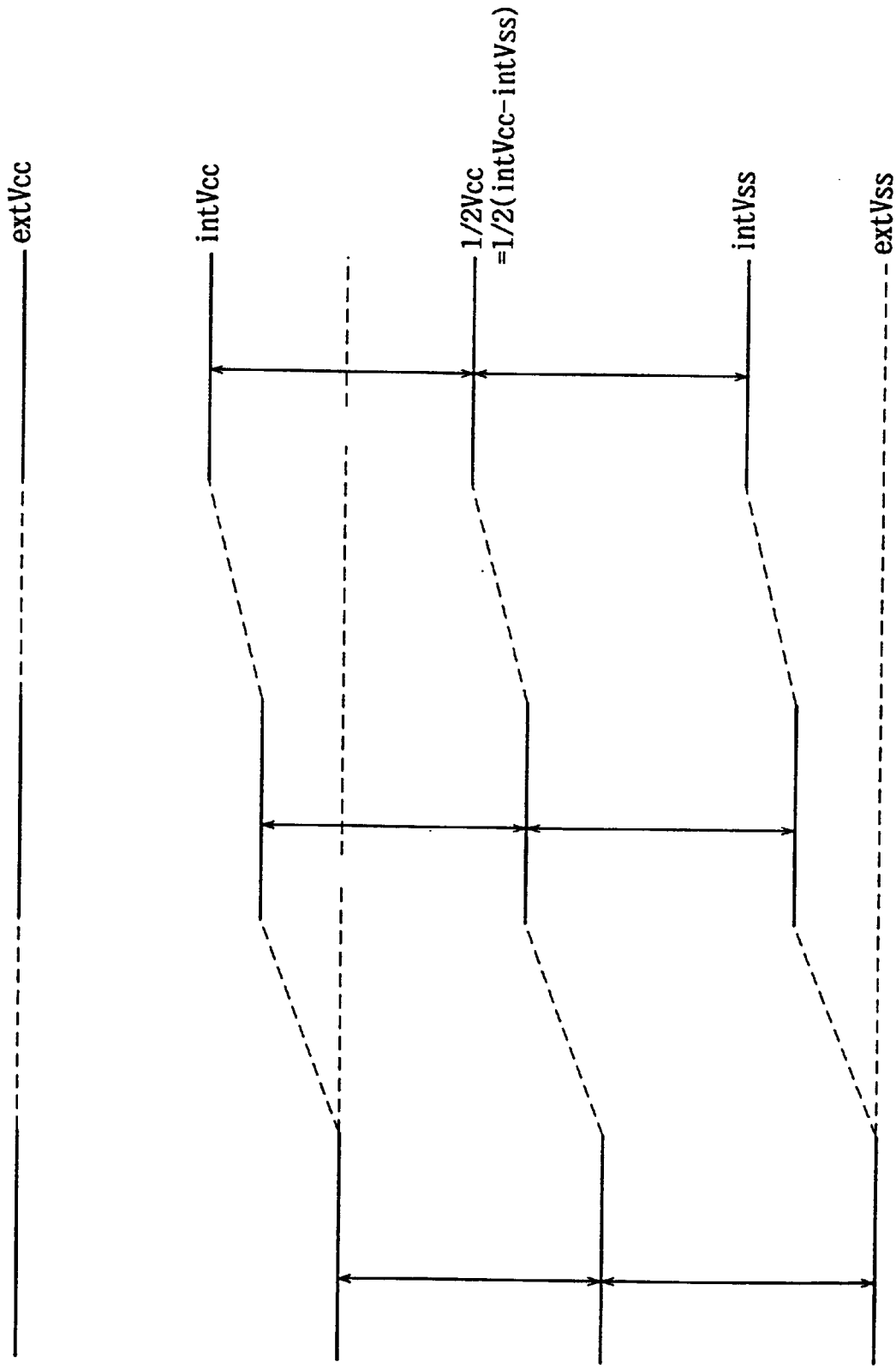
FIG. 14 is a graph showing relations between various power supply potentials in the intermediate potential generating circuit employing the basic reference potential generating circuit shown in FIGS. 12 and 13.

FIG. 14 is a graph showing the internal power supply potential, the internal ground potential and the intermediate potential when the base reference potential generating circuit shown in FIG. 12 is used.

For example, when the value of resistance element 42 shown in FIG. 12 is set to 0Ω, the base reference potential $V_{refc}$ would be $I_{const} \times R1$, and base reference potential $V_{refs}$ would be 0V. Therefore, internal power supply potential intVcc becomes equal to the base reference potential $V_{refc}$, and internal power supply intVss attains to 0V.

Thereafter, when the value of resistance element 42 is increased, the base reference potentials $V_{refc}$ and $V_{refs}$ both rise, while the voltage between the base reference potentials $V_{refc}$ and $V_{refs}$ is always kept constant. Therefore, the voltages of internal power supply potential intVcc and internal ground potential intVss are also kept constant.

Therefore, even when the value of resistance element 42 is changed, the intermediate potential generated at output node 14 is always intermediate between internal power supply potential intVcc and internal ground potential intVss.

[Embodiment 8]

Figure 15:
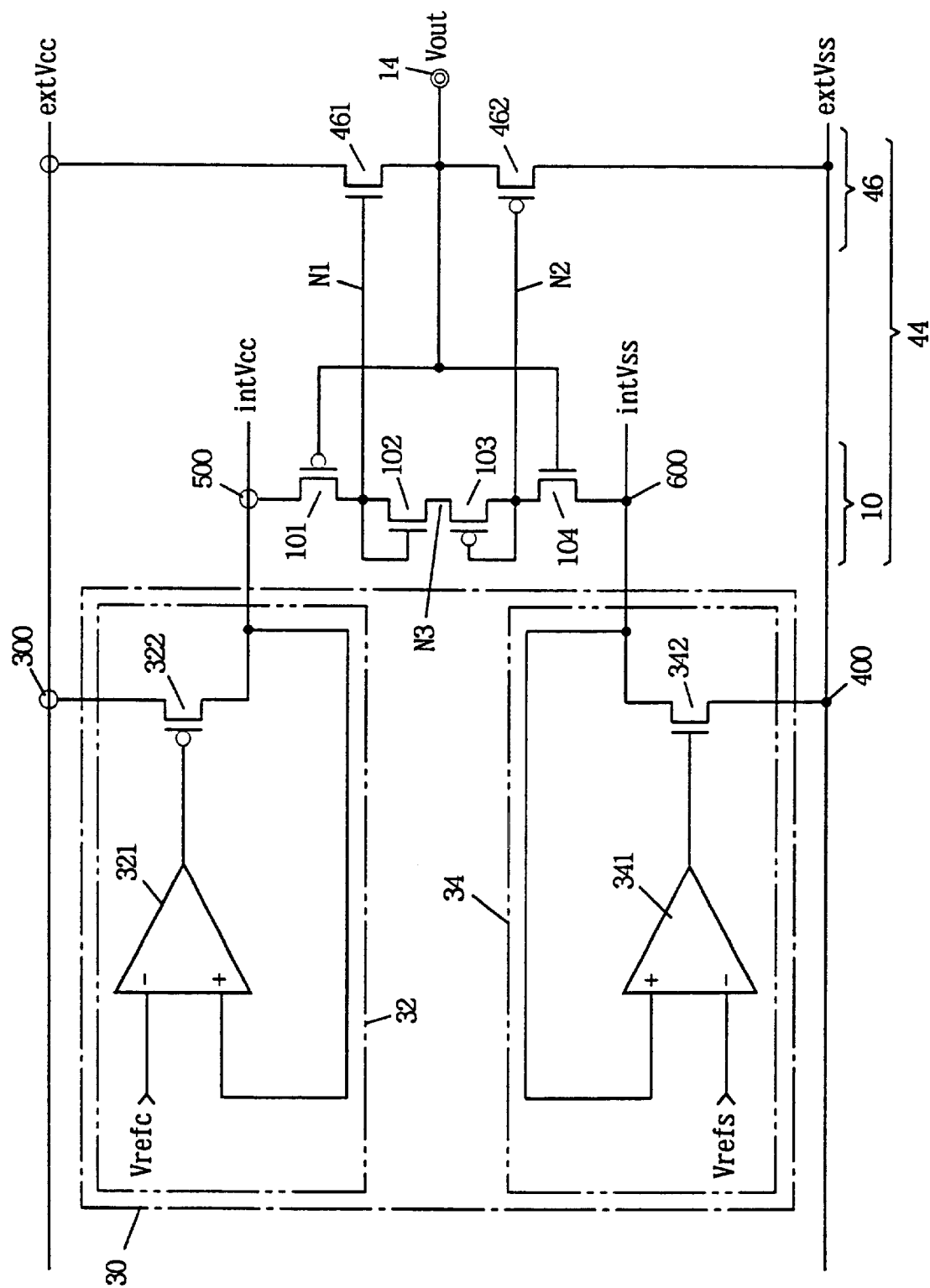
FIG. 15 is a schematic diagram showing a structure of an intermediate potential generating circuit in accordance with Embodiment 8 of the present invention.

FIG. 15 is a circuit diagram showing a structure of an intermediate potential generating circuit in accordance with Embodiment 8 of the present invention.

Referring to FIG. 15, the intermediate potential generating circuit includes a power supply voltage converting circuit 30, an intermediate potential generating portion 44 and an output node 14. The intermediate potential generating circuit differs from that of Embodiment 7 in that output stage 46 of intermediate potential generating portion 44 is connected between external power supply node 300 and external ground node 400.

More specifically, output stage 46 includes an N channel MOS transistor 461 and a P channel MOS transistor 462, and these transistors 461 and 462 are connected in series between external power supply node 300 and external ground node 400. Meanwhile, reference potential generating stage 10 of intermediate potential generating portion 44 is connected between internal power supply node 500 and internal ground node 600, as in Embodiment 7 above.

In the intermediate potential generating circuit, an intermediate potential (½) Vcc between internal power supply potential intVcc and internal ground potential intVss is generated at node N3 in reference potential generating stage 10. Therefore, a potential (½) Vcc+$V_{tn}$ higher than the intermediate potential by the threshold voltage of N channel MOS transistor 102 is applied to the gate electrode of N channel MOS transistor 461 in the output stage 46, while a potential (½) Vcc−|$V_{tp}$| lower than the intermediate potential by the absolute value of the threshold voltage of P channel MOS transistor 103 is applied to the gate electrode of P channel MOS transistor 462. Therefore, though the output stage 46 is connected between external power supply node 300 and external ground node 400, an intermediate potential (½) Vcc between internal power supply potential intVcc and internal ground potential intVss is generated at output node 14.

[Embodiment 9]

Figure 16:
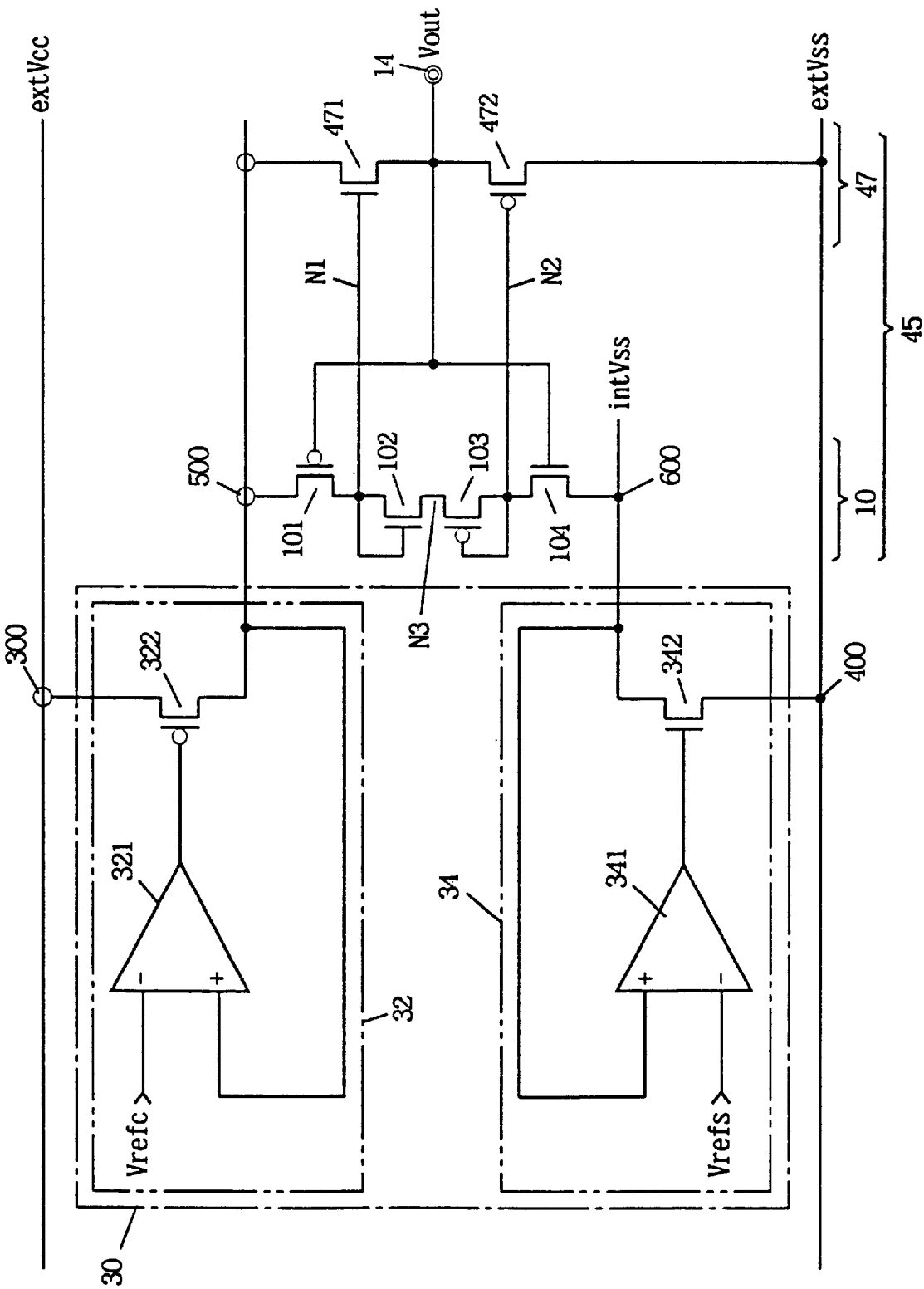
FIG. 16 is a schematic diagram showing a structure of an intermediate potential generating circuit in accordance with Embodiment 9 of the present invention.

FIG. 16 is a circuit diagram showing a structure of an intermediate potential generating circuit in accordance with Embodiment 9 of the present invention. Referring to FIG. 16, the intermediate potential generating circuit includes a power supply voltage converting circuit 30, an intermediate potential generating portion 45 and an output node 14. The intermediate potential generating circuit differs from that of Embodiment 8 in that an output stage 47 in intermediate potential generating portion 45 is connected between internal power supply node 500 and external ground node 400.

Specifically, output stage 47 includes an N channel MOS transistor 471 and a P channel MOS transistor 472, and these transistors 471 and 472 are connected in series between internal power supply node 500 and external ground node 400. Meanwhile, reference potential generating stage 10 in intermediate potential generating portion 45 is connected between internal power supply node 500 and internal ground node 600, as in Embodiment 8 above.

According to the intermediate potential generating circuit, an intermediate potential (½) Vcc between internal power supply potential intVcc and internal ground potential intVss is generated at node N3. Therefore, a potential (½) Vcc+$V_{tn}$ higher than the intermediate potential by the threshold voltage of N channel MOS transistor 102 is applied to the gate electrode of N channel MOS transistor 471 in output stage 47, while a potential (½) Vcc−|$V_{tp}$| lower than the intermediate potential by the absolute value of the threshold voltage of P channel MOS transistor 103 is applied to the gate electrode of P channel MOS transistor 472. Therefore, though output stage 47 is connected between internal power supply node 500 and internal ground node 400, an intermediate potential (½) Vcc between internal power supply potential intVcc and internal ground potential intVss is generated at output node 14.

In this manner, the N and P channel MOS transistors constituting the output stage has only to be source-follower connected. In other words, any potential may be applied to the drain electrodes of N and P channel MOS transistors.

[Embodiment 10]

Figure 17:
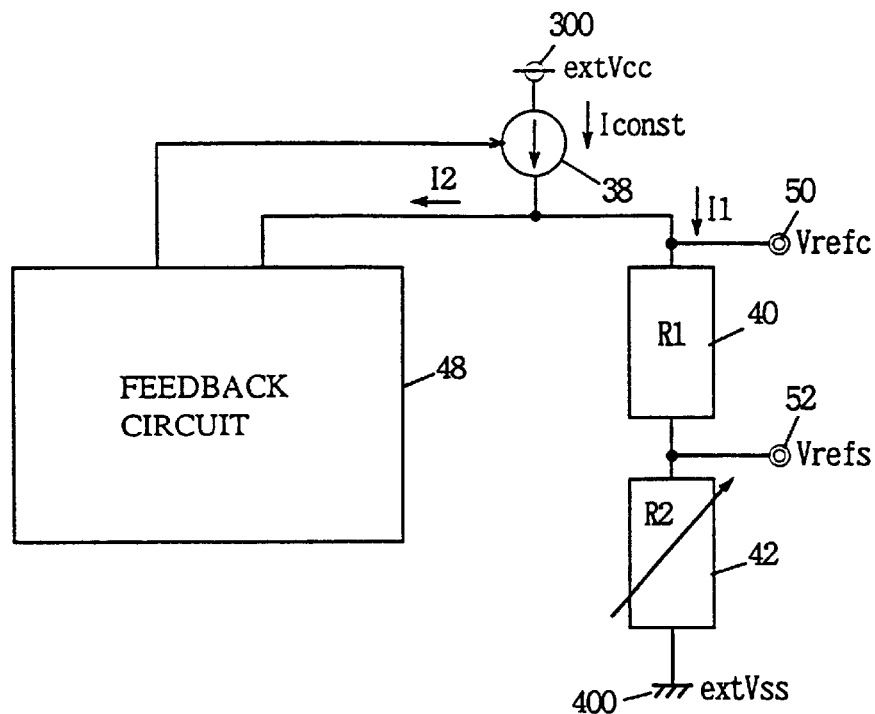
FIG. 17 shows a concept of a basic reference potential generating circuit in an intermediate potential generating circuit in accordance with Embodiment 10 of the present invention.

FIG. 17 is an illustration showing a structure of a base reference potential generating circuit in an intermediate potential generating circuit in accordance with Embodiment 10 of the present invention.

Referring to FIG. 17, the base reference potential generating circuit includes a first output node 50 at which base reference potential $V_{refc}$ is generated, a second output node 52 at which base reference potential $V_{refs}$ is generated, an output resistance element 40, a variable output resistance element 42, a constant current source 38 and a feedback circuit 48.

The base reference potential generating circuit is used in place of the base reference potential generating circuit shown in FIG. 12. The base reference potential generating circuit differs from that of FIG. 12 in that a feedback circuit 48 is newly provided.

In the base reference potential generating circuit, part I1 of base current $I_{const}$ supplied from the constant current source 38 flows to resistance elements 40 and 42. Therefore, a constant base reference potential $V_{refc}$ is generated at first output node 50, and a constant base reference potential $V_{refs}$ is generated at second output node 52.

Remaining part I2 of reference current $I_{const}$ flows to feedback circuit 48. Feedback circuit 48 detects the remaining current I2, and when the current I2 decreases, the circuit increases the reference current $I_{const}$ supplied from constant current source 38, and if the current I2 increases, the circuit decreases the reference current $I_{const}$ supplied from constant current source 38.

When current flows to a buffering capacitance element (not shown) connected to output node 50, for example, the current I2 flowing to feedback circuit 48 decreases. Feedback circuit 48 controls such that reference current $I_{const}$ supplied from constant current source 38 increases, in response to the decrease in current I2.

Therefore, the current flowing to output resistance elements 40 and 42 does not decrease, and constant base reference potentials $V_{refc}$ and $V_{refs}$ are always generated at output nodes 50 and 52, respectively.

Figure 18:
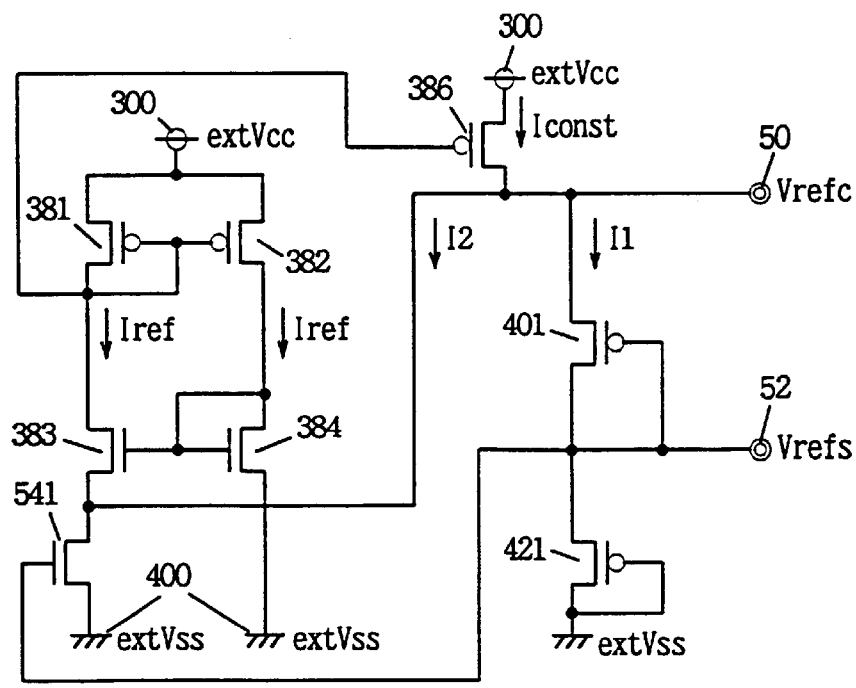
FIG. 18 is a schematic diagram showing a specific structure of the basic reference potential generating circuit shown in FIG. 17.

FIG. 18 is a schematic diagram showing the specific structure of the base reference potential generating circuit shown in FIG. 17.

Referring to FIG. 18, the base reference potential generating circuit includes a first current mirror circuit consisting of P channel MOS transistors 381 and 382, a second current mirror circuit consisting of N channel MOS transistors 383 and 384, an N channel MOS transistor 541 connected between second current mirror circuit and external power supply node 400, a P channel transistor 386 constituting, together with P channel MOS transistor 381, a current mirror circuit, a diode connected P channel MOS transistor 401 which corresponds to the aforementioned resistance element 40, a diode connected P channel MOS transistor 421 which corresponds to the aforementioned resistance element 42, and first and second output nodes 50 and 52.

P channel MOS transistor 386 has its drain electrode connected to drain electrode of N channel MOS transistor 541. N channel MOS transistor 541 has its gate electrode connected to second output node 52.

In the similar manner as described above, in the base reference potential generating circuit, when current flows to a buffering capacitance element connected to first output node 50, for example, current I2 flowing to N channel MOS transistor 541 decreases. N channel MOS transistor 541 functions as a resistance element, and a constant voltage is applied between the drain and source electrodes thereof. Therefore, the current flowing in transistor 541 is constant. Therefore, when current I2 decreases, reference current $I_{ref}$ flowing through P channel MOS transistor 381 and N channel MOS transistor 383 increases. Since P channel MOS transistor 381 and P channel MOS transistor 386 constitute a current mirror circuit, a reference current $I_{const}$ which is equal to reference current $I_{ref}$ flows in P channel MOS transistor 386. Therefore, reference current $I_{const}$ increases in response to the increase of the reference current $I_{const}$ and therefore the current I1 flowing to P channel MOS transistors 401 and 421 does not decrease. Accordingly, base reference potentials $V_{refc}$ and $V_{refs}$ generated at output nodes 50 and 52 thereof do not decrease.

In Embodiment 10, P channel MOS transistors 381 and 382 constituting the first current mirror circuit, N channel MOS transistors 383 and 384 constituting the second current mirror circuit, N channel MOS transistor 541 serving as a resistance element and P channel MOS transistor 386 provides a constant current source 38 as well as a feedback circuit 48.

[Embodiment 11]

Figure 19:
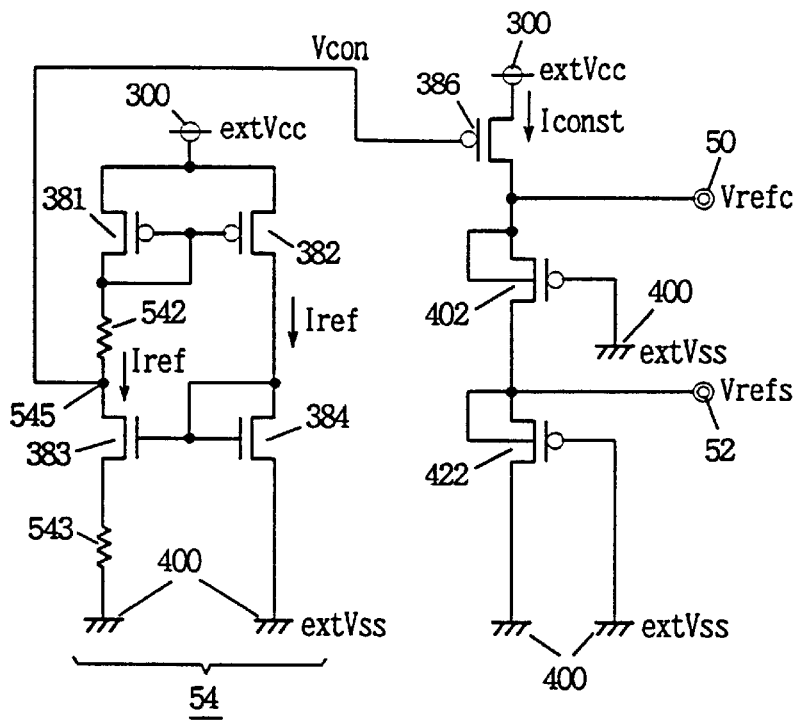
FIG. 19 is a schematic diagram showing a whole structure of a basic reference potential generating circuit in an intermediate potential generating circuit in accordance with Embodiment 11 of the present invention.

FIG. 19 is a schematic diagram showing a whole structure of the base reference potential generating circuit in an intermediate potential generating circuit in accordance with Embodiment 11 of the present invention. The base reference potential generating circuit is used in place of the base reference potential generating circuit shown in FIG. 12.

Referring to FIG. 19, the base reference potential generating circuit includes a control potential generating circuit 54 for generating a prescribed control potential $V_{con}$, a P channel MOS transistor 386 receiving at its gate electrode the control potential $V_{con}$, a first output node 50, a second output node 52, a P channel MOS transistor 402 connected between first and second output nodes 50 and 52, and a P channel MOS transistor 422 connected between second output node 52 and an external ground node 400.

P channel MOS transistor 402 has its gate electrode connected to external ground node 400, and serves as an output resistance element. P channel MOS transistor 422 has its gate electrode connected to external ground node 400, and serves as an output resistance element.

The control potential generating circuit 54 includes two P channel MOS transistors 381 and 382 constituting a first current mirror circuit, two N channel MOS transistors 383 and 384 constituting a second current mirror circuit, a resistance element 542 connected between P channel MOS transistor 381 and N channel MOS transistor 383, and a resistance element 543 connected between N channel MOS transistor 383 and external ground node 400. Namely, the control potential generating circuit 54 differs from that of FIG. 13 in that a resistance element 542 is newly provided.

By control potential generating circuit 54, the potential at the gate electrode of P channel MOS transistor 381 is not directly applied as the control potential to the gate electrode of P channel MOS transistor 386, and a potential lower than the potential at the gate electrode by the voltage drop across resistance element 542 is generated at control node 545, and the potential generated at control node 545 is applied to the gate electrode of P channel MOS transistor 386 as control potential $V_{con}$.

Therefore, in the base reference potential generating circuit, the reference current $I_{const}$ flowing through P channel MOS transistor 386 is changed by appropriately changing the value of resistance element 542, and thus base reference potentials $V_{refc}$ and $V_{refs}$ generated at output nodes 50 and 52 are changed.

Further, in Embodiment 11, when resistance element 542 has positive temperature coefficient and resistance element 543 has negative temperature coefficient, the temperature dependency of resistance element 542 is offset by the temperature dependency of resistance element 543, and therefore control potential $V_{con}$ generated at control node 545 is not dependent on the change in temperature.

When the difference between the absolute value of temperature coefficient of resistance element 542 and the absolute value of temperature coefficient of resistance element 543 is made sufficiently large, the control potential $V_{con}$ would be dependent on temperature change. Therefore, a desired control potential $V_{con}$ can be generated by appropriately adjusting the difference.

Metal, polysilicon to which much metal is introduced or the like is used as the resistance element having positive temperature coefficient. Polycrystalline silicon, polycrystalline silicon to which small amount of metal is introduced, or a semiconductor such as an N type well is used as a resistance element having negative temperature coefficient.

Resistance element 543 may have positive temperature coefficient and resistance element 542 may have negative temperature coefficient.

[Embodiment 12]

Figure 20:
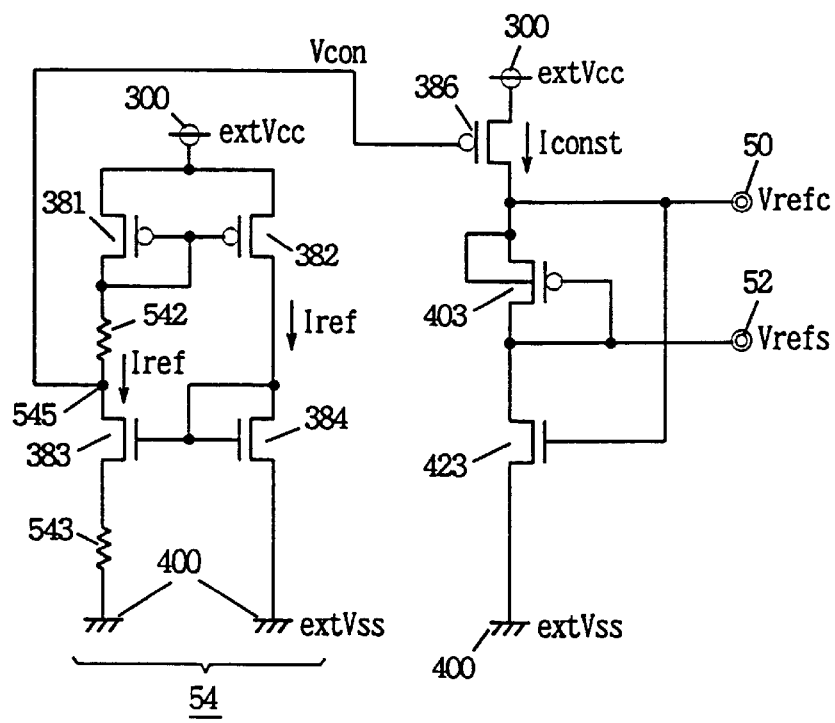
FIG. 20 is a schematic diagram showing a whole structure of a basic reference potential generating circuit in an intermediate potential generating circuit in accordance with Embodiment 12 of the present invention.

FIG. 20 is a circuit diagram showing the whole structure of a base reference potential generating circuit in an intermediate potential generating circuit in accordance with Embodiment 12 of the present invention. The base reference potential generating circuit may be used also in place of the base reference potential generating circuit shown in FIG. 12.

Referring to FIG. 20, the base reference potential generating circuit includes a control potential generating circuit 54, a P channel MOS transistor 386, a first output node 50, a second output node 52, a P channel MOS transistor 403 functioning as an output resistance element, and an N channel MOS transistor 423 functioning as an output resistance element.

The base reference potential generating circuit differs from that of Embodiment 11 above in that the P channel MOS transistor connected between the first and second output nodes 50 and 52 is diode connected, and that the gate electrode of N channel MOS transistor 423 connected between second output node 52 and external power supply node 400 is connected to the first output node 50.

Therefore, in the state of equilibrium at which a stable base reference potential $V_{refc}$ is generated at first output node 50, N channel MOS transistor 423 simply serves as resistance element, as a constant base reference potential $V_{refc}$ is applied to the gate electrode thereof.

However, when base reference potential $V_{refc}$ generated at first output node 50 decreases, the conduction resistance of N channel MOS transistor 423 becomes larger, and the voltage drop across the transistor 423 increases. Therefore, even when the base reference potential $V_{refc}$ lowers, it is quickly returned to the prescribed based reference potential $V_{refc}$. Similarly, even when base reference potential $V_{refc}$ increases, it is quickly returned to the prescribed base reference potential $V_{refc}$.

In this manner, in the base reference potential generating circuit in accordance with Embodiment 12, since the potential generated at first output node 50 is fed back to N channel MOS transistor 423 serving as the output resistance element, even when the potential generated at first output node 50 fluctuates, it quickly returns to the original value. Therefore, the base reference potential generating circuit can always generate stable base reference potentials $V_{refc}$ and $V_{refs}$.

[Embodiment 13]

Figure 21:
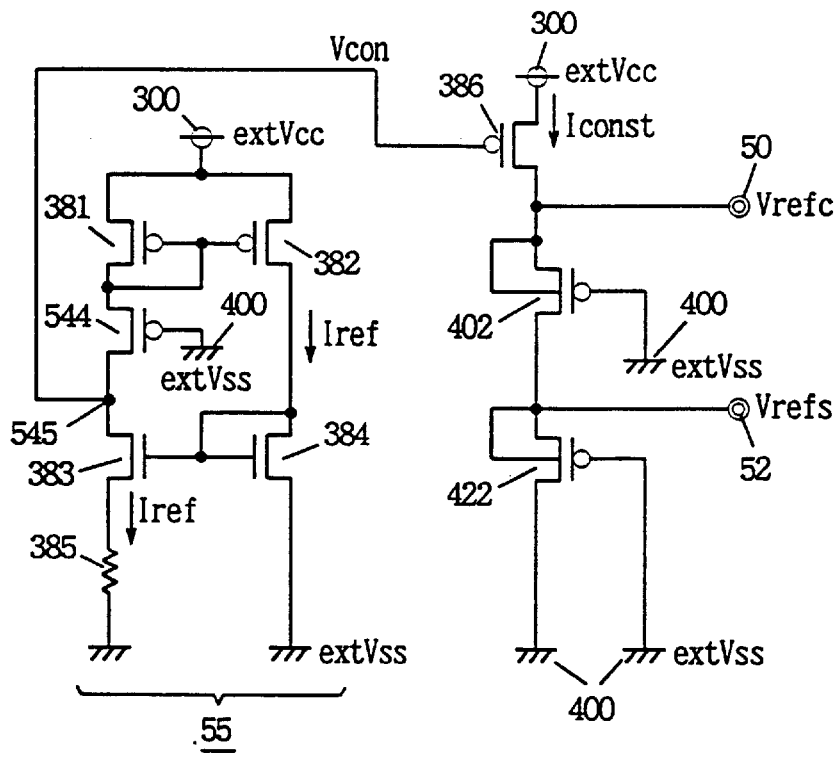
FIG. 21 is a schematic diagram showing a whole structure of a basic reference potential generating circuit in an intermediate potential generating circuit in accordance with Embodiment 13 of the present invention.

FIG. 21 is a circuit diagram showing the whole structure of the base reference potential generating circuit in an intermediate potential generating circuit in accordance with Embodiment 13 of the present invention. The base reference potential generating circuit may be used instead of the base reference potential generating circuit shown in FIG. 12.

Referring to FIG. 21, the base reference potential generating circuit includes a control potential generating circuit 55, a P channel MOS transistor 386, P channel MOS transistors 402 and 422, and first and second output nodes 50 and 52.

The base reference potential generating circuit differs from Embodiment 11 above in that a P channel MOS transistor 544 is provided in place of resistance element 542, in control potential generating circuit 55.

More specifically, the P channel MOS transistor 544 is connected between P channel MOS transistor 381 and N channel MOS transistor 383, and has its gate electrode connected to external ground node 400. Therefore, the P channel MOS transistor 544 serves as a resistance element.

Now, if external power supply potential extVcc rises, the voltage between the source and gate electrodes of P channel MOS transistor 544 increases, and therefore conduction resistance of transistor 544 decreases. Accordingly, voltage drop across P channel MOS transistor 544 decreases, and control potential $V_{con}$ generated at control node 545 is increased. Accordingly, a constant voltage is always applied to the source and gate electrodes of P channel MOS transistor 386, and hence a constant reference current $I_{const}$ always flows in transistor 386. Therefore, in the base reference potential generating in accordance with Embodiment 13, even when external power supply potential extVcc fluctuates, stable base reference potentials $V_{refc}$ and $V_{refs}$ are constantly generated.

[Embodiment 14]

Figure 22:
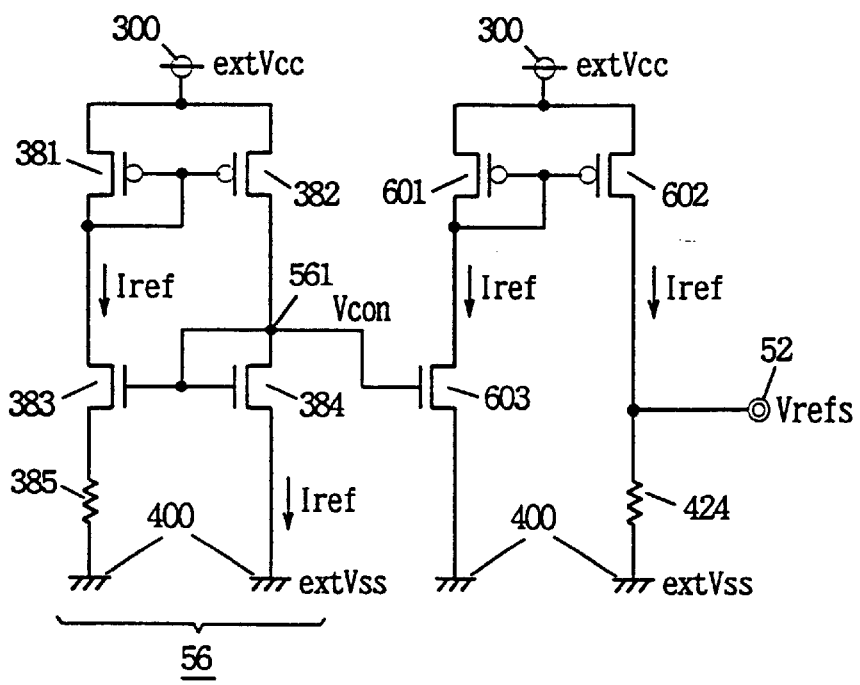
FIG. 22 is a schematic diagram showing a whole structure of a basic reference potential generating circuit in an intermediate potential generating circuit in accordance with Embodiment 14 of the present invention.

FIG. 22 is a circuit diagram showing the whole structure of a base reference potential generating circuit in accordance with Embodiment 14 of the present invention. The base reference potential generating circuit is for supplying base reference potential $V_{refs}$ to differential amplifier 341 in Embodiment 7, 8 or 9 above.

Referring to FIG. 22, the base reference potential generating circuit includes a control potential generating circuit 56 for generating a prescribed reference potential $V_{con}$, an N channel MOS transistor 603 receiving at its gate the control potential $V_{con}$, two P channel MOS transistors 601 and 602 constituting a current mirror circuit, a resistance element 424 connected between P channel MOS transistor 602 and external ground node 400, and an output node 52 at which base reference potential $V_{refs}$ is generated. Here, the transistor 602 has its channel length made longer than that of transistor 601.

In control potential generating circuit 56, since two current mirror circuits are cross coupled, a constant reference current $I_{ref}$ determined by resistance element 385 flows. Since N channel MOS transistors 384 and 603 constitute a current mirror circuit, a reference current $I_{ref}$ which is equal to the reference current $I_{ref}$ in control potential generating circuit 56 also flows through N channel MOS transistor 603.

Further, since P channel MOS transistors 601 and 602 constitute a current mirror circuit, a reference current $I_{ref}$ which is equal to the reference current $I_{ref}$ flowing through P channel MOS transistor 601 flows through P channel MOS transistor 602. Therefore, a constant reference current $I_{ref}$ flows through resistance element 424, and hence a constant base reference potential $V_{refs}$ is generated at output node 52.

Figure 23:
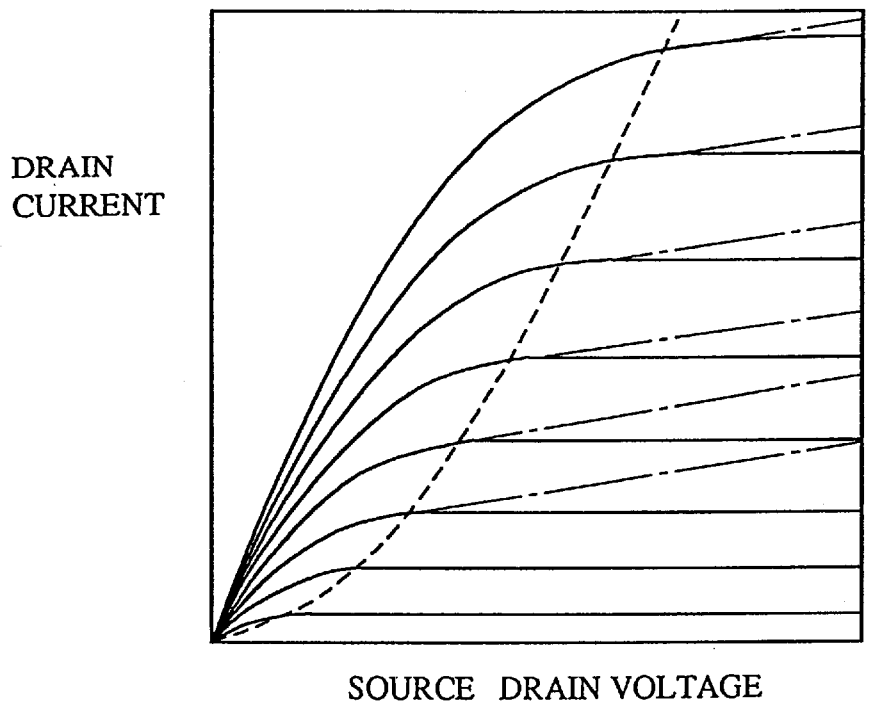
FIG. 23 is a graph showing general operational characteristics of an MOS transistor.

FIG. 23 is a graph showing general drain current characteristic of an MOS transistor. In this graph, the ordinate represents the drain current, and the abscissa represents source-drain voltage. Drain current characteristics for different gate potentials are shown in the graph. As represented by the solid line in FIG. 23, when the channel length is long, the drain current becomes constant regardless of the source-drain voltage in the saturation region. However, as represented by chain dotted line in FIG. 23, when the channel length is short, the drain current slightly increases as the source-drain voltage increases, in the saturation region.

In the base reference potential generating circuit in accordance with Embodiment 14, a base reference potential $V_{refs}$ which is equal to the internal ground potential Vss is generated at output node 52. Therefore, a high voltage is applied between source-drain of transistor 602. If the channel length of transistor 602 is equal to that of transistor 601, the reference current $I_{ref}$ flowing through transistor 602 would be larger than the reference current $I_{ref}$ flowing through transistor 601. However, since the channel length of transistor 602 is made longer than that of transistor 601, a reference current $I_{ref}$ which is equal to the reference current $I_{ref}$ flowing through transistor 601 flows through transistor 602, though a high voltage is applied between source-drain of transistor 602. Therefore, a constant reference current $I_{ref}$ flows through resistance element 424, and the constant base reference potential $V_{refs}$ is generated at output node 52.

[Embodiment 15]

Figure 24:
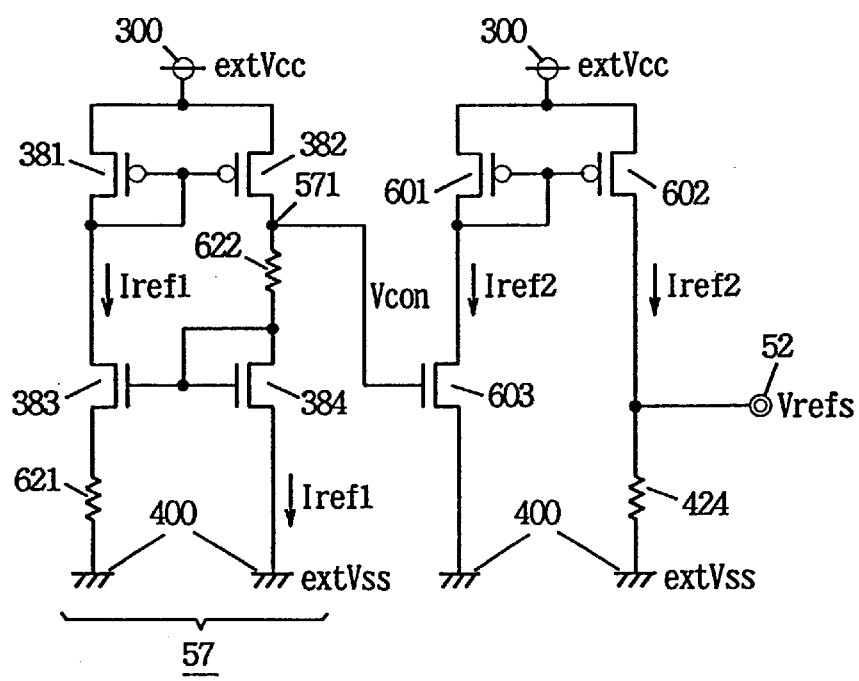
FIG. 24 is a schematic diagram showing a whole structure of a basic reference potential generating circuit in an intermediate potential generating circuit in accordance with Embodiment 15 of the present invention.

FIG. 24 shows the whole structure of the base reference potential generating circuit in accordance with Embodiment 15 of the present invention.

Referring to FIG. 24, the base reference potential generating circuit includes a control potential generating circuit 57 for generating a prescribed control potential $V_{con}$, an N channel MOS transistor 603 receiving at its gate electrode the control potential $V_{con}$, two P channel MOS transistors 601 and 602 providing a current mirror circuit structure, a resistance element 424, and an output node 52.

The base reference potential generating circuit differs from that of Embodiment 14 in that a resistance element 622 is connected between P channel MOS transistor 382 and N channel MOS transistor 384. Therefore, a potential higher than the gate potential of N channel MOS transistor 384 by the voltage drop across resistance element 622 is generated as control potential $V_{con}$ at control node 571 of control potential generating circuit 57. Therefore, a control potential $V_{con}$ which is higher than the gate potential of N channel MOS transistor 384 is applied to the gate electrode of N channel MOS transistor 603, and hence reference current $I_{ref}2$ which is larger than reference current $I_{ref}1$ flowing through transistor 384 flows therethrough.

In the base reference potential generating circuit in accordance with Embodiment 15, the control potential $V_{con}$ and hence the base reference potential $V_{refs}$ generated at output node 52 can be appropriately changed by changing the value of resistance element 622 appropriately.

In control potential generating circuit 57, when resistance element 621 having positive temperature coefficient and resistance element 622 having negative temperature coefficient are used, the temperature dependency of resistance elements 621 and 622 can be offset by each other as in Embodiment 12, and therefore the base reference potential $V_{refs}$ generated at output node 52 will not be dependent on the change in temperature.

As already described with reference to Embodiment 12 above, it is possible to provide the base reference potential $V_{refs}$ generated at output node 52 with desired temperature dependency.

Meanwhile, a material having positive temperature coefficient may be used for resistance element 622 while a material having negative temperature coefficient may be used for resistance element 621.

[Embodiment 16]

Figure 25:
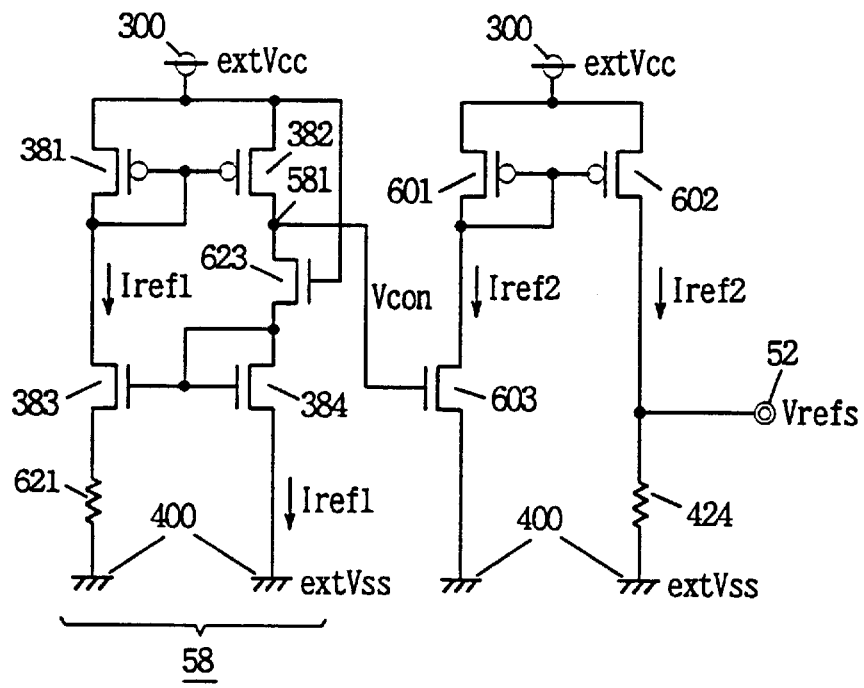
FIG. 25 is a schematic diagram showing a whole structure of a basic reference potential generating circuit in an intermediate potential generating circuit in accordance with Embodiment 16 of the present invention.

FIG. 25 is a circuit diagram showing the whole structure of a base reference potential generating circuit in accordance with Embodiment 16 of the present invention.

Referring to FIG. 25, the base reference potential generating circuit includes a control potential generating circuit 58 generating a prescribed control potential $V_{con}$, an N channel MOS transistor 603, two P channel MOS transistors 601 and 602 constituting a current mirror circuit, a resistance element 424, and an output node 52.

The base reference potential generating circuit differs from Embodiment 15 above in that an N channel MOS transistor 623 is provided in place of resistance element 622. The gate electrode of N channel MOS transistor 623 is connected to external power supply node 300. Therefore, the N channel MOS transistor 623 serves as a resistance element, as the external power supply potential extVcc is applied to its gate electrode.

In the base reference potential generating circuit, as in Embodiment 13 above, even when external power supply potential extVcc fluctuates, a constant reference current $I_{ref}2$ always flows through resistance element 424, and therefore a constant base reference potential $V_{refs}$ is always generated at output node 52.

[Embodiment 17]

Figure 26:
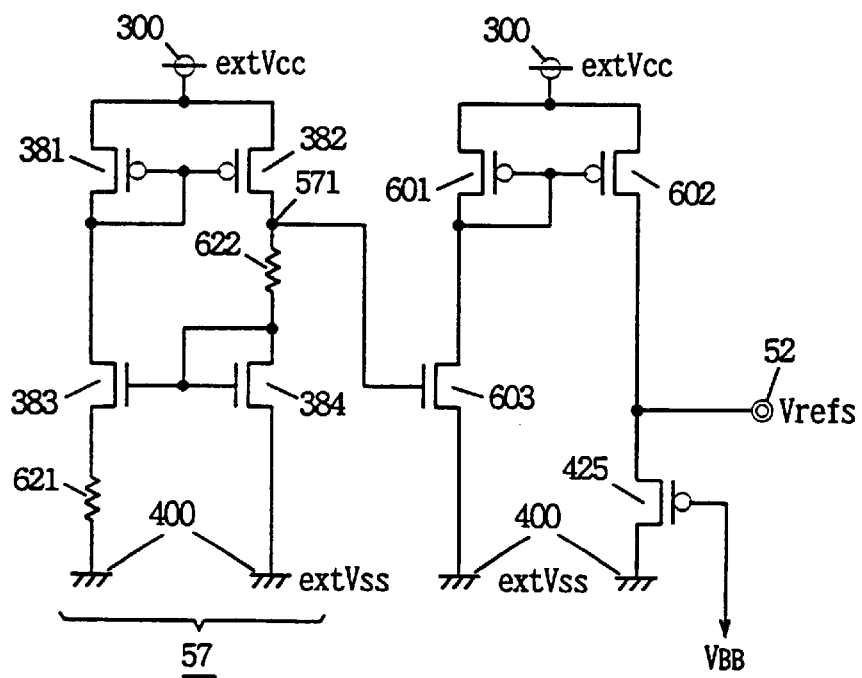
FIG. 26 is a schematic diagram showing a whole structure of a basic reference potential generating circuit in an intermediate potential generating circuit in accordance with Embodiment 17 of the present invention.

FIG. 26 is a circuit diagram showing the whole structure of a base reference potential generating circuit in accordance with Embodiment 17 of the present invention.

The base reference potential generating circuit differs from Embodiment 15 above in that a P channel MOS transistor 425 is provided in place of resistance element 424. A negative substrate potential $V_{BB}$ is applied to the gate electrode of P channel MOS transistor 425.

Therefore, P channel MOS transistor 425 serves as a resistance element. Further, since substrate potential $V_{BB}$ is applied to the gate electrode, base reference potential $V_{refs}$ fluctuates when substrate potential $V_{BB}$ fluctuates.

As is apparent from Embodiment 17, a P channel MOS transistor may be used as the resistance element.

[Embodiment 18]

Figure 27:
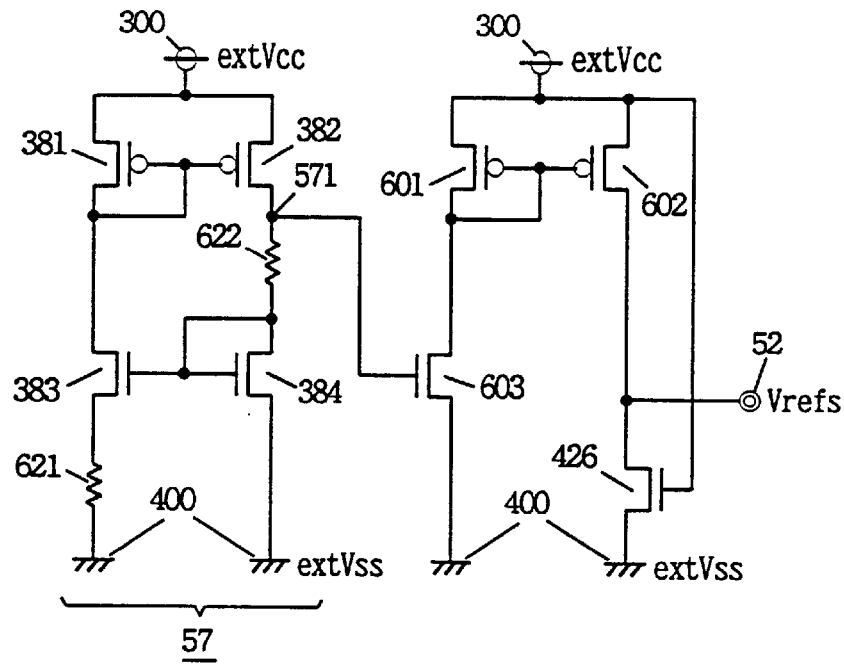
FIG. 27 is a schematic diagram showing a whole structure of a basic reference potential generating circuit in an intermediate potential generating circuit in accordance with Embodiment 18 of the present invention.

FIG. 27 is a circuit diagram showing the whole structure of a base reference potential generating circuit in accordance with Embodiment 18 of the present invention.

The base reference potential generating circuit differs from Embodiment 15 above in that an N channel MOS transistor 426 is provided in place of resistance element 424. And external power supply potential extVcc is applied to the gate electrode of N channel MOS transistor 426.

Therefore, N channel MOS transistor 426 serves as a resistance element. In the base reference potential generating circuit, if external power supply potential extVcc fluctuates, the conduction resistance of N channel MOS transistor 426 also fluctuates, and therefore, base reference potential $V_{ref}$ is generated at output node 52 fluctuates together with external power supply potential extVcc.

[Embodiment 19]

Figure 28:
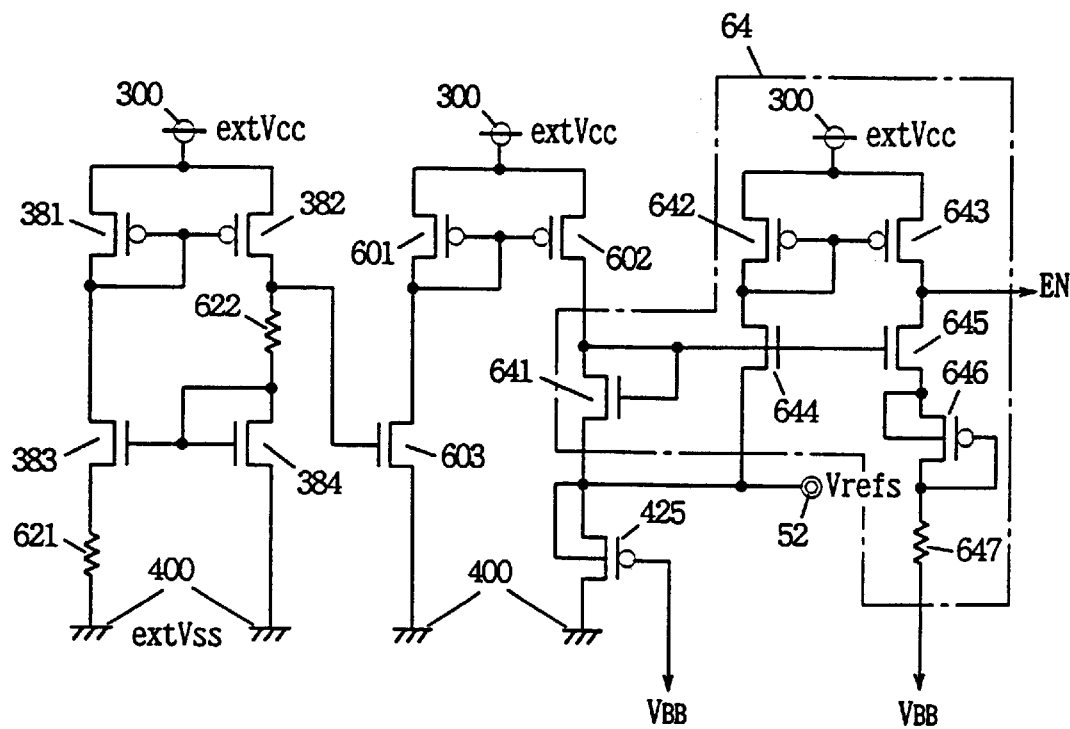
FIG. 28 is a schematic diagram showing a whole structure of a basic reference potential generating circuit in an intermediate potential generating circuit in accordance with Embodiment 19 of the present invention.

FIG. 28 is a circuit diagram showing a structure of a base reference potential generating circuit in accordance with Embodiment 19 of the present invention.

The base reference potential generating circuit differs from Embodiment 17 above in that a substrate potential detecting circuit 64 is newly provided. The substrate potential detecting circuit 64 includes two P channel MOS transistors 642 and 643 constituting a current mirror circuit, an N channel MOS transistor 641 connected between P channel MOS transistors 602 and 425, two N channel MOS transistors 644 and 645 constituting, together with transistor 641, a current mirror circuit, a diode connected P channel MOS transistor 646, and a resistance element 647.

In substrate potential detecting circuit 64, a potential higher than the base reference potential $V_{refs}$ by the threshold voltage of N channel MOS transistor 641 is applied to the gate electrodes of N channel MOS transistors 644 and 645.

Therefore, when the substrate potential $V_{BB}$ detected at one end of resistance element 647 is not sufficiently low, current does not flow through N channel MOS transistor 645, and hence control signal EN is at the H level. A substrate potential supplying circuit (not shown) is activated in response to the H level control signal EN, and supplies a prescribed substrate potential $V_{BB}$ at the semiconductor substrate on which the DRAM is formed.

Thereafter, when the substrate potential $V_{BB}$ becomes sufficiently low, current flows through P channel MOS transistor 646 and through resistance element 647. When the source potential of P channel MOS transistor 646 becomes lower than the base reference potential $V_{refs}$, control signal EN attains to the L level. The substrate potential supplying circuit is inactivated in response to the L level control signal EN.

The voltage drop across P channel MOS transistor 646 and resistance element 647 can be appropriately set.

[Embodiment 20]

Figure 29:
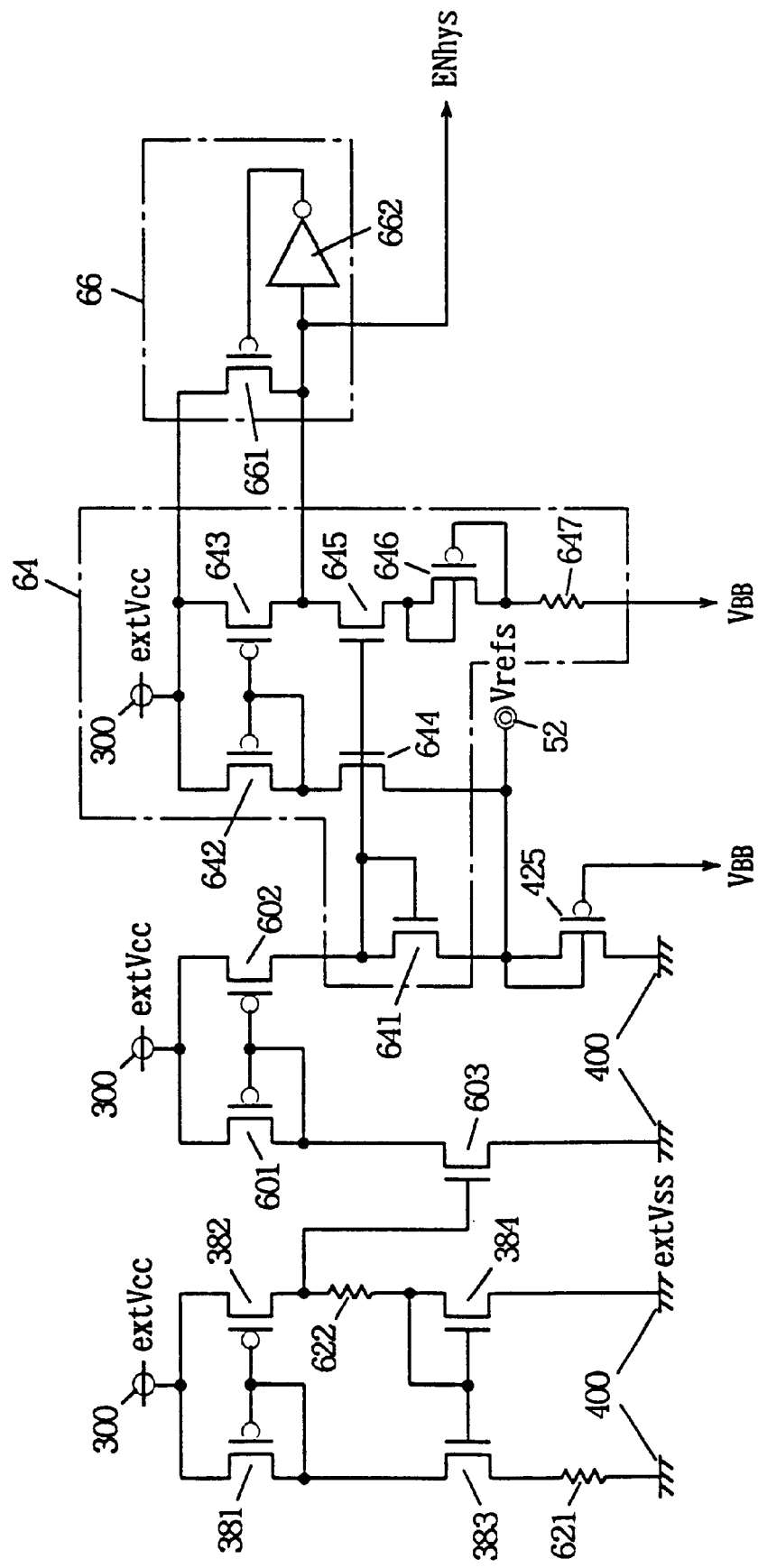
FIG. 29 is a schematic diagram showing a whole structure of a basic reference potential generating circuit in an intermediate potential generating circuit in accordance with Embodiment 20 of the present invention.

FIG. 29 is a circuit diagram showing a structure of a reference potential generating circuit in accordance with Embodiment 20 of the present invention.

The reference potential generating circuit differs from Embodiment 19 above in that a hysterisis circuit 66 is newly provided.

In Embodiment 20, when the substrate potential $V_{BB}$ is not sufficiently low, an H level control signal ENhys is generated. The H level control signal ENhys is applied to the gate electrode of P channel MOS transistor 661 through an inverter 662, and hence the transistor 661 is conductive.

When the substrate potential $V_{BB}$ becomes sufficiently low and control signal ENhys attains to the L level, P channel MOS transistor 661 is rendered non-conductive.

Therefore, current flowing through transistors 645 and 646 decreases. Therefore, even when the substrate potential $V_{BB}$ rises and not sufficiently low, control signal ENhys does not immediately attain to the H level. In other words, hysterisis circuit 66 provides hysterisis with control signal ENhys. Therefore, there is not a chattering generated in control signal ENhys.

[Embodiment 21]

Figure 30:
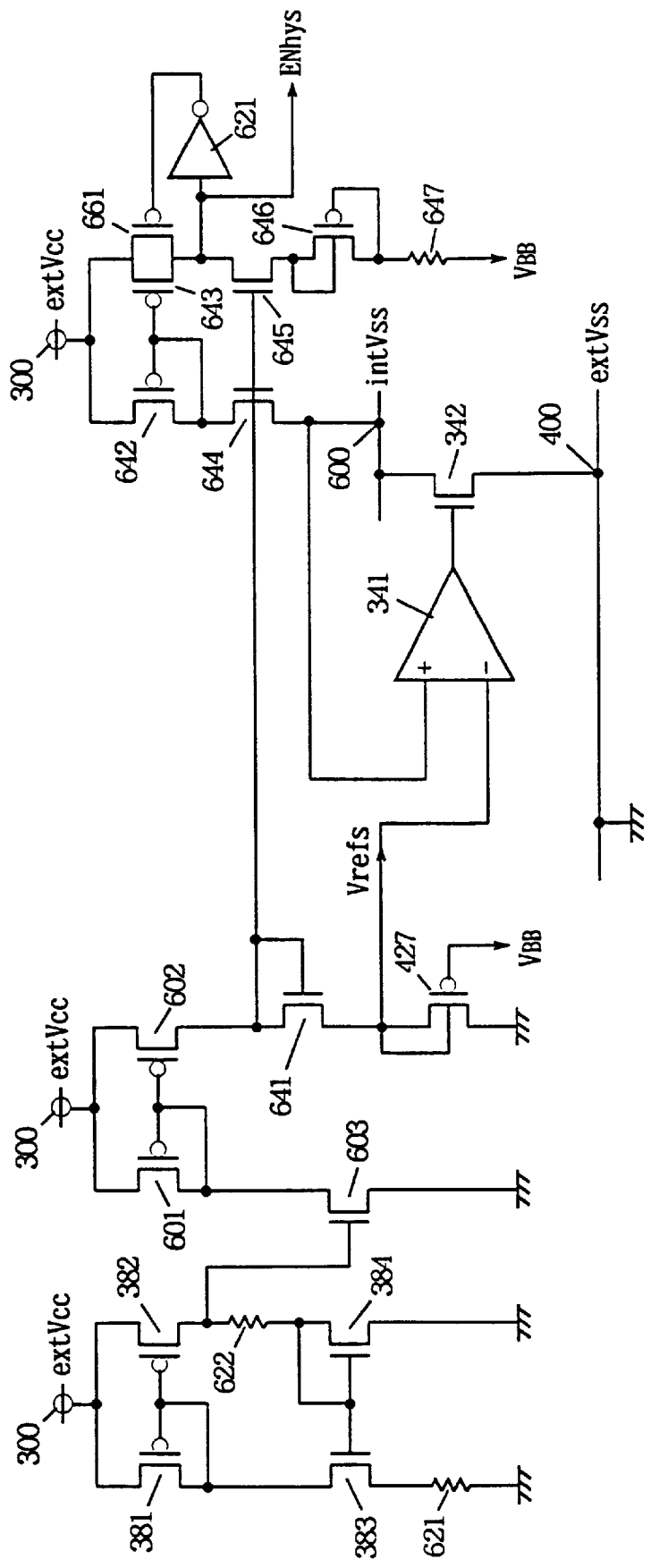
FIG. 30 is a schematic diagram showing a structure of a part of an intermediate potential generating circuit in accordance with Embodiment 21 of the present invention.

FIG. 30 is a circuit diagram showing a structure of a base reference potential generating circuit in accordance with Embodiment 21 of the present invention. The base reference potential generating circuit differs from Embodiment 20 above in that the source electrode of N channel MOS transistor 644 in substrate potential detecting circuit 64 is connected not to the output node 52 at which base reference potential $V_{refs}$ is generated but to an internal ground node 600. In the reference potential generating circuit, even when substrate potential detecting circuit 64 operates, the base reference potential $V_{refs}$ does not fluctuate.

[Embodiment 22]

Figure 31:
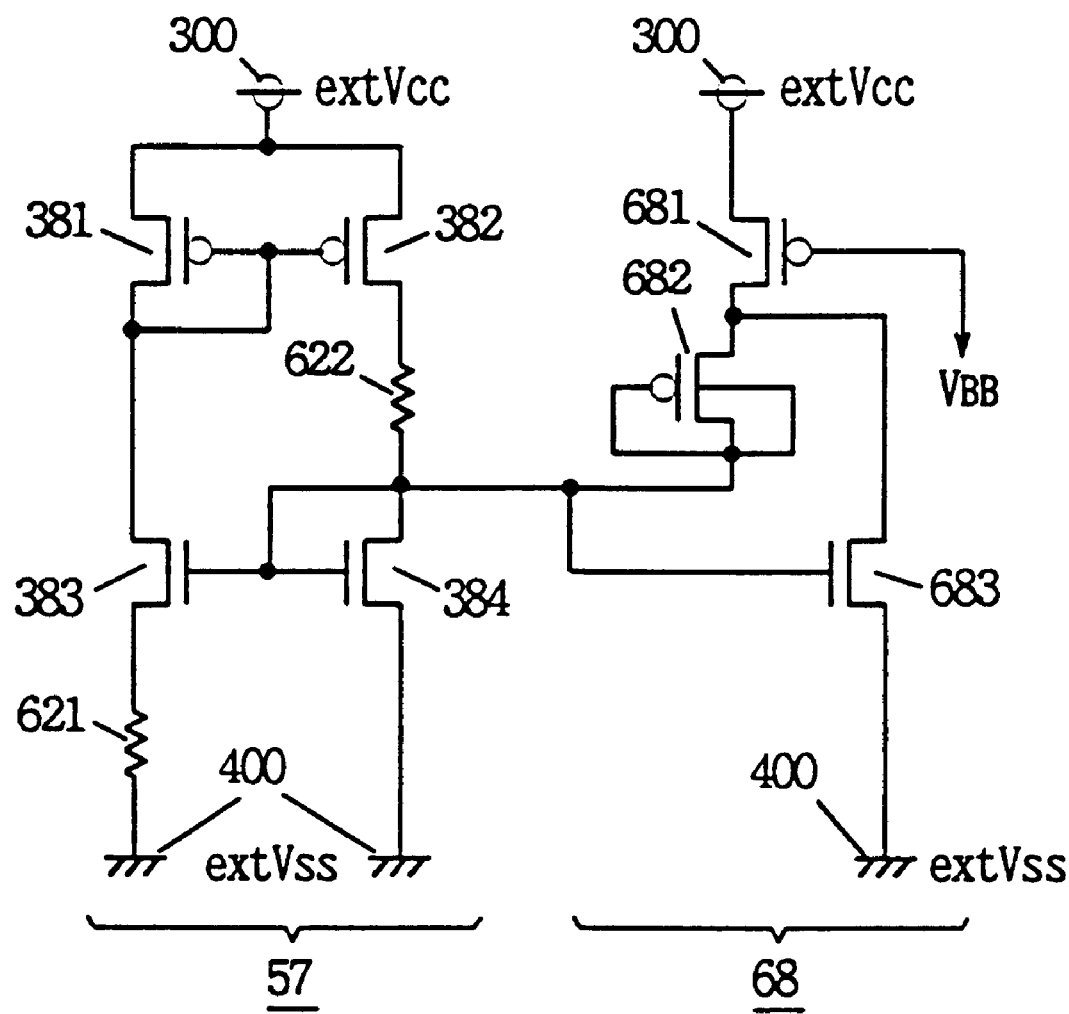
FIG. 31 is a schematic diagram showing a structure of a part of an intermediate potential generating circuit in accordance with Embodiment 22 of the present invention.

FIG. 31 is a circuit diagram showing a main structure of a base reference potential generating circuit in accordance with Embodiment 22 of the present invention.

Referring to FIG. 31, in addition to the components of Embodiments 15, 17 and 18, a start up circuit 68 is provided in this reference potential generating circuit.

Start up circuit 68 includes a P channel MOS transistor 681 receiving at its gate electrode a substrate potential $V_{BB}$ or the ground potential, a diode connected P channel MOS transistor 682, and an N channel MOS transistor 683 connected between the drain electrode of transistor 681 and external ground node 400. The drain electrode of P channel MOS transistor 682 and the gate electrode of N channel MOS transistor 683 are connected to the gate electrodes of N channel MOS transistors 383 and 384 in control potential generating circuit 57.

According to Embodiment 22, when the power is turned on, initially, current flows through transistors 681 and 682 from external power supply node 300 to the gate electrodes of two N channel MOS transistors 383 and 384 constituting a current mirror circuit. Consequently, current flows quickly after power on in control potential generating circuit 57. Therefore, a prescribed control potential is generated quickly.

When the gate potentials of transistors 383 and 384 rise to a prescribed value, transistor 683 is rendered conductive, and hence the current flowing from external power supply node 300 through transistor 681 further flows through transistor 683 to external ground node 400. Further, since there is provided a diode connected P channel MOS transistor 682, current does not flow in reverse direction from control potential generating circuit 57 toward the start up circuit 68.

[Embodiment 23]

Figure 32:
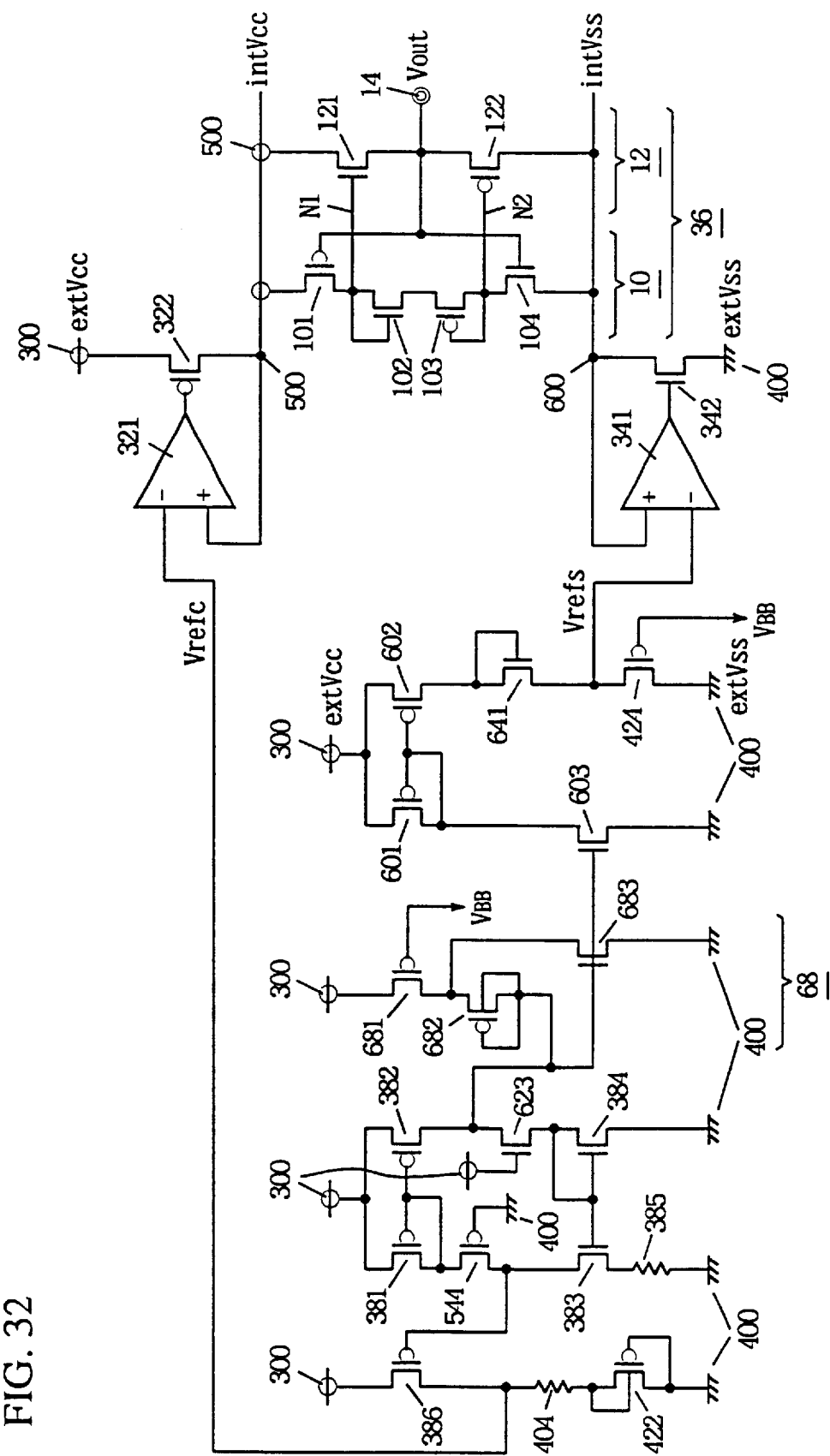
FIG. 32 is a schematic diagram showing a whole structure of an intermediate potential generating circuit in accordance with Embodiment 23 of the present invention.

FIG. 32 is a circuit diagram showing the whole structure of an intermediate potential generating circuit in accordance with Embodiment 23 of the present invention.

Referring to FIG. 32, Embodiment 23 is a combination of Embodiments 7, 13, 16 and 22 above.

The present invention may be implemented by appropriately combining the embodiment described above, other than the combination just mentioned above.

[Embodiment 24]

Figure 33:
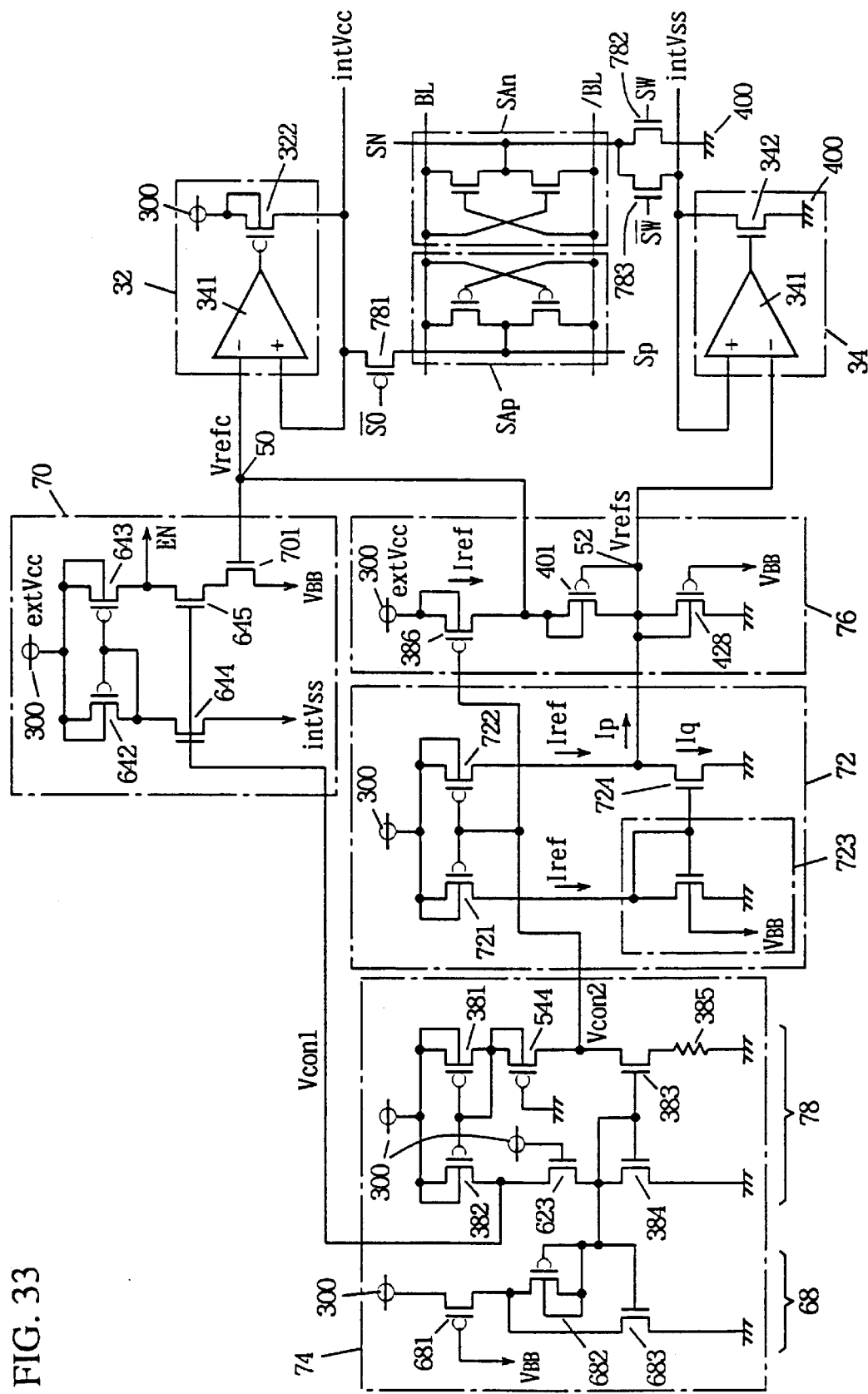
FIG. 33 is a schematic diagram showing a structure of a part of an intermediate potential generating circuit in accordance with Embodiment 24 of the present invention.

FIG. 33 is a circuit diagram showing a structure of reference potential generating circuit in accordance with Embodiment 24 of the present invention.

Like Embodiment 23, this Embodiment 24 is also a combination of several embodiments described above.

Referring to FIG. 33, the reference potential generating circuit includes a constant current generator 74, a current difference generator 72, a voltage generator 76, a substrate potential detecting circuit 70, a voltage lowering circuit 32 and a boosting circuit 34.

Constant current generator 74 includes start up circuit 68 shown in FIG. 31, and a control potential generating circuit 78. Control potential generating circuit 78 is a combination of control potential generating circuit 55 shown in FIG. 21 and control potential generating circuit 58 shown in FIG. 25 in which a P channel MOS transistor 544 is connected between P channel MOS transistor 381 and N channel MOS transistor 383, and an N channel MOS transistor 623 is connected between P channel MOS transistor 382 and an N channel MOS transistor 384.

Therefore, a control potential $V_{con}1$ not dependent on the change in external power supply potential extVcc is applied to the gate electrodes of two N channel MOS transistors 644 and 645 in substrate potential detecting circuit 70. Further, a control potential $V_{con}2$ not dependent on the change in external power supply potential extVcc is applied to the gate electrode of P channel MOS transistor 386 in voltage generator 76.

Therefore, transistor 386 supplies reference current $I_{ref}$ to transistors 401 and 428 in response to control signal $V_{con}2$. Accordingly, in voltage generator 76, base reference potentials $V_{refc}$ and $V_{refs}$ are generated in response to the reference current $I_{ref}$. The base reference potential $V_{refs}$ is determined by the conduction resistance of P channel MOS transistor 428 receiving at its gate electrode the substrate potential $V_{BB}$. The base reference potential $V_{refc}$ is determined based on the conduction resistance and threshold voltage of the diode connected P channel MOS transistor 401 as well as the base reference potential $V_{refs}$.

Meanwhile, in substrate potential detecting circuit 70, internal ground potential intVss is applied to the source electrode of transistor 644 to which gate electrode the control potential $V_{con}1$ is applied, and substrate potential $V_{BB}$ is applied to the source electrode of transistor 701 to which gate electrode the base reference potential $V_{refc}$ is applied.

Therefore, when the substrate potential $V_{BB}$ becomes sufficiently low, the current flowing through transistor 645 becomes larger than the current flowing through transistor 644, and hence control signal EN attains to the L level. Therefore, a substrate potential supplying circuit (not shown) is inactivated in response to the L level control signal EN. Meanwhile, if the substrate potential $V_{BB}$ is not sufficiently low, control signal EN attains to the H level, and the substrate potential supplying circuit is activated.

Current difference generator 72 includes two P channel MOS transistors 721 and 722 constituting a current mirror circuit, an N channel MOS transistor 723 having the identical structure as a transfer gate in a memory cell, and an N channel MOS transistor 724 constituting, together with transistor 723, a current mirror circuit.

Control potential $V_{con}2$ is applied to the gate electrodes of transistors 721 and 722, and therefore reference current $I_{ref}$ flows through transistors 721 and 722 in response to the control potential $V_{con}2$.

Here, when the peripheral temperature increases, the threshold voltages of transistors 723 and 724 decrease. In current difference generator 72, the threshold voltage of transistor 723 is set to be smaller than that of transistor 724 when the peripheral temperature rises.

Therefore, when the peripheral temperature increases, the current $I_q$ flowing through transistor 724 decreases, and current $I_p$ flowing from current difference generator 72 to voltage generator 76 increases. When current $I_p$ increases, the base reference potential $V_{refs}$ increases. Therefore, as the peripheral temperature increases, internal ground potential intVss increases.

Generally, the sub threshold current flowing through transfer gate in a memory cell tends to be increased as the temperature rises. However, in Embodiment 24, internal ground node intVss rises as the temperature rises, and hence substantially lower potential is applied to the gate electrode of the transfer gate as the temperature rises. Therefore, sub threshold current does not increase even when the temperature rises.

When the substrate potential $V_{BB}$ increases and not sufficiently low any more, the threshold voltage of transistor 723 becomes smaller, and therefore current $I_p$ flowing from current difference generator 72 to voltage generator 76 increases. When current $I_p$ increases, base reference potential $V_{refs}$ increases, and internal ground potential intVss also increases. Therefore, in this case also, substantially lower potential is applied to the gate electrode of the transfer gate in the memory cell as the temperature rises, and hence sub threshold current does not increase even when the temperature rises.

[Embodiment 25]

Figure 34:
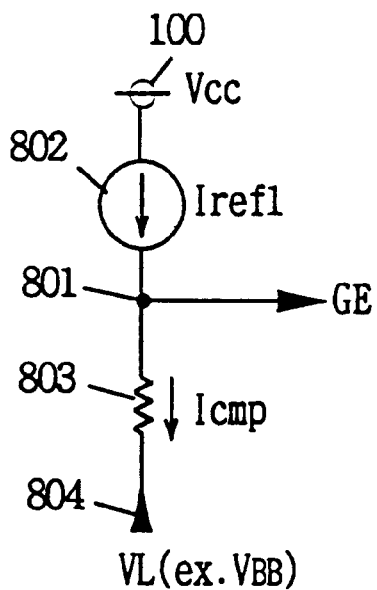
FIG. 34 is a schematic diagram showing a structure of an internal potential detecting circuit in accordance with Embodiment 25 of the present invention.

FIG. 34 is a circuit diagram showing a structure of an internal potential detecting circuit in accordance with Embodiment 25 of the present invention.

Figure 35:
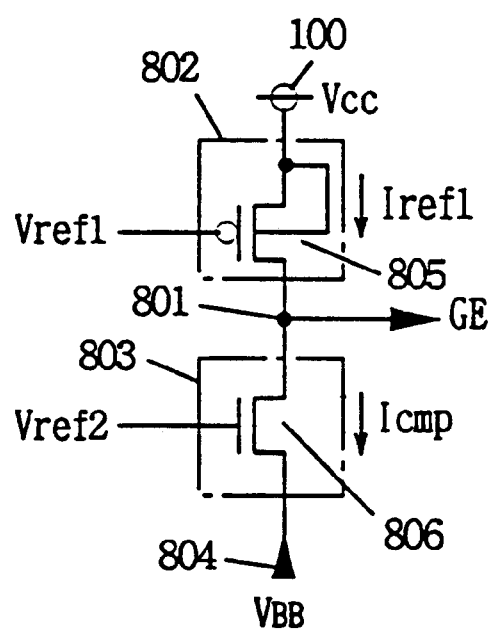
FIG. 35 is a schematic diagram showing a specific structure of the internal potential generating circuit shown in FIG. 34.

FIG. 35 is a circuit diagram showing a specific structure of the internal potential detecting circuit shown in FIG. 34.

Referring to FIGS. 34 and 35, the internal potential detecting circuit includes an output node 801, a constant current source 802 supplying a constant reference current $I_{ref}$, a detecting node 804 to which a low potential VL to be detected is applied, and a resistance element 803 connected between output node 801 and detecting node 804.

Constant current source 802 is formed by a P channel MOS transistor 805, for example, as shown in FIG. 35. A constant reference potential $V_{ref}1$ is applied to the gate electrode of transistor 805. Therefore, a constant reference current $I_{ref}1$ flows in transistor 805.

Meanwhile, resistance element 803 is formed by an N channel MOS transistor 806, for example, as shown in FIG. 35. A constant reference potential $V_{ref}2$ is applied to the gate electrode of transistor 806. Therefore, transistor 806 has a constant drain resistance, and serves as a resistor.

As a low internal potential VL, a substrate potential $V_{BB}$, for example, is applied to detecting node 804. When the applied substrate potential $V_{BB}$ is sufficiently low, that is, when it is sufficiently lower than the ground potential, the current for comparison $I_{cmp}$ flowing through transistor 806 is larger than reference current $I_{ref}$, and therefore output node 801 is discharged. Accordingly, an enable signal GE at the L (logic low) level is generated.

Meanwhile, when the applied substrate potential $V_{BB}$ is shallow, namely, when it is not sufficiently lower than the ground potential, the current for comparison $I_{cmp}$ is smaller than reference current $I_{ref}1$, and therefore output node 801 is charged. Therefore, an enable signal GE at H level is generated.

The generated enable signal GE is supplied to the substrate potential generating circuit (not shown). When the enable signal GE is at the L level, the substrate potential generating circuit is inactivated. When enable signal GE is at the H level, the substrate potential generating circuit is activated, generating substrate potential $V_{BB}$.

Therefore, by the internal potential detecting circuit, whether or not the substrate potential $V_{BB}$ has attained the prescribed level is determined. Further, since constant reference current $I_{ref}1$ is supplied to the output node 801 even when power supply potential Vcc fluctuates, the detecting level of the internal potential detecting circuit does not fluctuate. Therefore, when the substrate potential generating circuit is controlled by using the internal potential detecting circuit, a constant substrate potential $V_{BB}$ not dependent on the fluctuation of power supply potential Vcc can be obtained.

[Embodiment 26]

Figure 36:
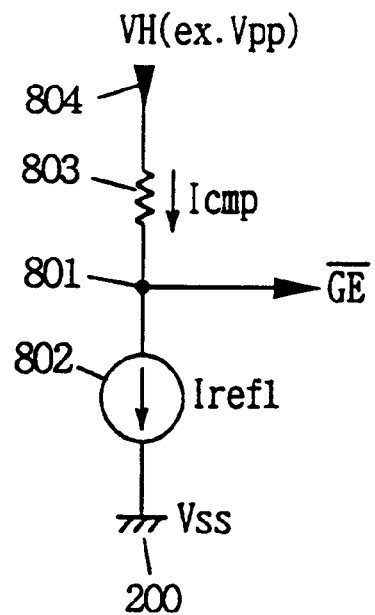
FIG. 36 is a schematic diagram showing a structure of an internal potential detecting circuit in accordance with Embodiment 26 of the present invention.
Figure 37:
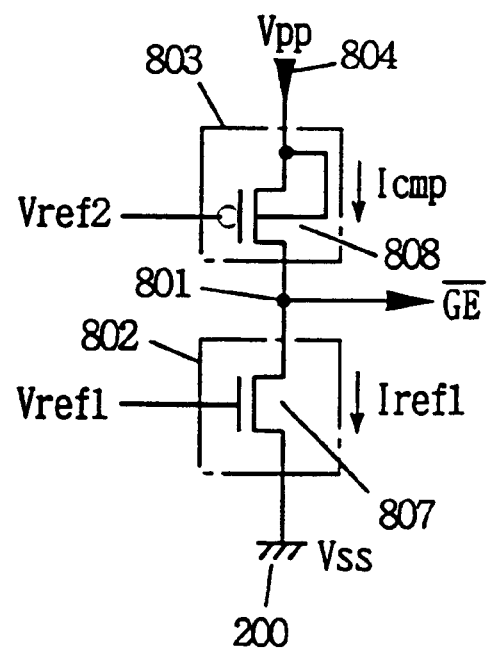
FIG. 37 is a schematic diagram showing a specific structure of the internal potential detecting circuit shown in FIG. 36.

FIG. 36 is an illustration showing a structure of the internal potential detecting circuit in accordance with Embodiment 26 of the present invention. FIG. 37 is a circuit diagram showing specific structure of the internal potential detecting circuit shown in FIG. 36. The internal potential detecting circuit in accordance with Embodiment 26 is for detecting a high internal potential VH, unlike the internal potential detecting circuit of FIG. 34.

Referring to FIGS. 36 and 37, in the internal potential detecting circuit, a constant current source 802 is connected between an output node 801 and ground node 200. Further, a resistance element 803 is connected between a detection node 804 and an output node 801. A high internal potential VH (for example, boosted potential $V_{pp}$) is applied to detection node 804.

Constant current source 802 is formed by an N channel MOS transistor 807, for example, as shown in FIG. 37. A constant reference potential $V_{ref}1$ is applied to the gate electrode of transistor 807. Therefore, a constant reference current $V_{ref}1$ flows through transistor 807.

Meanwhile, resistance element 803 is formed by a P channel MOS transistor 808, for example, as shown in FIG. 87. A constant reference potential $V_{ref}2$ is applied to the gate electrode of transistor 808. Therefore, transistor 808 has a constant drain resistance, and serves as a resistor.

In the internal potential detecting circuit, when boosted potential $V_{pp}$ is sufficiently high, the current for comparison $I_{cmp}$ flowing through transistor 808 is larger than the reference current $I_{ref}1$, and hence output node 801 is charged. Therefore, an H level enable signal /GE is generated.

Meanwhile, when the boosted potential $V_{pp}$ is not sufficiently high, that is, when it is low, the current for comparison $I_{cmp}$ is smaller than the reference current $I_{ref}1$, and hence output node 801 is discharged. Therefore, an L level enable signal /GE is generated.

The generated enable signal /GE is supplied to a boosted potential generating circuit. The boosted potential generating circuit is inactivated when the enable signal /GE is at the H level. Meanwhile, the boosted potential generating circuit is activated when the enable signal GE is at the L level, and generates a boosted potential $V_{pp}$.

Therefore, by the internal potential detecting circuit, whether or not the boosted potential $V_{pp}$ has attained a prescribed detection level is determined. Even when the ground potential Vss fluctuates, the detection level does not fluctuate together with the ground potential Vss, since a constant reference current $I_{ref}1$ is supplied from output node 801 to ground node 200. Therefore, by controlling the boosted potential generating circuit by using the internal potential detecting circuit, a constant boosted potential $V_{pp}$ not dependent on the fluctuation of the ground potential Vss can be obtained.

[Embodiment 27]

Figure 38:
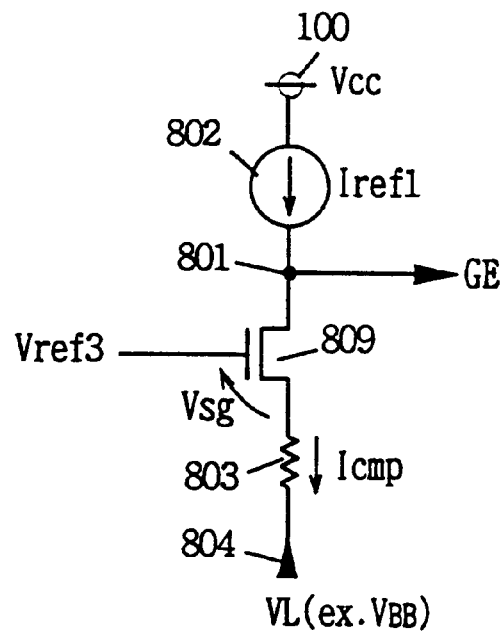
FIG. 38 is a schematic diagram showing a structure of an internal potential detecting circuit in accordance with Embodiment 27 of the present invention.

FIG. 38 is an illustration showing a structure of an internal potential detecting circuit in accordance with Embodiment 27 of the present invention. Referring to FIG. 38, the internal potential detecting circuit includes, in addition to the components shown in FIG. 34, an N channel MOS transistor 809. The transistor 809 is connected between output node 801 and resistance element 803. A constant reference potential $V_{ref}3$ is applied to the gate electrode of transistor 809. In the internal potential detecting circuit, when the substrate potential $V_{BB}$ applied to the detection node 804 is shallow, the voltage Vsg across the source and gate of transistor 809 is smaller than the threshold voltage, and therefore transistor 809 is not conducted. Accordingly, current for comparison $I_{cmp}$ does not flow at all, and output node 801 is charged by reference current $I_{ref}1$. Accordingly, an H level enable signal GE is generated.

Meanwhile, when the substrate potential $V_{BB}$ becomes lower and the source potential of transistor 809 becomes lower than the reference potential $V_{ref}3$ by the threshold voltage, transistor 809 is rendered conductive, and current for comparison $I_{cmp}$ flows. When the substrate potential $V_{BB}$ is sufficiently low, the current for comparison $I_{cmp}$ becomes larger than the reference current $I_{ref}$, and hence output node 801 is discharged by the current for comparison $I_{cmp}$, and an L level enable signal GE is generated.

Therefore, the detection level of the internal potential detecting circuit is determined by the reference potential $V_{ref}3$ Therefore, even when the power supply potential Vcc fluctuates, the detection level does not fluctuate. Further, the voltage across resistance element 803 of Embodiment 27 is smaller than the voltage across the resistance element 803 in Embodiment 25 above. Therefore, when the current for comparison $I_{cmp}$ of Embodiment 27 is the same as that in Embodiment 25, it is possible to make smaller the value of resistance element 803. Since it is generally difficult to form a resistance element having high value, Embodiment 27 can be implemented easier than Embodiment 25 above.

[Embodiment 28]

Figure 39:
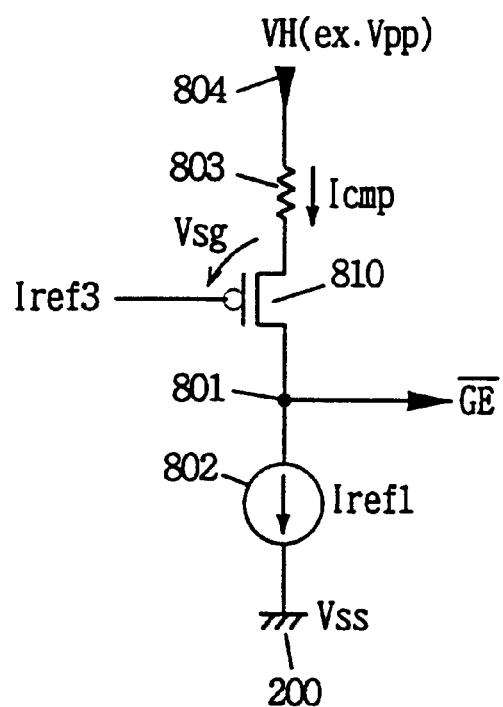
FIG. 39 is a schematic diagram showing a structure of an internal potential detecting circuit in accordance with Embodiment 28 of the present invention.

FIG. 39 is an illustration showing the structure of an internal potential detecting circuit in accordance with Embodiment 28 of the present invention.

Referring to FIG. 39, the internal potential detecting circuit includes a P channel MOS transistor 810 in addition to the components shown in FIG. 36. Transistor 810 is connected between resistance element 803 and output node 801. A constant reference potential $V_{ref}3$ is applied to the gate electrode of transistor 810.

When boosted potential $V_{pp}$ is low, transistor 810 is rendered non-conductive, and current for comparison $I_{cmp}$ does not flow at all. Therefore, output node 810 is discharged by reference current $I_{ref}1$ and an L level enable signal GE is generated.

Meanwhile, when boosted potential $V_{pp}$ increases and the source potential of transistor 810 becomes higher than reference potential $V_{ref}3$ by its threshold voltage, transistor 810 is rendered conductive, and current for comparison $I_{cmp}$ flows. When boosted potential $V_{pp}$ is sufficiently high, the current for comparison $I_{cmp}$ becomes larger than the reference current $I_{ref}1$, and hence output node 801 is charged by the current for comparison $I_{cmp}$. Thus, an H level enable signal /GE is generated.

The voltage across the resistance element 803 in Embodiment 28 is smaller than the voltage across resistance element 803 of Embodiment 26 above. Therefore, the value of resistance element 803 can be decreased. Therefore, Embodiment 28 can be more easily implemented than Embodiment 26 above.

[Embodiment 29]

Figure 40:
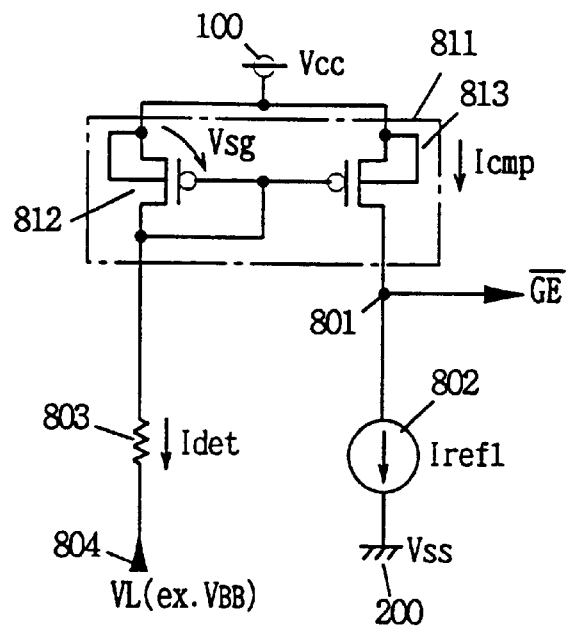
FIG. 40 is a schematic diagram showing a structure of an internal potential detecting circuit in accordance with Embodiment 29 of the present invention.

FIG. 40 is an illustration showing a structure of an internal potential detecting circuit in accordance with Embodiment 29 of the present invention.

Referring to FIG. 40, the internal potential detecting circuit includes an output node 801, a constant current source 802 supplying a constant reference current $I_{ref}2$ from output node 801 to ground node 200, a detection node 804 to which a low internal potential VL to be detected is applied, a resistance element 803 connected to detection node 804, and a current mirror circuit 811 for supplying current for comparison $I_{cmp}$ which is equal to the detection current $I_{det}$ flowing through resistance element 803 to output node 801. Current mirror circuit 811 includes P channel MOS transistors 812 and 813. Transistor 812 has its gate electrode and source electrode connected to each other. Transistor 812 has its gate electrode connected to the gate electrode of transistor 813. Constant current source 802 is formed by an N channel MOS transistor having a gate electrode receiving a constant reference potential, as constant current source 802 of FIG. 37. Similar to resistance element 803 of FIG. 35, resistance element 803 is formed by an N channel MOS transistor receiving at its gate a constant reference potential.

In the internal potential detecting circuit, a reference potential $V_{BB}$, for example, is applied as low internal potential VL to detection node 804. When substrate potential $V_{BB}$ is sufficiently deep, a detection current $I_{det}$ flows through resistance element 803. Current mirror circuit 811 supplies a current for comparison $I_{cmp}$ which is equal to the detection current $I_{det}$ to output node 801. When substrate potential $V_{BB}$ is sufficiently deep, current for comparison $I_{cmp}$ is larger than reference current $I_{ref}1$, and therefore output node 801 is charged by reference current $I_{cmp}$. Therefore, an H level enable signal /GE is generated.

Meanwhile, when the substrate potential $V_{BB}$ is shallow, reference current $I_{ref}1$ is larger than the current for comparison $I_{cmp}$ and therefore output node 801 is discharged by the reference current $I_{ref}1$. Therefore, an L level enable signal GE is generated. When the substrate potential $V_{pp}$ is very shallow, the voltage Vsg across the source-gate of transistor 812 becomes smaller than the threshold voltage, and hence transistor 812 is rendered non-conductive. Consequently, detection current $I_{det}$ does not flow at all, and hence power consumption can be reduced as compared with the embodiments above not using the current mirror.

[Embodiment 30]

Figure 41:
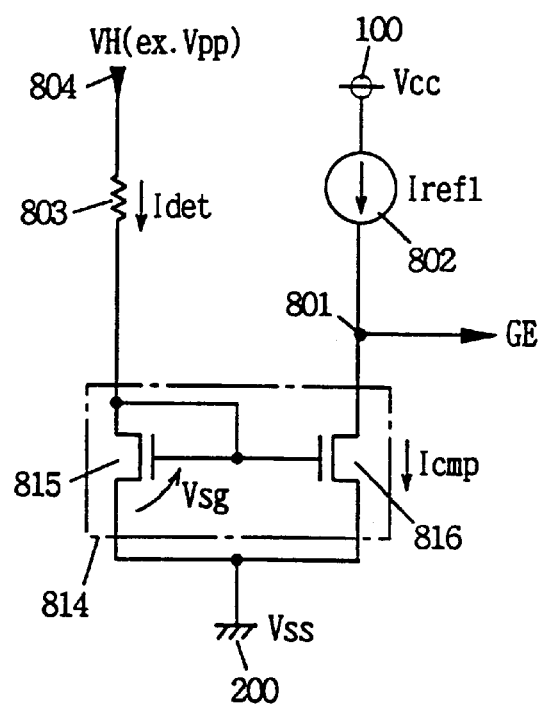
FIG. 41 is a schematic diagram showing a structure of an internal potential detecting circuit in accordance with Embodiment 30 of the present invention.

FIG. 41 is an illustration showing a structure of an internal potential detecting circuit in accordance with Embodiment 30 of the present invention. Different from the internal potential detecting circuit shown in FIG. 40, the internal potential detecting circuit is for detecting a relatively high internal potential VH such as the boosted potential $V_{pp}$. Referring to FIG. 41, the internal potential detecting circuit includes an output node 801, a constant current source 802 supplying a constant reference current $I_{ref}1$ from power supply node 100 to output node 801, a detection node 804 to which internal potential VH is applied, a resistance element 803 connected to detection node 804, and a current mirror circuit 814 for supplying a current for comparison $I_{cmp}$ which is equal to the detection current $I_{det}$ flowing through resistance element 803 from output node 801 to ground node 200. Current mirror circuit 814 includes N channel MOS transistors 815 and 816. Transistor 815 has its gate electrode and drain electrode connected to each other. Transistor 815 has its gate electrode connected to the gate electrode of transistor 816.

In the internal potential detecting circuit, when the internal potential $V_{pp}$ applied to detection node 804 is sufficiently high, a detection current $I_{det}$ flows through resistance element 803. Current mirror circuit 814 supplies current for comparison $I_{cmp}$ which is equal to detection current $I_{det}$ from output node 801 to ground node 200. When boosted potential $V_{pp}$ is sufficiently high, current for comparison $I_{cmp}$ is larger than reference current $I_{ref}1$, and hence output node 801 is discharged by the current for comparison $I_{cmp}$. Therefore, an L level enable signal GE is generated.

Meanwhile, when boosted potential $V_{pp}$ is low, reference current $I_{ref}1$ becomes larger than current for comparison $I_{cmp}$, and hence output node 801 is charged by reference current $I_{ref}$. Therefore, an H level enable signal GE is generated. When boosted potential $V_{pp}$ is very low, the voltage Vsg across source-gate of transistor 815 becomes smaller than the threshold voltage, and transistor 815 is rendered non-conductive. Consequently, detection current $I_{det}$ does not flow at all, and hence power consumption of internal potential detecting circuit in accordance with Embodiment 30 can be reduced as compared with the Embodiments above not using current mirror circuit.

[Embodiment 31]

Figure 42:
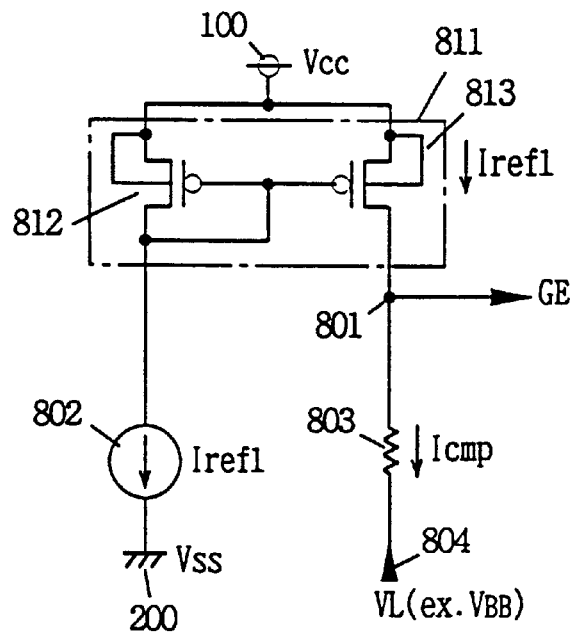
FIG. 42 is a schematic diagram showing a structure of an internal potential detecting circuit in accordance with Embodiment 31 of the present invention.

FIG. 42 is an illustration showing a structure of an internal potential detecting circuit in accordance with Embodiment 31 of the present invention.

Referring to FIG. 42, in the internal potential detecting circuit, constant current source 802 and resistance element 803 are provided at reverse positions as compared with FIG. 40. In other words, constant current source 802 and current mirror circuit 811 of Embodiment 31 correspond to constant current source 802 of FIG. 34.

In internal potential detecting circuit, a constant reference current $I_{ref}1$ flows through transistor 812. Current mirror circuit 811 supplies a reference current $I_{ref}1$ which is equal to the reference current $I_{ref}1$ to output node 801. Therefore, when the substrate potential $V_{BB}$ applied to detection node 804 is sufficiently deep, current for comparison $I_{cmp}$ becomes larger than the reference current $I_{ref}1$, and hence an L level enable signal GE is generated. Meanwhile, when the substrate potential $V_{BB}$ is shallow, reference current $I_{ref}1$ becomes larger than current for comparison $I_{cmp}$, and hence an H level enable signal GE is generated.

[Embodiment 32]

Figure 43:
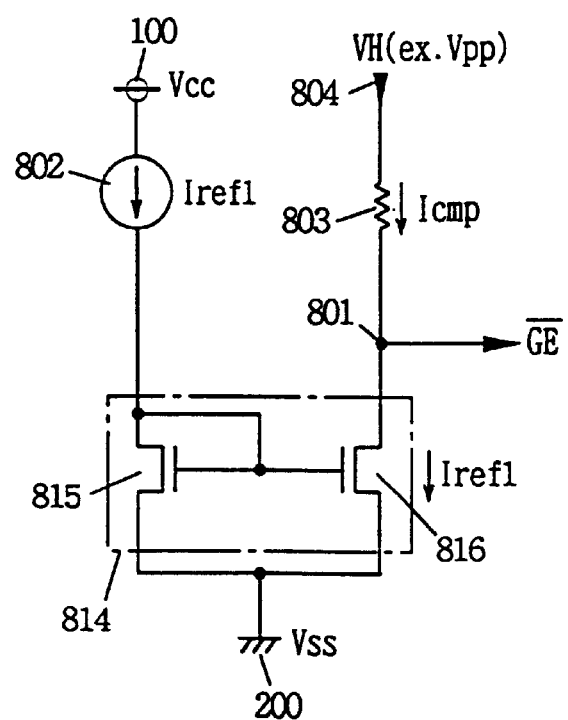
FIG. 43 is a schematic diagram showing a structure of an internal potential detecting circuit in accordance with Embodiment 32 of the present invention.

FIG. 43 is an illustration showing a structure of an internal potential detecting circuit in accordance with Embodiment 32 of the present invention. Referring to FIG. 43, in the internal potential detecting circuit, constant current source 802 and resistance element 803 are provided at positions reverse to those of FIG. 41. In other words, constant current source 802 and current mirror circuit 814 of Embodiment 32 correspond to constant current source 802 of FIG. 36.

In the internal potential detecting circuit, a constant reference current $I_{ref}1$ flows through transistor 815. Current mirror circuit 814 supplies a reference current $I_{ref}1$ which is equal to the reference current $I_{ref}1$ from output node 801 to ground node 200. Therefore, when the boosted potential $V_{pp}$ applied to detection node 804 is sufficiently high, the current for comparison $I_{cmp}$ becomes larger than reference current $I_{ref}1$, and hence an H level enable signal /GE is generated. Meanwhile, when the boosted potential $V_{pp}$ is low, reference current $I_{ref}1$ becomes larger than the current for comparison $I_{cmp}$, and hence an L level enable signal /GE is generated.

[Embodiment 33]

Figure 44:
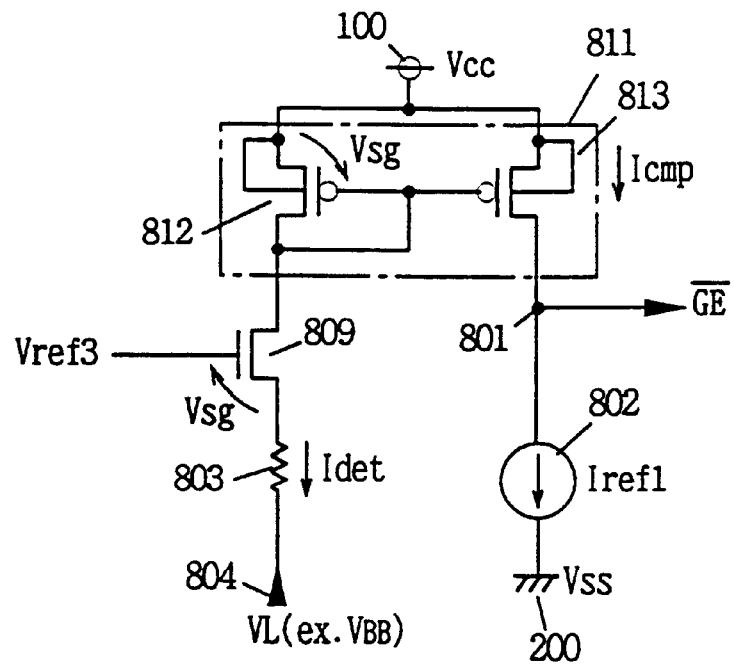
FIG. 44 is a schematic diagram showing a structure of an internal potential detecting circuit in accordance with Embodiment 33 of the present invention.
Figure 45:
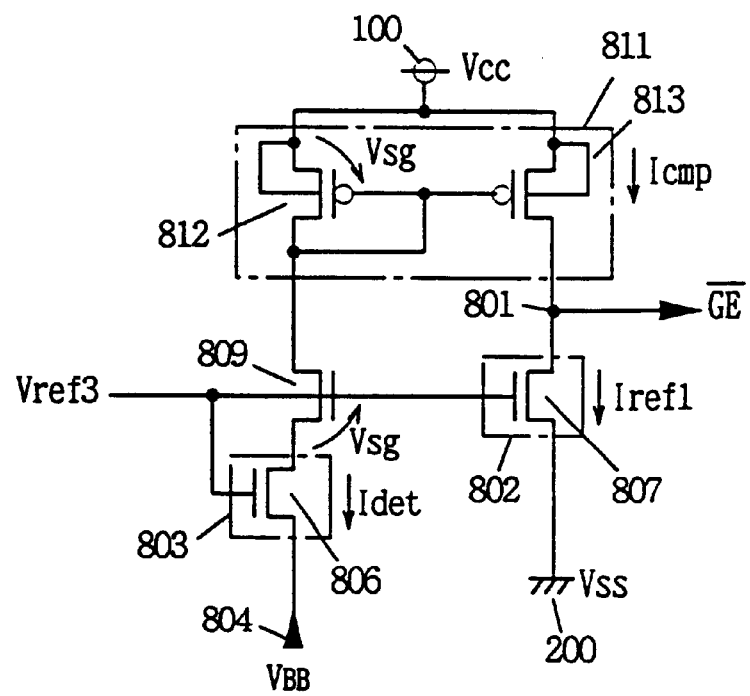
FIG. 45 is a schematic diagram showing a specific structure of an internal potential detecting circuit shown in FIG. 44.

FIG. 44 is an illustration showing a structure of an internal potential detecting circuit in accordance with Embodiment 33 of the present invention. Referring to FIG. 44, the internal potential detecting circuit includes, in addition to the components of FIG. 40, an N channel MOS transistor 809. Transistor 809 is connected between transistor 812 and resistance element 803. A constant reference current $I_{ref}3$ is applied to the gate electrode of transistor 809. Constant current source 802 is formed by an N channel MOS transistor 807 as shown in FIG. 45. The aforementioned reference current $I_{ref}3$ is applied to the gate electrode of transistor 807. Resistance element 803 is formed by an N channel MOS transistor 806, as shown in FIG. 45. The aforementioned reference current $I_{ref}3$ is applied to the gate electrode of transistor 806. Therefore, transistor 807 serves as a constant current source, and transistor 806 serves as a resistor. The internal potential detecting circuit is for determining whether or not the substrate potential $V_{BB}$ has attained a prescribed level, and therefore it will be referred to as substrate potential detecting circuit in the following.

In the substrate potential detecting circuit, when the substrate potential $V_{BB}$ applied to detection node 804 is low, transistors 809 and 812 are both rendered non-conductive, and therefore detection current $I_{det}$ does not flow at all in transistor 806. Therefore, current for comparison $I_{cmp}$ is not supplied at all from power supply node 100 through transistor 813 to output node 801, and hence output node 801 is discharged by reference current $I_{ref}1$ flowing through transistor 807. Therefore, an L level enable signal /GE is generated. The substrate potential generating circuit is activated in response to the L level enable signal /GE.

When the substrate potential generating circuit is activated, the substrate potential $V_{BB}$ lowers gradually. Consequently, when the voltage Vsg across source-gate of transistor 812 becomes larger than the threshold voltage thereof, transistor 812 is rendered conductive. When the voltage Vsg across source-gate of transistor 809 becomes larger than its threshold voltage, transistor 809 is rendered conductive. Therefore, as the substrate potential $V_{BB}$ becomes lower, the detection current $I_{det}$ increases, and current for comparison $I_{cmp}$ also increases. The current for comparison $I_{cmp}$ becomes equal to reference current $I_{ref}1$, when substrate potential $V_{BB}$ satisfies the relation defined by the equation (2) below:

$$V_{BB} = V_{ref}3 - V_{tn} - V_{on} \quad (2)$$

where $V_{tn}$ represents threshold voltage of transistor 809. $V_{on}$ represents the voltage across source-drain of transistor 806 when it is conductive. Therefore, the voltage $V_{on}$ can be represented by the equation (3) below, where drain resistance of transistor 806 when it is conductive is represented as Rd:

$$V_{on} = V_{det} \times Rd \quad (3)$$

When substrate potential $V_{BB}$ is sufficiently deep, current for comparison $I_{cmp}$ larger than reference current $I_{ref}1$ flows to output node 801. Consequently, output node 801 is charged, and an H level enable signal /GE is generated. The substrate potential generating circuit is inactivated in response to the H level enable signal GE.

Now, the threshold voltage $V_{tp}$ of transistor 809 becomes smaller as operational temperature increases. The drain resistance Rd of transistor 806 increases as operational temperature increases. Therefore, assuming that the detection current $I_{det}$ is constant, the voltage $V_{on}$ across source-drain of transistor 806 increases as the operational temperature increases. Since voltages $V_{tp}$ and $V_{on}$ both change approximately linearly with respect to the operational temperature, the fluctuation of voltages $V_{tn}$ and $V_{on}$ with operational temperature can be offset. Therefore, the detection level of the internal potential detecting circuit is always constant, regardless of the operational temperature.

According to Embodiment 33, since the detection level is determined by the reference current $I_{ref}3$, the detection level does not fluctuate even when power supply potential Vcc fluctuate. Therefore, when the substrate potential generating circuit is controlled by using the substrate potential detecting circuit, a stable substrate potential $V_{BB}$ not dependent on the fluctuation of power supply potential Vcc can be obtained.

Further, since transistors 806 and 809 are connected in series, a stable detection level not dependent on the fluctuation of operational temperature can be obtained. Further, when the substrate potential $V_{BB}$ is not sufficiently low, transistor 812 is rendered non-conductive, and hence current consumption can be reduced.

[Embodiment 34]

Figure 46:
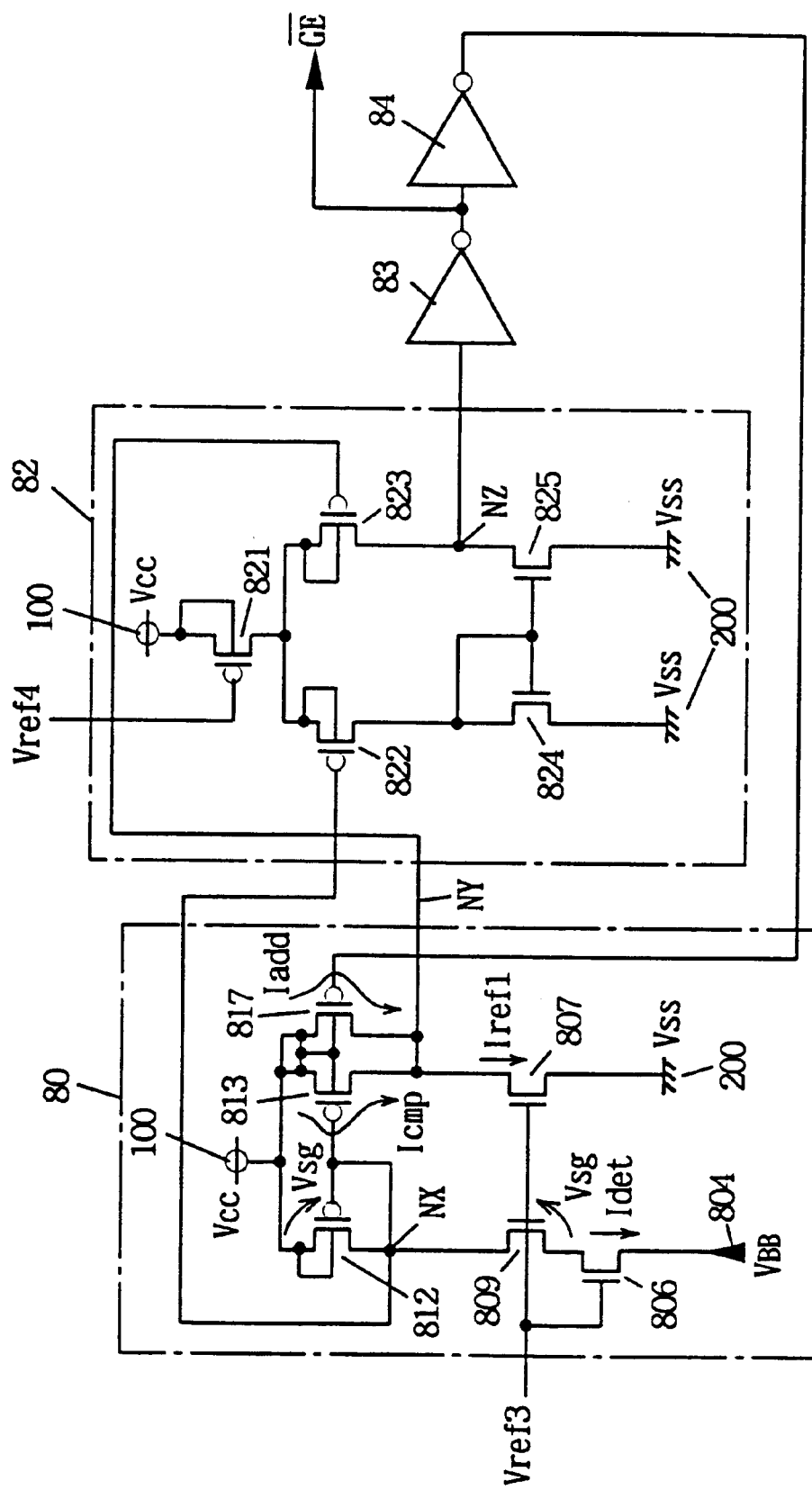
FIG. 46 is a schematic diagram showing a structure of a substrate potential detecting circuit in accordance with Embodiment 34 of the present invention.

FIG. 46 is a schematic diagram showing a structure of a substrate potential detecting circuit in accordance with Embodiment 34 of the present invention.

Referring to FIG. 46, the substrate potential detecting circuit includes a substrate potential detecting portion 80, a differential amplifier 82, and inverters 83 and 84. Substrate potential detecting portion 80 includes, in addition to the components shown in FIG. 45, a P channel MOS transistor 817. Transistor 817 is connected parallel to transistor 813. An output from inverter 84 is applied to the gate electrode of transistor 817.

Differential amplifier 82 includes P channel MOS transistors 821 to 823 and N channel MOS transistors 824 and 825. Transistor 821 has its source electrode connected to power supply node 100, and receives at its gate electrode, a constant reference potential $V_{ref}4$. Therefore, transistor 821 serves as a constant current source. Transistors 822 and 823 have their source electrodes both connected to the drain electrode of transistor 821. Transistor 822 has its gate electrode connected to the gate electrode of transistor 812 in substrate potential detecting portion 80. Transistor 823 has its gate electrode connected to an output node NY in substrate potential detecting portion 80. Transistor 824 is connected between transistor 822 and ground node 200, while transistor 825 is connected between transistor 823 and ground node 200. Transistor 824 has its gate electrode and drain electrode connected to each other. Transistor 824 has its gate electrode further connected to the gate electrode of transistor 825. Therefore, transistors 824 and 825 constitute a current mirror circuit. The potential at output node NZ of differential amplifier 82 is applied to inverter 83, and enable signal /GE is output from inverter 83.

Figure 47:
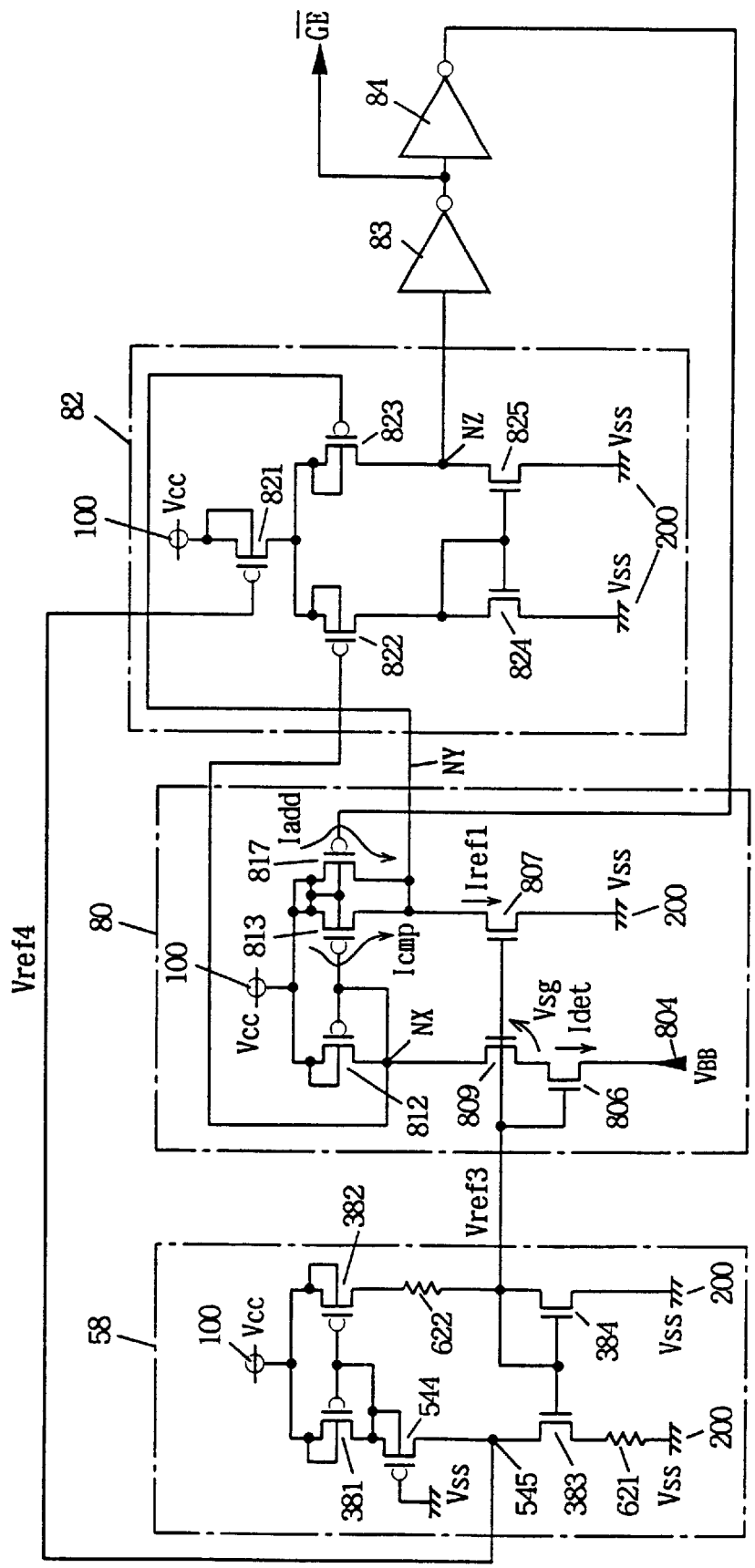
FIG. 47 is a schematic diagram showing a whole structure of a substrate potential detecting circuit shown in FIG. 46.

FIG. 47 shows the whole structure of the substrate potentials detecting circuit including, in addition to the structure of FIG. 46, a reference potential generating circuit 58 for generating the aforementioned reference potentials $V_{ref}3$ and $V_{ref}4$. The reference potential generating circuit 58 shown in FIG. 47 is the one shown in the Embodiment above, and it generates reference potentials $V_{ref}3$ and $V_{ref}4$ which are constant regardless of the fluctuation in power supply potential Vcc and in operational temperature.

Figure 48:
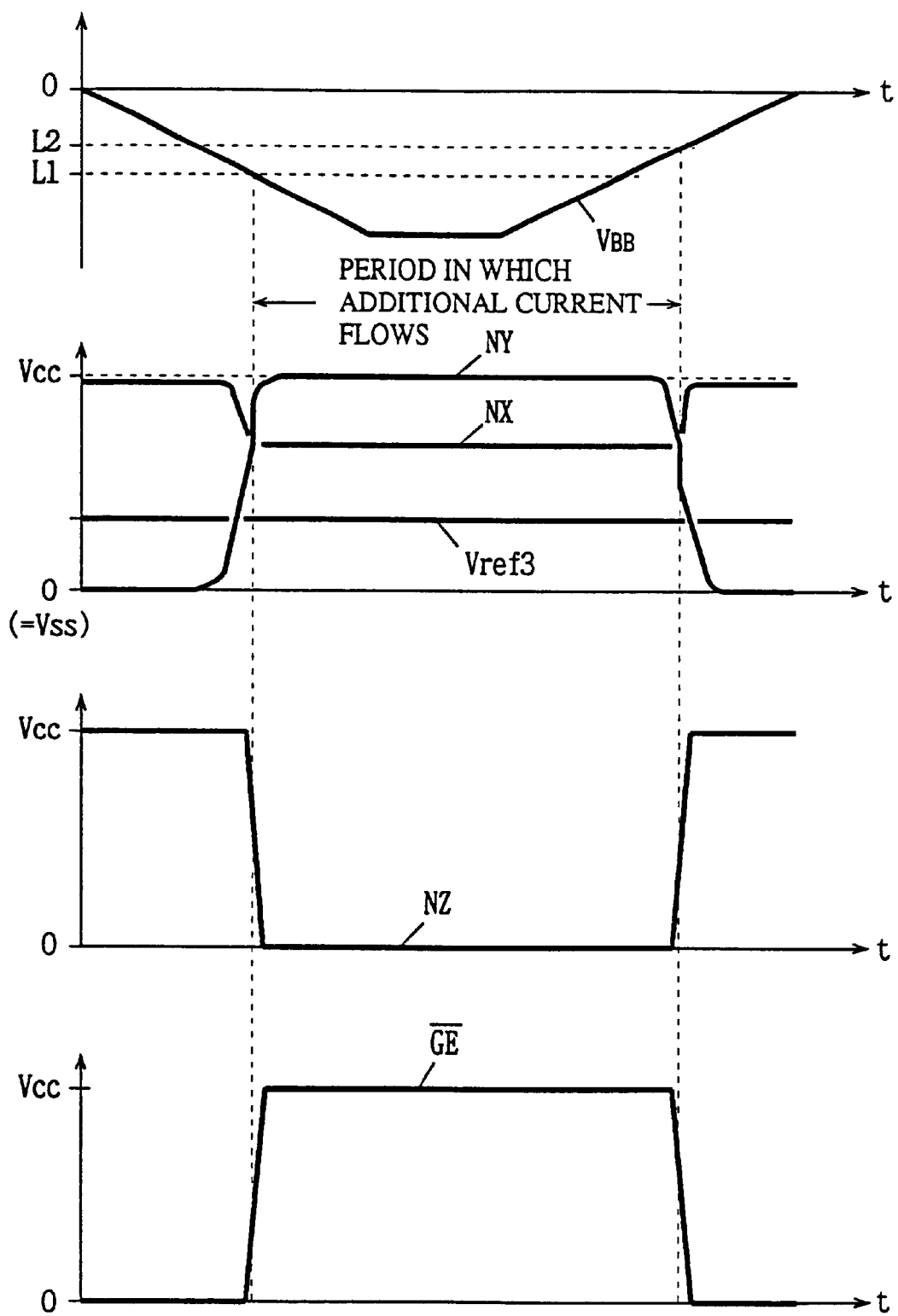
FIG. 48 is a waveform diagram showing an operation of the substrate potential detecting circuit shown in FIGS. 46 and 47.

FIG. 48 shows the manner of change of the potential at various nodes in the substrate potential detecting circuit shown in FIGS. 46 and 47 when the substrate potential $V_{BB}$ gradually lowers and then gradually rises. As shown in FIG. 48(a), when the substrate potential $V_{BB}$ is shallow, or more specifically, when the substrate potential $V_{BB}$ is higher than the detection level L1, transistor 812 in substrate potential detecting portion 80 is non-conductive, and hence the potential at the source node NX is approximately equal to the supply potential Vcc as shown in FIG. 48(b). Further, since transistor 813 is also non-conductive, current for comparison $I_{cmp}$ does not flow at all, and therefore the potential at output node NY is at the ground potential Vss.

When the substrate potential $V_{BB}$ gradually lowers as shown in FIG. 48(a) and the voltage Vsg between source·gate of transistor 812 reaches the threshold voltage, transistor 812 is rendered conductive, and the potential at node NX attains to the potential which is lower than the power supply potential Vcc by the threshold voltage of transistor 812. Meanwhile, as the substrate potential $V_{BB}$ lowers, current for comparison $I_{cmp}$ starts to flow in transistor 813, and hence the potential at node NY gradually increases.

The potentials at nodes NX and NY are compared by differential amplifier 82. While the potential at node NX is higher than the potential at node NY, the potential at output node NZ in differential amplifier 82 is at the power supply potential Vcc, that is, H (logic high) level as shown in FIG. 48(c). Therefore, an L level enable signal /GE is provided from inverter 83.

Further, when the potential at node NY attains higher than the potential at node NX, the potential at output node NZ in differential amplifier 82 changes from the H level to the L level, as shown in FIG. 48(c). When the potential at output node NZ attains to the L level, an H level enable signal /GE is output from inverter 83.

When the enable signal /GE is at the H level, an L level signal is applied from inverter 84 to the gate electrode of transistor 817. Therefore, transistor 817 is rendered conductive, and hence additional current $I_{add}$ is supplied from power supply node 100 to output node NY.

Thereafter, when substrate potential $V_{BB}$ gradually increases as shown in FIG. 48(a), current for comparison $I_{cmp}$ flowing through transistor 813 decreases, and the potential at output node NY lowers gradually. Since there is additional current $I_{add}$ flowing through transistor 817, when the reference current $I_{ref}1$ becomes larger than the sum of current for comparison $I_{cmp}$ and additional current $I_{add}$, the potential at output node NY attains to the L level. When the potential at output node NY becomes lower than the potential at node NX, the potential at output node NZ in differential amplifier 82 changes from the L level to the H level, and hence enable signal /GE changes from the H level to the L level.

In this manner, when the substrate potential $V_{BB}$ attains to the detection level L2 which is higher than the detection level L1, the enable signal /GE attains to the L level. Namely, the detection level of the substrate potential detecting circuit has hysterisis.

When transistor 817 and inverter 84 are not provided, the detection level when the substrate potential $V_{BB}$ lowers and the detection level when the substrate potential $V_{BB}$ rises are the same with each other. Therefore, there would be a chattering in the enable signal when the substrate potential $V_{BB}$ is near the detection level. However, since transistor 817 and inverter 84 are provided in the substrate potential detecting circuit of Embodiment 34 so as to provide hysterisis to the detection level, such chattering is not generated in the enable signal /GE.

Further, the reference current $I_{ref}1$ flowing through transistor 807 is preferably set to be lower than several μA. Therefore, when it takes long time for charging/discharging the parasitic capacitance of output node NY, the potential at output node NY is amplified by the differential amplifier 82, since differential amplifier 82 is provided in the internal potential detecting circuit in accordance with Embodiment 34. Therefore, the enable signal /GE can rise and fall quickly.

Figure 49:
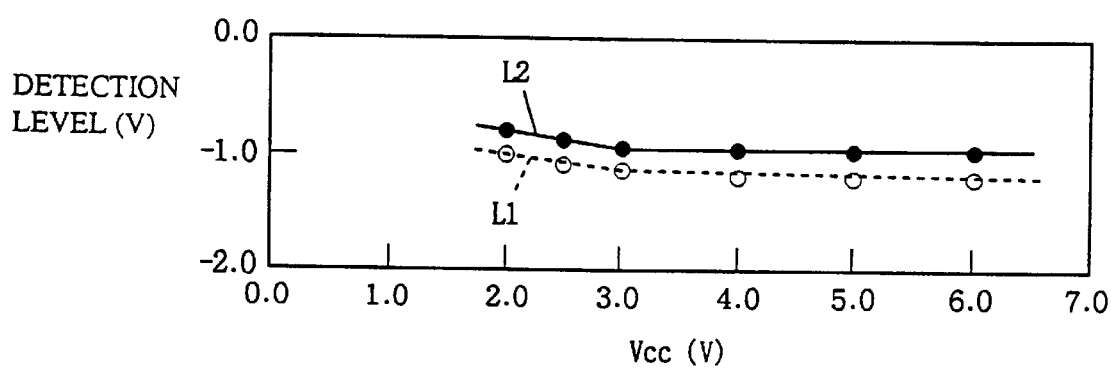
FIG. 49 is a graph showing relation between the power supply potential and detecting level of the substrate potential detecting circuit shown in FIGS. 46 and 47.

FIG. 49 is a graph showing relation between detection levels L1 and L2 and the power supply potential Vcc. The abscissa represents the power supply potential Vcc, and the ordinate represents the detection level. As is apparent from the graph of FIG. 49, the detection levels L1 and L2 are approximately constant regardless of the power supply potential Vcc. This is because the detection levels L1 and L2 are determined not based on the power supply potential Vcc but on a constant reference potential $V_{ref}3$.

[Embodiment 35]

Figure 50:
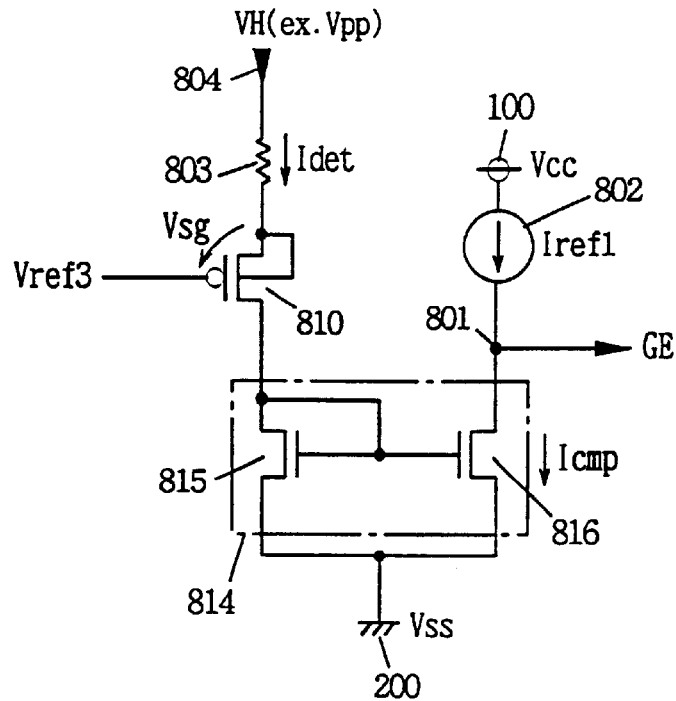
FIG. 50 is a schematic diagram showing a structure of internal potential detecting circuit in accordance with Embodiment 35 of the present invention.

FIG. 50 is an illustration showing a structure of a boosted potential detecting circuit in accordance with Embodiment 35 of the present invention. Referring to FIG. 50, the boosted potential detecting circuit includes, in addition to the structure of FIG. 41, a P channel MOS transistor 810. Transistor 810 is connected between resistance element 803 and transistor 815. Transistor 810 receives at its gate a constant reference potential $V_{ref}3$. Namely, the boosted potential detecting circuit is a modification of the substrate potential detecting circuit shown in FIG. 44, for detecting the boosted potential $V_{pp}$. Therefore, the boosted potential detecting circuit operates approximately in the same manner as the substrate potential detecting circuit shown in FIG. 44.

Figure 51:
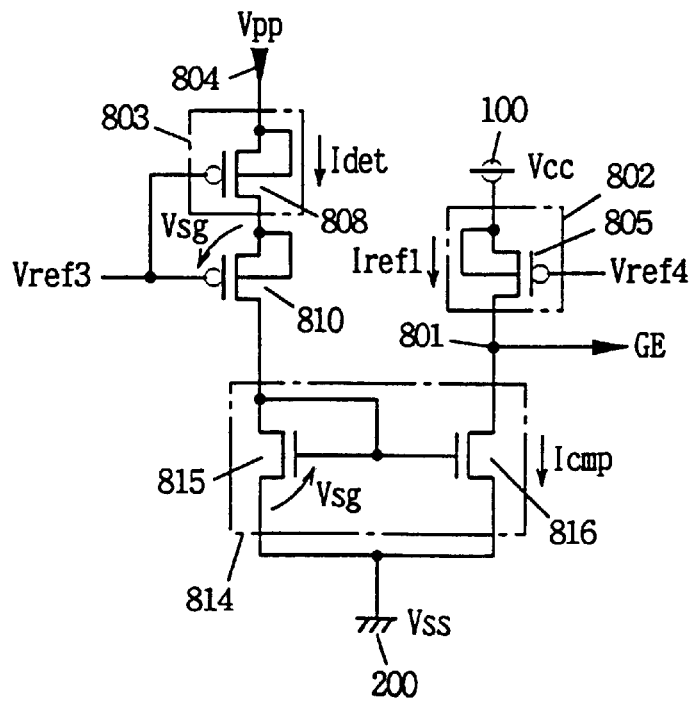
FIG. 51 is a schematic diagram showing a specific structure of an internal potential detecting circuit shown in FIG. 50.

FIG. 51 is a circuit diagram showing specific structure of the substrate potential detecting circuit shown in FIG. 50, which corresponds to FIG. 45. As shown in FIG. 51, resistance element 803 is formed by a P channel MOS transistor 808 which receives at its gate electrode the reference potential $V_{ref}3$. Constant current source 802 is formed by a P channel MOS transistor 805 which receives at its gate electrode the reference potential $V_{ref}4$. Therefore, transistor 808 serves as a resistor, and transistor 805 serves as a constant current source.

In the boosted potential detecting circuit, when the boosted potential $V_{pp}$ applied to the detection node 804 is not sufficiently high, the reference current $I_{ref}1$ flowing through transistor 805 is larger than the current for comparison $I_{cmp}$ flowing through transistor 816, and hence output node 801 is charged and an H level enable signal GE is generated. In response to the H level enable signal GE, a boosted potential generating circuit is activated.

Meanwhile, when the boosted potential $V_{pp}$ is sufficiently high, the current for comparison $I_{cmp}$ is larger than the reference current $I_{ref}1$, and hence output node 801 is discharged and an L level enable signal GE is generated. In response to the L level enable signal GE, the boosted potential generating circuit is inactivated.

According to Embodiment 35, since the detection level is determined based not on the power supply potential Vcc but on the reference potential $V_{ref}3$, even when the power supply potential Vcc fluctuates, the detection level of the boosted potential detecting circuit does not fluctuate. Further, since the drain resistance of transistor 808 increases as the operational temperature rises and the threshold voltage of transistor 810 becomes smaller as the operational temperature rises, the temperature dependency of voltage drop across transistor 808 and temperature dependency of voltage drop across transistor 810 are offset by each other. Therefore, a stable detection level not dependent on the operational temperature can be obtained. Further, when the boosted potential $V_{pp}$ is very low, transistor 815 is rendered non-conductive, and hence detection current $I_{det}$ and current for comparison $I_{cmp}$ do not flow at all, whereby current consumption can be reduced.

[Embodiment 36]

Figure 52:
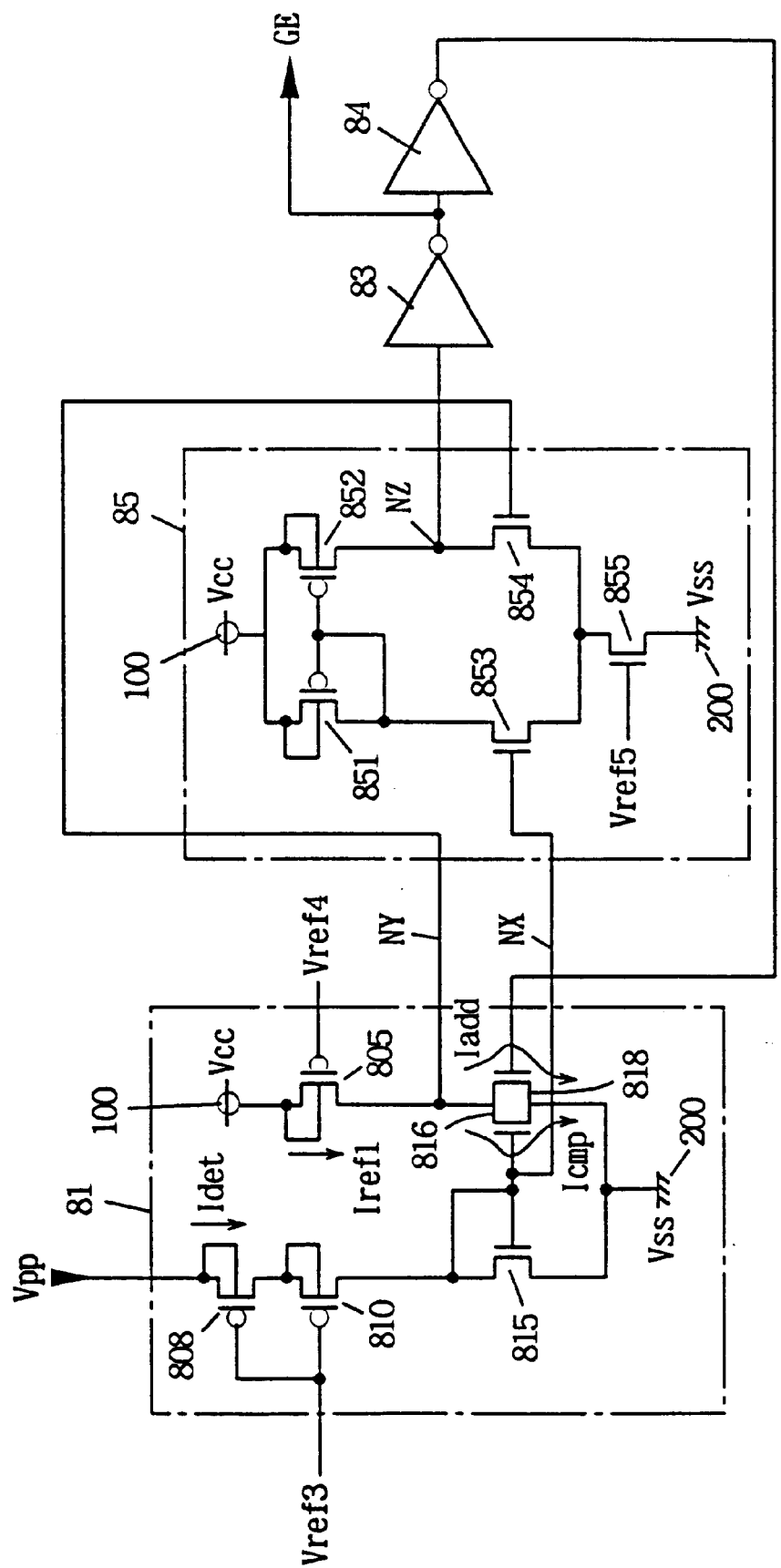
FIG. 52 is a schematic diagram showing a structure of a boosted potential detecting circuit in accordance with Embodiment 36 of the present invention.

FIG. 52 is a circuit diagram showing a structure of a boosted potential detecting circuit in accordance with Embodiment 36 of the present invention. Referring to FIG. 52, the boosted potential detecting circuit includes a boosted potential detecting portion 81, a differential amplifier 85 for amplifying an output from boosted potential detecting portion 81, and inverters 83 and 84. In addition to the structure of FIG. 51, boosted potential detecting portion 81 includes an N channel MOS transistor 818. Transistor 818 is connected parallel to transistor 816, and receives at its gate electrode, an output from inverter 84. The boosted potential detecting circuit shown in FIG. 52 is a modification of the substrate potential detecting circuit shown in FIG. 46 for detecting the boosted potential $V_{pp}$. Therefore, the boosted potential detecting circuit operates approximately in the same manner as the substrate potential detecting circuit shown in FIG. 46.

Figure 53:
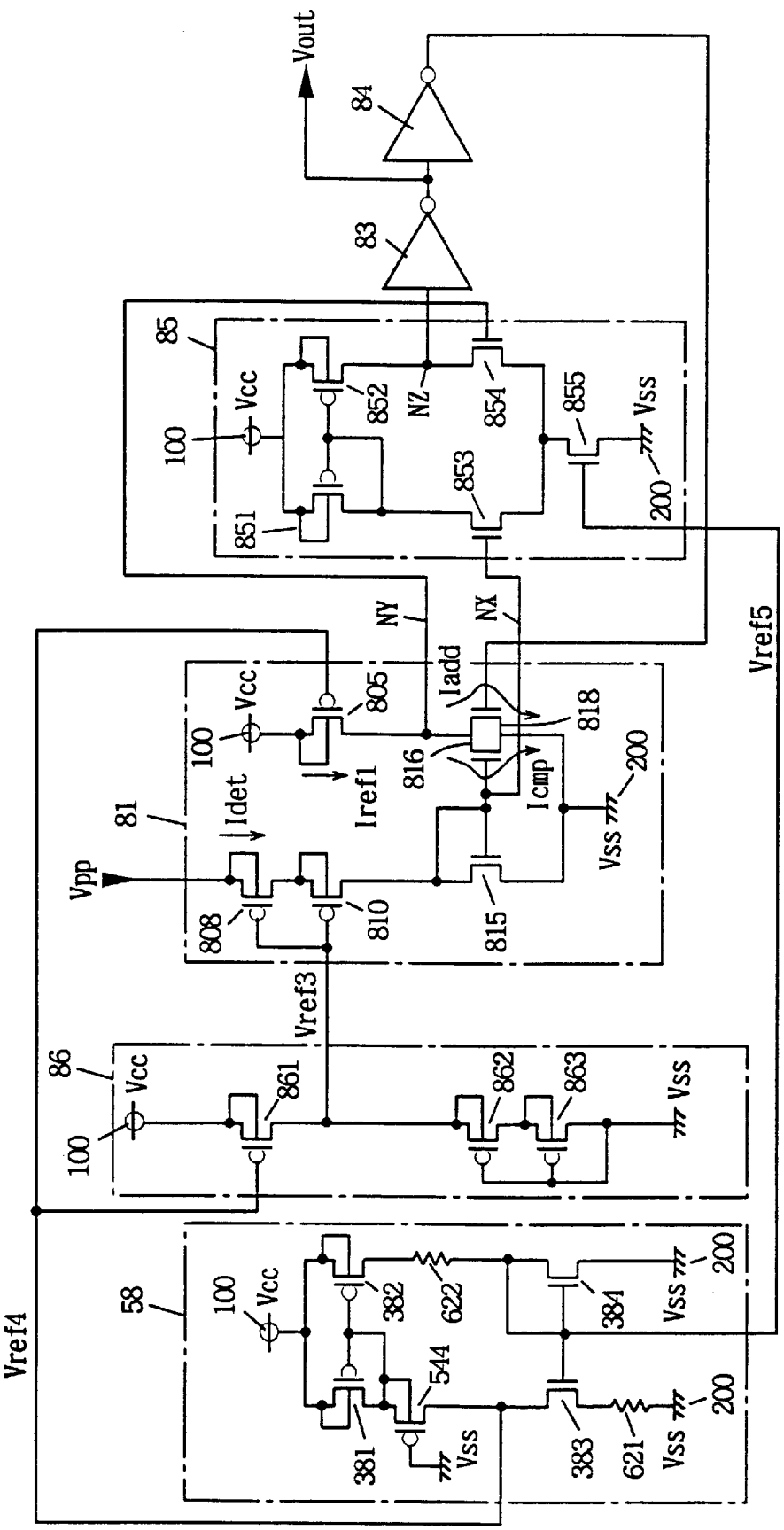
FIG. 53 is a schematic diagram showing the whole structure of the boosted potential detecting circuit shown in FIG. 52.

FIG. 53 corresponds to FIG. 47, and it includes reference potential generating circuits 58 and 86 added to the boosted potential detecting circuit shown in FIG. 52. Referring to FIGS. 52 and 53, the differential amplifying circuit 85 includes P channel MOS transistors 851 and 852, and N channel MOS transistors 853 to 855. Transistors 851 and 852 constitute a current mirror circuit. Transistor 853 has its gate connected to the gate electrode of transistor 815 in boosted potential detecting portion 81. Transistor 854 has its gate electrode connected to an output node NY in the boosted potential detecting portion 81. Since a constant reference potential $V_{ref}5$ generated by reference potential generating circuit 58 is applied to the gate electrode of transistor 855, transistor 855 serves as a constant current source.

Referring to FIG. 53, reference potential generating circuit 86 includes P channel MOS transistors 861 to 863. Since a constant reference potential $V_{ref}4$ generated by reference potential generating circuit 58 is applied to the gate electrode of transistor 861, transistor 861 serves as a constant current source. Transistors 862 and 863 are connected in series, and ground potential Vss is applied to the gate electrodes of these. Therefore, transistors 862 and 863 as a whole function as a resistor. Since a constant current is supplied from transistor 861 to transistors 862 and 863, a constant reference potential $V_{ref}3$ which is not dependent on the power supply potential Vcc is generated at the source node of transistor 862. The reference potential $V_{ref}3$ is applied to the gate electrodes of transistors 808 and 810 in the boosted potential detecting portion 81. The reference potential $V_{ref}4$ generated by reference potential generating circuit 58 may be applied to the gate electrodes of transistors 808 and 810. However, by providing the reference potential generating circuit 86 in this manner, the reference potential $V_{ref}3$ can be appropriately changed by changing the size of transistors 862 and 863.

Figure 54:
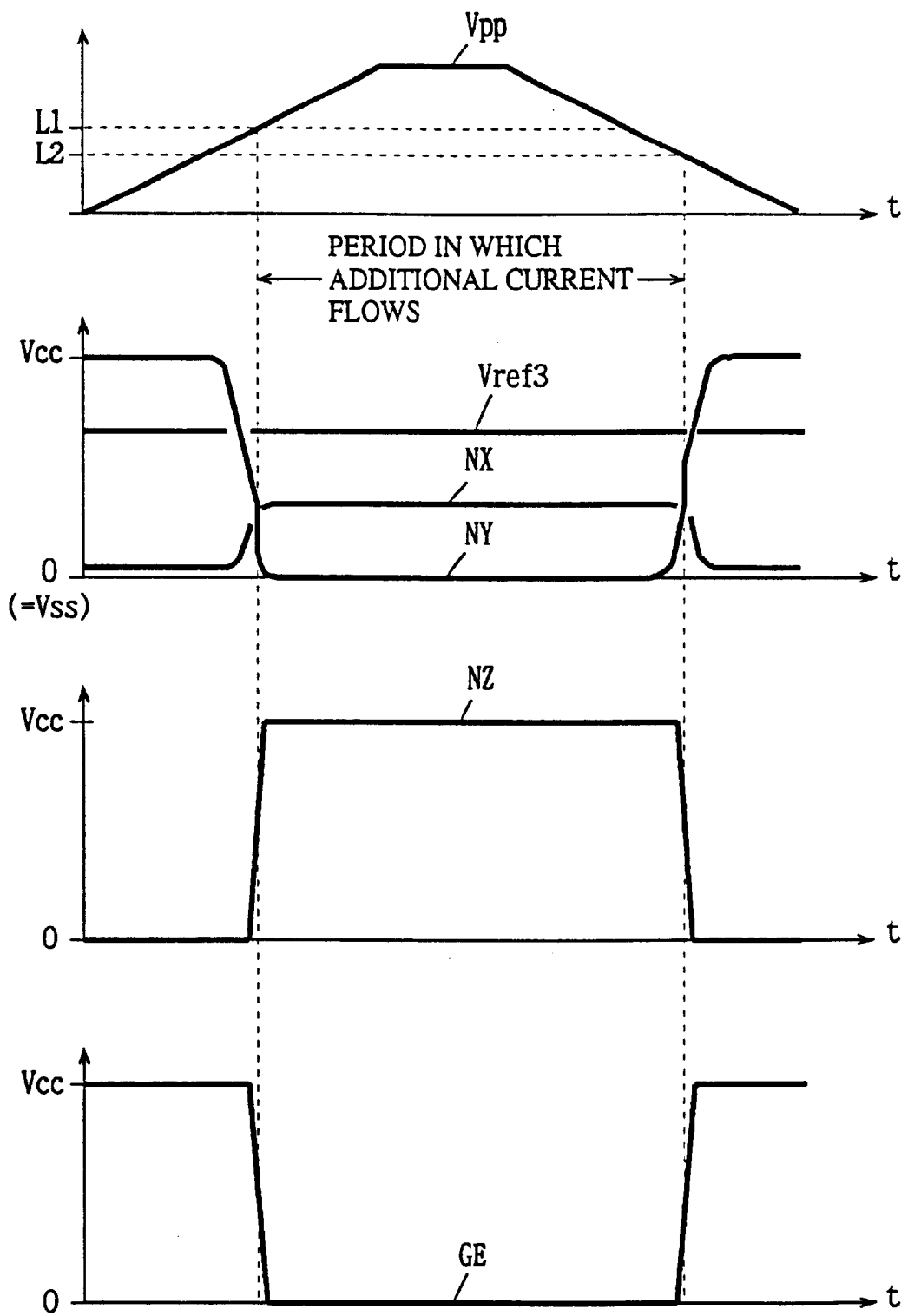
FIG. 54 is a diagram of waveforms showing the operation of the boosted potential detecting circuit shown in FIGS. 52 and 53.

FIG. 54 shows the manner of change of potentials at various nodes in the boosted potential detecting circuit shown in FIGS. 52 and 53, when the boosted potential $V_{pp}$ gradually rises and then gradually lowers. When the boosted potential $V_{pp}$ is not sufficiently high as shown in FIG. 54(a), transistor 815 in boosted potential detecting portion 81 is rendered conductive, and therefore the potential at node NX would be approximately equal to ground potential Vss.

When the boosted potential $V_{pp}$ rises and transistor 815 is rendered conductive, the potential at node NX rises to be higher than the ground potential Vss by the threshold voltage of transistor 815. Further, when the potential at node NY becomes lower than the potential at node NX, the potential at output node NZ in differential amplifying circuit 85 changes from the L level to the H level as shown in FIG. 54(c). Therefore, the enable signal GE changes from the H level to the L level as shown in FIG. 54(d).

While the enable signal GE is at the L level, an H level signal is applied to the gate electrode of transistor 818 in boosted potential detecting portion 81, and therefore, in addition to current for comparison $I_{cmp}$ flowing through transistor 816, additional current $I_{add}$ flows through transistor 818.

Thereafter, when the boosted potential gradually lowers as shown in FIG. 54(*a*), current for comparison $I_{cmp}$ gradually lowers, and therefore the potential at output node NY gradually rises. When the potential at output node NY becomes higher than the potential at node NX, the potential at output node NZ in differential amplifying circuit 85 changes from the H level to the L level as shown in FIG. 54(*c*). Therefore, the enable signal GE changes from the L level to the H level as shown in FIG. 54(*b*). Here, even when the boosted potential $V_{pp}$ lowers and current for comparison $I_{cmp}$ lower to be smaller than reference current $I_{ref}1$, the potential at output node NY does not attain to the H level, since there is the additional current $I_{add}$. The potential at output node NY attains to the H level when the sum of current for comparison $I_{cmp}$ and additional current $I_{add}$ becomes smaller than the reference current $I_{ref}1$ Therefore, there is hysterisis in the detection level of the boosted potential detecting circuit, as shown in FIG. 54(*a*). More specifically, the detection level L2 at which enable signal GE changes from the L level to the H level as the boosted potential $V_{pp}$ lowers, is lower than the detection level L1 at which enable signal GE changes from the H level to the L level, as the boosted potential $V_{pp}$ rises. Therefore, chattering is not generated in the enable signa GE.

[Embodiment 37]

Figure 55:
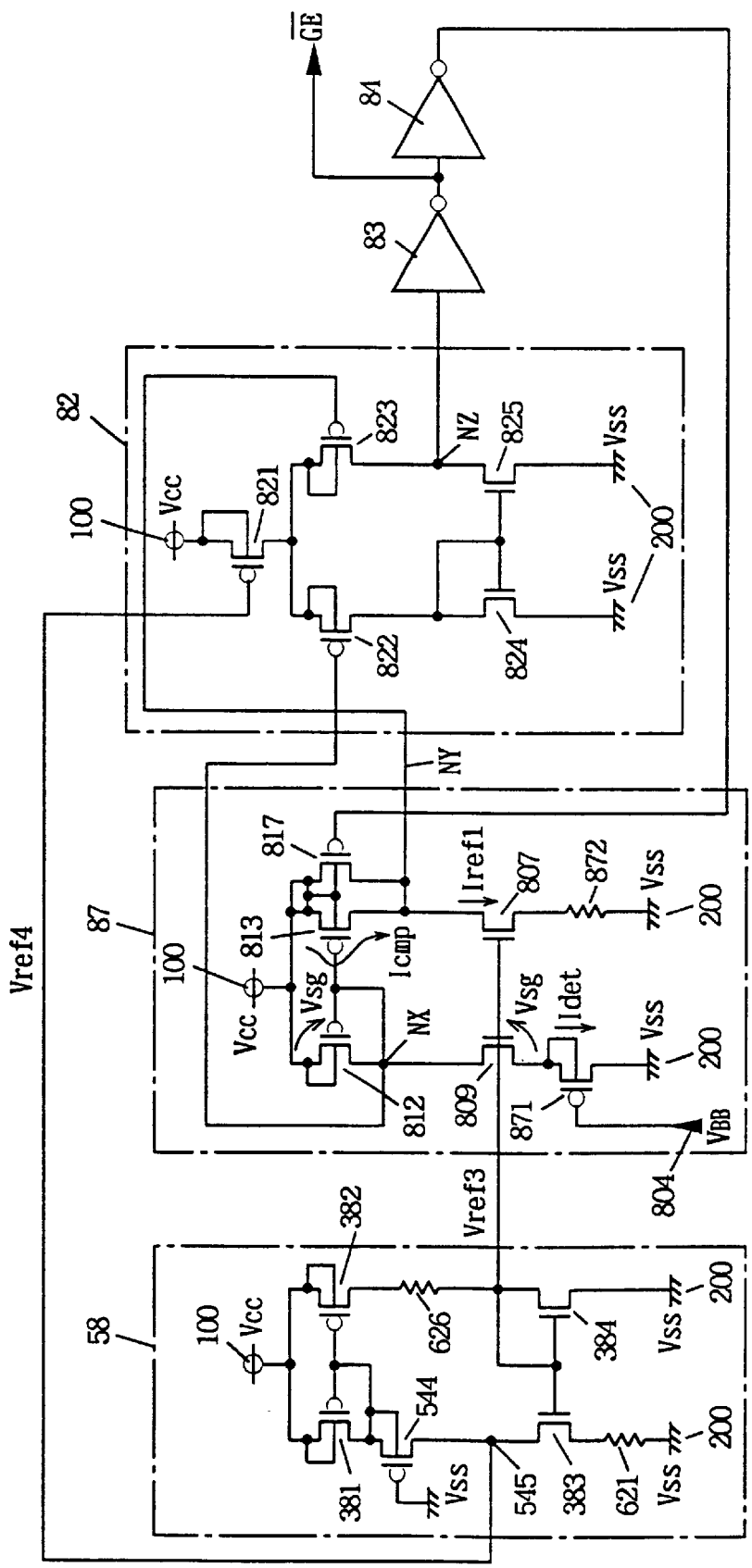
FIG. 55 is a schematic diagram showing a whole structure of a substrate potential detecting circuit in accordance with Embodiment 37 of the present invention.

FIG. 55 is a circuit diagram showing the whole structure of a substrate potential detecting circuit in accordance with Embodiment 37 of the present invention. Referring to FIG. 55, in substrate potential detecting portion 87 of Embodiment 37, a P channel MOS transistor 871 is provided in place of transistor 806 of substrate potential detecting portion 80 shown in FIG. 47. Transistor 871 is connected between source electrode of transistor 809 and ground node 200, and it has its gate electrode connected to detection node 804. Namely, transistor 871 is connected in source follower manner, to transistor 809.

In substrate potential detecting portion 87, when the substrate potential $V_{BB}$ applied to detection node 804 is not sufficiently low, detection current $I_{det}$ hardly flows through transistor 871, and therefore current for comparison $I_{cmp}$ becomes lower than the reference current $I_{ref}1$. Therefore, the potential at output node NY attains to the L level. Meanwhile, when the substrate portion $V_{BB}$ is sufficiently low, sufficient detection current $I_{det}$ flows through transistor 871, and therefore current for comparison $I_{cmp}$ becomes larger than reference current $I_{ref}1$. Therefore, the potential at output node NY attains to the H level.

According to Embodiment 37, since transistor 871 is connected in the source follower manner, input impedance becomes higher. Therefore, current hardly flows from the substrate potential generating circuit to the substrate potential detecting circuit.

[Embodiment 38]

Figure 56:
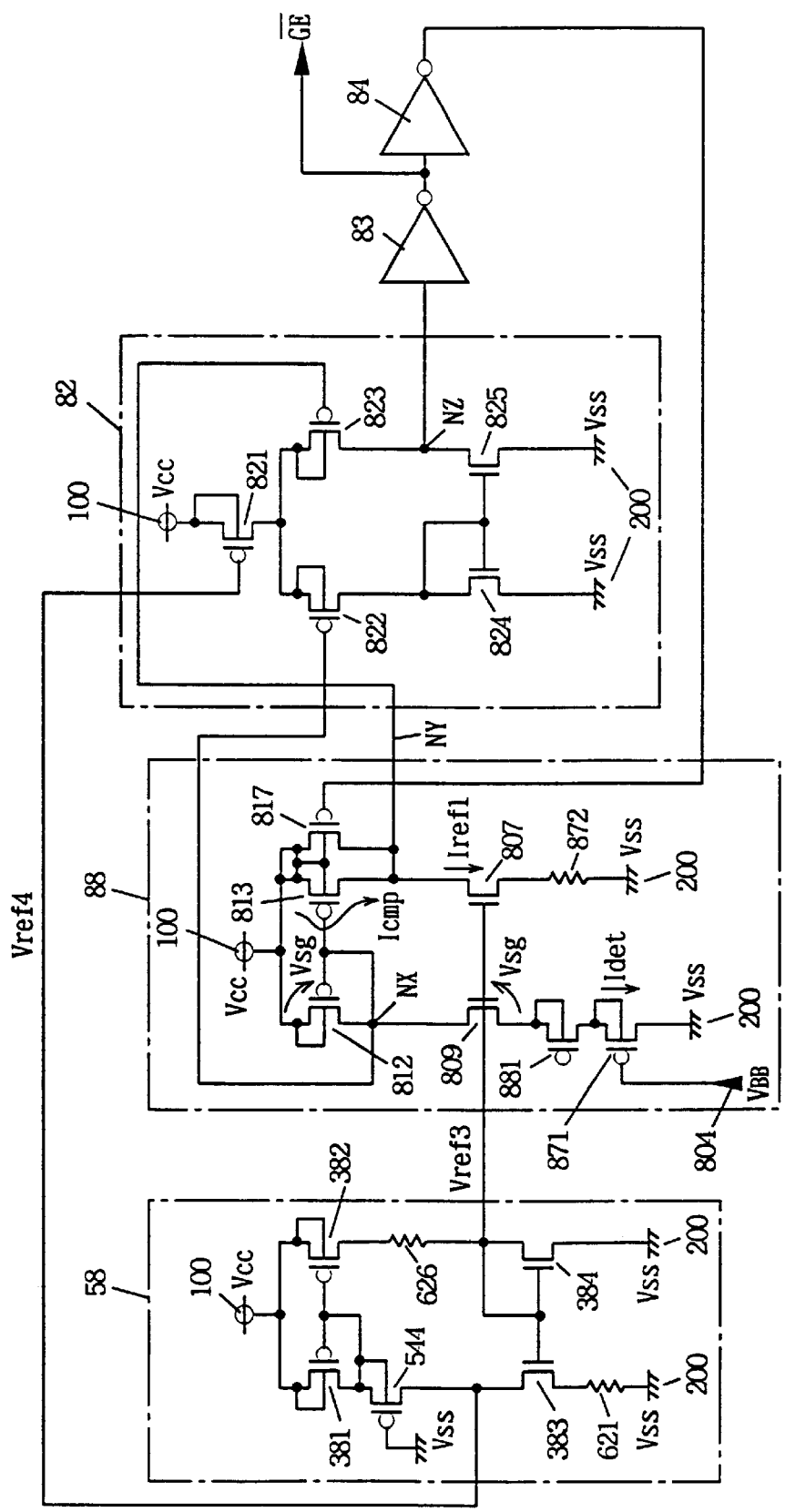
FIG. 56 is a schematic diagram showing a whole structure of a substrate potential detecting circuit in accordance with Embodiment 38 of the present invention.

FIG. 56 is a circuit diagram showing the whole structure of a substrate potential detecting circuit in accordance with Embodiment 38 of the present invention.

Referring to FIG. 56, substrate potential detecting portion 88 in Embodiment 38 includes, in addition to the structure of substrate potential detecting portion 87 shown in FIG. 55, a P channel MOS transistor 881. Transistor 881 is connected between the source electrode of transistor 809 and the source electrode of transistor 871, and has its gate electrode connected to detection node 804.

The internal potential detecting portion 88 operates approximately in the same manner as internal potential detecting portion 87 shown in FIG. 55. However, since transistor 881 is provided in internal potential detecting portion 88, the temperature dependency of voltage drop caused by drain resistance of transistor 881 is offset by the temperature dependency of the threshold voltage of transistor 809. Therefore, detection level of substrate potential detecting portion 88 does not fluctuates, even if operational temperature fluctuates.

[Embodiment 39]

Figure 57:
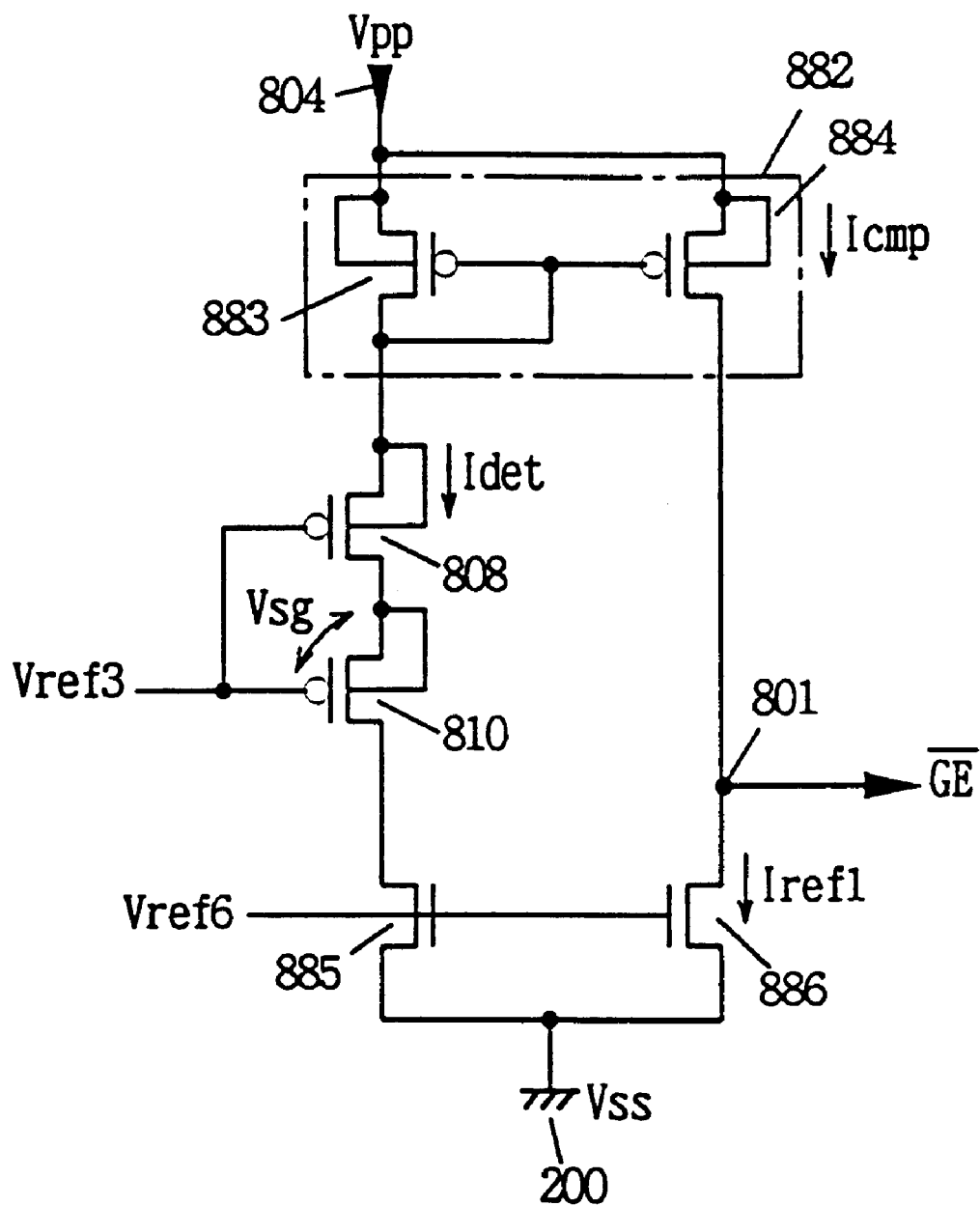
FIG. 57 is a schematic diagram showing a structure of a boosted potential detecting circuit in accordance with Embodiment 39 of the present invention.

FIG. 57 is a circuit diagram showing a structure of a boosted potential detecting circuit in accordance with Embodiment 39 of the present invention. Referring to FIG. 57, in Embodiment 39, a P channel current mirror circuit 882 is provided in place of N channel current mirror circuit 814. Further, an N channel MOS transistor 885 is connected between transistor 810 and ground node 200, and an N channel MOS transistor 886 is connected between output node 801 and ground node 200.

Current mirror circuit 882 includes a diode connected P channel MOS transistor 883, and a P channel MOS transistor 884 having its gate electrode connected to the gate electrode of transistor 883. A constant reference potential $V_{ref}6$ is applied to the gate electrodes of transistors 885 and 886. Therefore, transistors 885 and 886 both serve as constant current source. A constant reference current $I_{ref}1$ flows through transistor 886.

In the boosted potential detecting circuit, when the boosted potential $V_{pp}$ applied to detection node 804 is not sufficiently high, detection current $I_{det}$ hardly flows through transistor 808. Current mirror circuit 882 supplies a current for comparison $I_{cmp}$ which is approximately equal to the detection current $I_{det}$ to output node 801. Since current for comparison $I_{cmp}$ is smaller than reference current $I_{ref}1$, output node 801 is discharged, and hence an L level enable signal /GE is generated. In response to the L level enable signal /GE, the boosted potential generating circuit is activated.

Meanwhile, when the boosted potential $V_{pp}$ is sufficiently high, sufficient detection current $I_{det}$ flows through transistor 808, and current for comparison $I_{cmp}$ larger than reference current $I_{ref}1$ flows. Therefore, output node 801 is charged, and an H level enable signal /GE is generated. In response to the H level enable signal /GE, the boosted potential generating circuit is inactivated.

As is apparent from Embodiment 39, current mirror circuit may be provided not on the side of the ground node of output node 801, but on the side of detection node 804.

[Embodiment 40]

Figure 58:
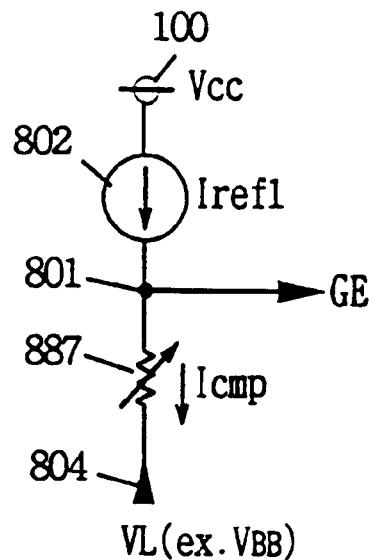
FIG. 58 is a schematic diagram showing a structure of an internal potential detecting circuit in accordance with Embodiment 40 of the present invention.

FIG. 58 is an illustration showing a structure of an internal potential detecting circuit in accordance with Embodiment 40 of the present invention. Referring to FIG. 58, in Embodiment 40, a variable resistance element 887 is provided in place of resistance element 803 shown in FIG. 34. The variable resistance element 887 is formed, for example, by a plurality of fixed resistance elements connected parallel to each other. In each fixed resistance element, fuse links are connected in series, and by blowing off any of the fuse links by means of laser beam, the resistance value can be appropriately changed. Switching elements may be connected in series with the fixed resistance elements, instead of the fuse links. In that case, the resistance value can be appropriately changed by switching on/off the switching elements in response to a prescribed control signal, similar to the blowing of the fuse links. Further, by controlling on/off of the switching elements by using a program element, on/off of the switching elements can be controlled arbitrarily even after the step of assembly. These methods may be similarly applied to other embodiment also.

In embodiment 40, since the value of resistance element 887 can be appropriately changed, the detection level of the internal potential detecting circuit can be set to a desired value.

[Embodiment 41]

Figure 59:
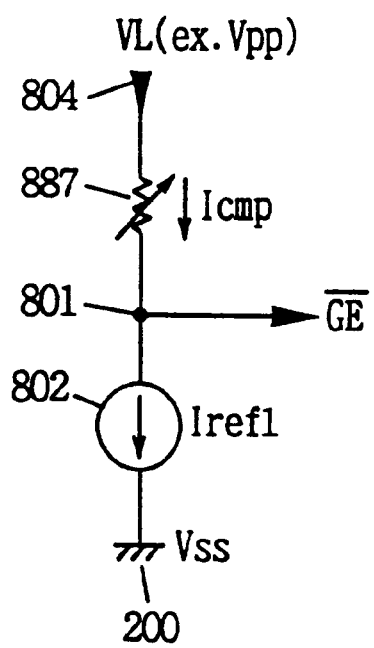
FIG. 59 is a schematic diagram showing a structure of an internal potential detecting circuit in accordance with Embodiment 41 of the present invention.

FIG. 59 is an illustration showing a structure of an internal potential detecting circuit in accordance with Embodiment 41 of the present invention. Referring to FIG. 59, in Embodiment 41, a variable resistance element 887 is provided instead of resistance element 803 shown in FIG. 36. The value of variable resistance element 887 can be appropriately changed as in Embodiment 40 above. Therefore, by appropriately changing the value of variable resistance element 887, the detection level of the internal potential detecting circuit can be set to a desired value.

[Embodiment 42]

Figure 60:
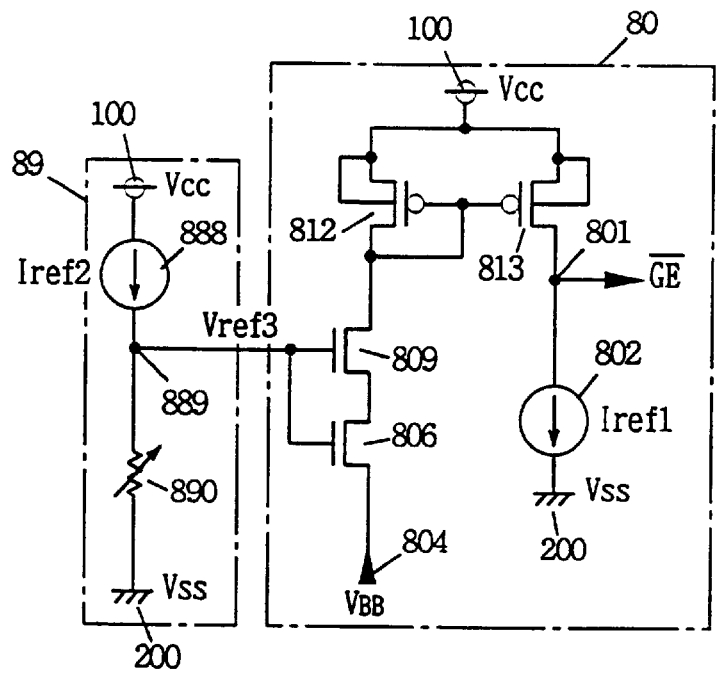
FIG. 60 is a schematic diagram showing a whole structure of a substrate potential detecting circuit in accordance with Embodiment 42 of the present invention.

FIG. 60 is an illustration showing a whole structure of a substrate potential detecting circuit in accordance with Embodiment 42 of the present invention. Referring to FIG. 60, the substrate potential detecting circuit includes, in addition to the substrate potential detecting portion 80 shown in FIG. 45, a reference potential generating circuit 89. Reference potential generating circuit 89 includes a variable resistance element 890, and a constant current source 880 for supplying a constant reference current $I_{ref}2$ to the resistance element 890. The value of variable resistance element 890 can be appropriately changed, as the variable resistance element 887 shown in FIGS. 58 and 59. Therefore, the reference potential $V_{ref}3$ generated at output node 889 of reference potential generating circuit 89 can be arbitrarily changed. Since the reference potential $V_{ref}3$ is applied to the gate electrodes of transistors 806 and 809 in internal potential detecting portion 80, the detection level of substrate potential detecting portion 80 can be changed to a desired value.

[Embodiment 43]

Figure 61:
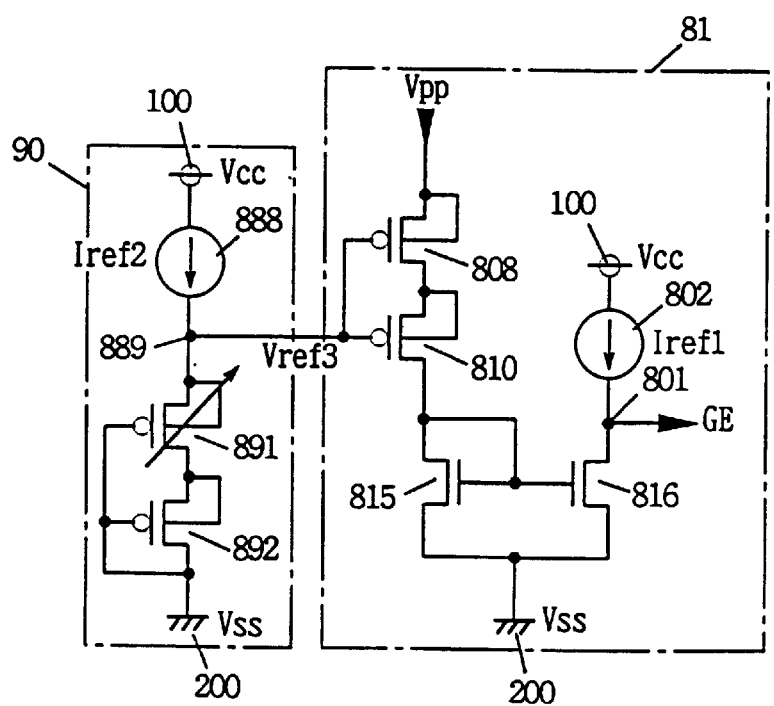
FIG. 61 is a schematic diagram showing a whole structure of a boosted potential detecting circuit in accordance with Embodiment 43 of the present invention.

FIG. 61 is an illustration showing a structure of a boosted potential detecting circuit in accordance with Embodiment 43 of the present invention. Referring to FIG. 61, the boosted potential detecting circuit includes, in addition to the boosted potential detecting portion 81 shown in FIG. 51, a reference potential generating circuit 90 for generating a reference potential $V_{ref}3$.

Reference potential generating circuit 90 includes P channel MOS transistors 891 and 892 connected in series, and a constant current source 88 for supplying a constant reference current $I_{ref}2$ to the transistors 891 and 892. Transistor 891 serves as a resistor, of which resistance value can be appropriately changed. Such transistor 891 may be formed by a plurality of P channel MOS transistors connected in parallel, and the resistance value thereof can be appropriately changed by blowing fuse links connected in series with each transistor by a laser beam. Transistor 892 is diode connected, and therefore the source potential of transistor 892 is set higher than the ground potential Vss by the threshold voltage of transistor 892.

According to Embodiment 43, by tuning the drain resistance of transistor 891, the reference potential $V_{ref}3$ generated at output node 889 can be arbitrarily changed. Since reference potential $V_{ref}3$ is applied to the gate electrodes of transistors 808 and 810 in boosted potential detecting portion 81, the detection level of boosted potential detection portion 81 can be changed to a desired value.

Instead of transistors 891 and 892 shown in FIG. 61, the variable resistance 890 shown in FIG. 60 may be used. In place of variable resistance element 890 shown in FIG. 60, transistors 891 and 892 shown in FIG. 61 may be used.

Further, by changing the number of diode connected transistors such as transistor 892, the reference potential $V_{ref}3$ may be changed.

[Embodiment 44]

Figure 62:
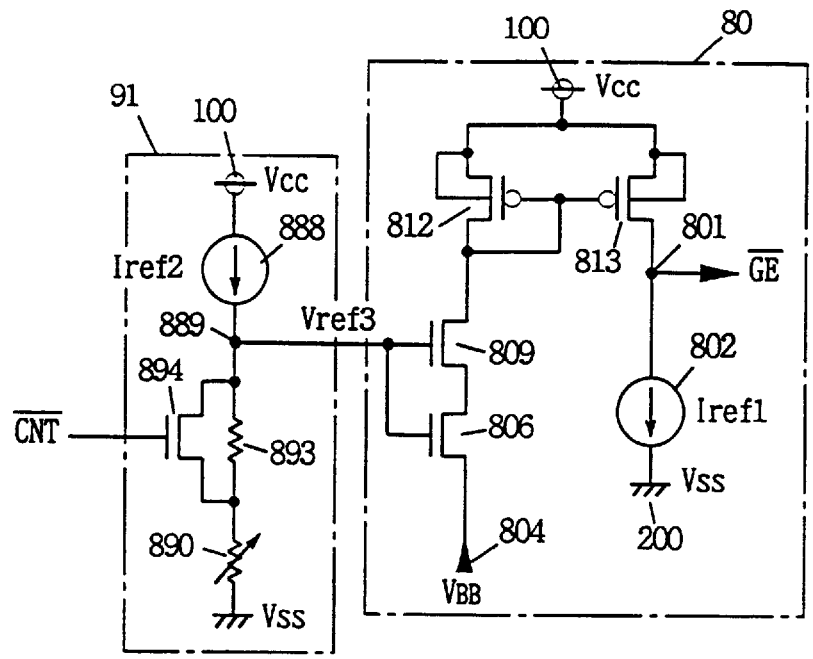
FIG. 62 is a schematic diagram showing a whole structure of a substrate potential detecting circuit in accordance with Embodiment 44 of the present invention.

FIG. 62 is a circuit diagram showing the whole structure of a substrate potential detecting circuit in accordance with Embodiment 44 of the present invention. Referring to FIG. 62, substrate potential generating circuit 91 in Embodiment 44 includes, in addition to the structure of reference potential generating circuit 89 shown in FIG. 60, a resistance element 893 and an N channel MOS transistor 894. Resistance element 893 is connected between output node 889 and variable resistance element 890. Transistor 894 is connected parallel to resistance element 893. A control signal /CNT is applied to the gate electrode of transistor 894.

Since an H level control signal CNT is applied in a normal mode, transistor 894 is rendered conductive. Therefore, substrate potential detecting circuit operates in the similar manner as that shown in FIG. 60.

Meanwhile, when an L level control signal /CNT is applied, transistor 894 is rendered non-conductive, and therefore resistance element 893 is added to variable resistance element 890. Consequently, reference potential $V_{ref}3$ rises, and detection level of internal potential detecting portion 80 becomes higher than in the normal mode. Accordingly, as the substrate potential generating circuit is controlled by such a substrate potential detecting circuit, substrate potential $V_{BB}$ which is shallower than in the normal mode is generated. When control signal /CNT returns to the H level, the substrate potential $V_{BB}$ generated by the substrate potential generating circuit returns to the original deep level.

[Embodiment 45]

Figure 63:
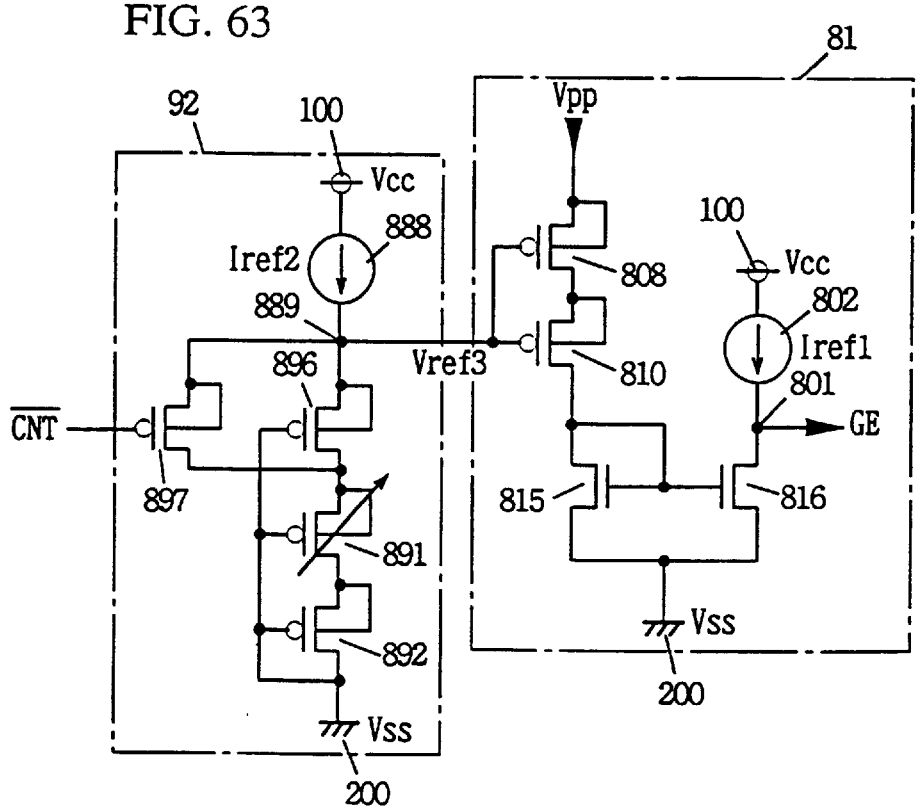
FIG. 63 is a schematic diagram showing a whole structure of a boosted potential detecting circuit in accordance with Embodiment 45 of the present invention.

FIG. 63 is a circuit diagram showing the whole structure of a boosted potential detecting circuit in accordance with Embodiment 45 of the present invention. Referring to FIG. 63, reference potential generating circuit 92 of Embodiment 45 includes, in addition to the structure of reference potential generating circuit 90 shown in FIG. 61, P channel MOS transistors 896 and 897. Transistor 896 is connected between output node 889 and transistor 891. Transistor 896 receives, at its gate electrode, the ground node potential Vss. Therefore, transistor 896 serves as a resistor. Transistor 897 is connected parallel to transistor 896. Control signal /CNT is applied to the gate electrode of transistor 897.

Since the H level control signal /CNT is applied in the normal mode, transistor 897 is kept non-conductive. Therefore, transistors 891 and 892 as well as transistor 896 serve as a resistor.

Meanwhile, when the L level control signal /CNT is applied, transistor 897 is rendered conductive, and therefore the source and the drain of transistor 896 is short-circuited. Accordingly, transistor 896 is substantially eliminated, and hence reference potential $V_{ref}3$ becomes lower than in the normal mode. Since the reference potential $V_{ref}3$ is applied to the gate electrodes of transistors 808 and 810 in boosted potential detecting portion 81, detection level of boosted potential detecting portion 81 becomes lower than in the normal mode. Therefore, when the boosted potential generating circuit is controlled by such a boosted potential detecting circuit, the boosted potential $V_{pp}$ generated by the boosted potential generating circuit also become lower. When control signal /CNT returns from the L level to the H level, the detection level of boosted potential detecting portion 81 returns to the original higher level. Therefore, the boosted potential $V_{pp}$ generated by the boosted potential generating circuit also attains to the original high value.

[Embodiment 46]

Figure 64:
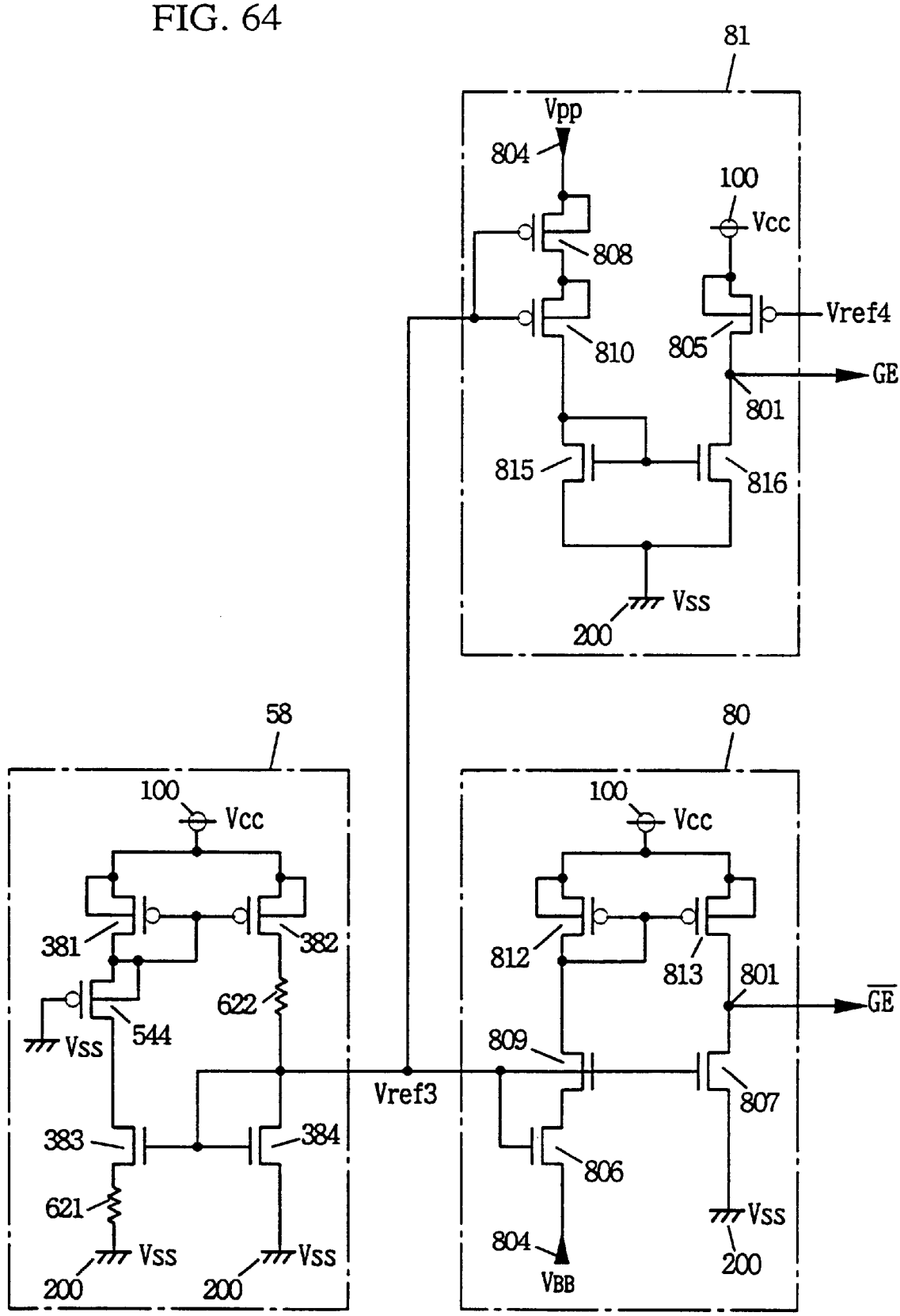
FIG. 64 is a schematic diagram showing a whole structure of an internal potential detecting circuit in accordance with Embodiment 46 of the present invention.

FIG. 64 is a circuit diagram showing a whole structure of an internal potential detecting circuit in accordance with Embodiment 46 of the present invention. Referring to FIG. 64, the internal potential detecting circuit includes substrate potential detecting portion 80 shown in FIG. 45, boosted potential detecting portion 81 shown in FIG. 51, and reference potential generating circuit 58 shown in FIG. 47. The reference potential $V_{ref}3$ generated by reference potential generating circuit 58 is applied to the gate electrodes of transistors 806, 807 and 809 of substrate potential detecting portion 80, as well as to the gate electrodes of transistors 808 and 810 of boosted potential detecting portion 81.

According to Embodiment 46, since internal potential detecting portion 80 and boosted potential detecting portion 81 share one reference potential generating circuit 58, the number of reference potential generating circuits can be reduced as compare with the example in which one reference potential generating circuit is provided for each of detecting portions 80 and 81. Consequently, layout area of the whole internal potential detecting circuit can be reduced.

[Embodiment 47]

Figure 65:
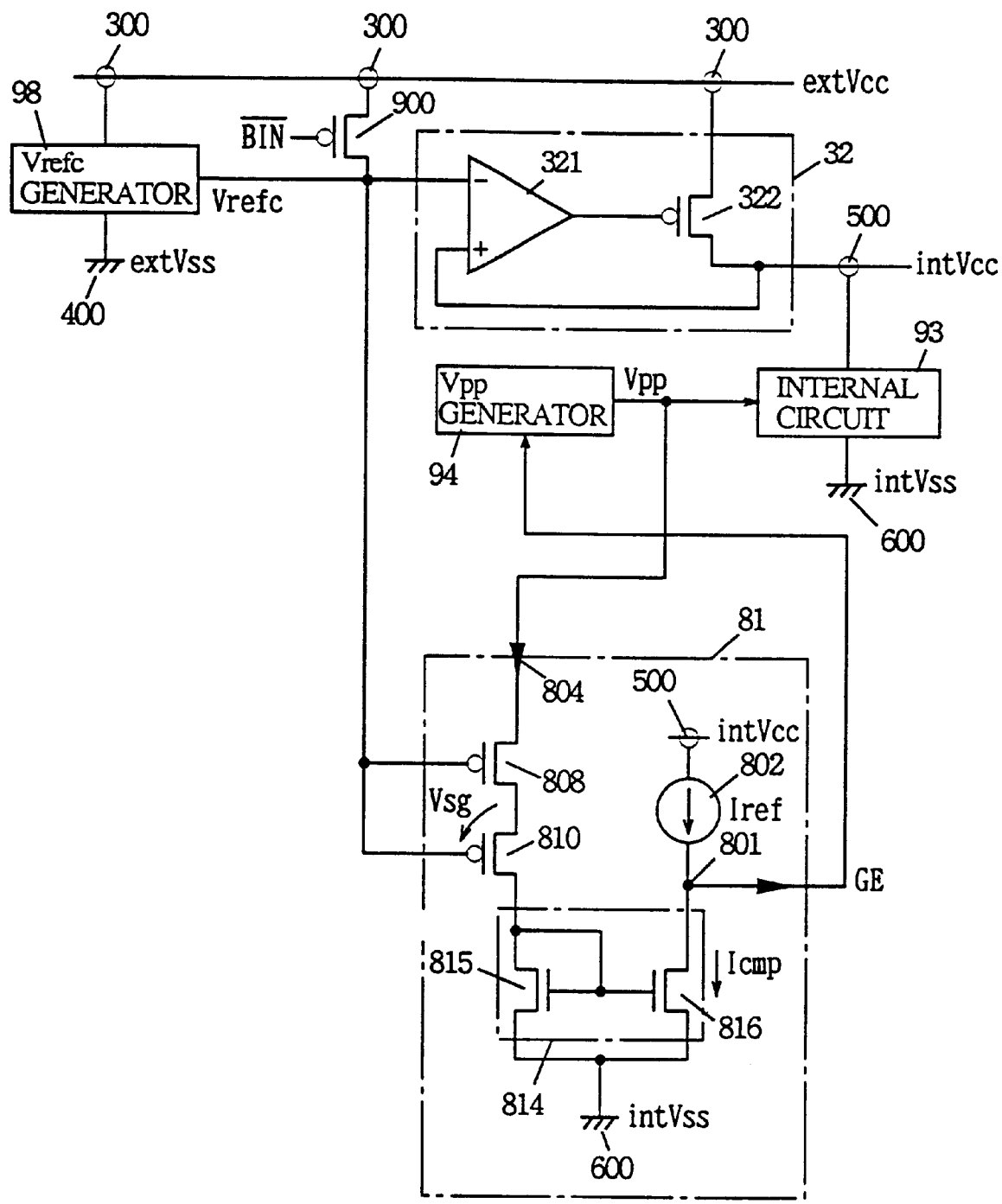
FIG. 65 is a block diagram showing a part of a DRAM in accordance with Embodiment 47 of the present invention.

FIG. 65 is a block diagram showing part of a DRAM in accordance with Embodiment 47 of the present invention. Referring to FIG. 65, the DRAM includes an internal circuit 93 including a word line driving circuit and so on, an internal potential generating circuit 94 for generating a boosted potential $V_{pp}$ and supplying the same to internal circuit 93, a voltage lowering circuit 32 for generating an internal power supply potential intVcc to be supplied to internal circuit 93 by lowering an external power supply potential extVcc, a reference potential generator 98 for generating a reference potential $V_{refc}$ for the voltage lowering circuit 32, and boosted potential detecting circuit 81 shown in FIG. 51.

Reference potential generator 98 is connected between an external power supply node 300 and an external ground node 400, and generates a prescribed reference potential $V_{refc}$. Voltage lowering circuit 32 lowers the external power supply potential extVcc to an internal power supply potential intVcc which is equal to the reference potential $V_{refc}$. Internal circuit 93 is connected between an internal power supply node 500 and an internal ground node 600 and performs prescribed operations. The boosted potential $V_{pp}$ generated by boosted potential generator 94 is supplied to internal circuitry 93 as well as to a detection node 804 of boosted potential detecting circuit 81. In internal circuit 93, the boosted potential $V_{pp}$ is used, for example, as a potential for driving a word line. The reference potential $V_{refc}$ generated by reference potential generator 98 is applied to the gate electrodes of transistors 808 and 810 in boosted potential detecting circuit 81. Therefore, the detection level of boosted potential generating circuit 81 is determined by reference potential $V_{rec}$. The enable signal GE from boosted potential detecting circuit 81 is supplied to the boosted potential generator 94. When the boosted potential $V_{pp}$ supplied to detection node 804 is lower than the detection level, an H level enable signal GE is generated, and in response, the boosted potential generator 94 is activated. When the boosted potential $V_{pp}$ attains the detection level, the enable signal GE changes from the H level to the L level, and the boosted potential generator 94 is inactivated.

In Embodiment 47, a P channel MOS transistor 900 is connected between external power supply node 300 and an output node of reference potential generator 98. A burn in signal /BIN is applied to the gate electrode of transistor 900. Since the burn in signal /BIN is at the H level in the normal mode, transistor 900 is kept non-conductive. Therefore, an internal power supply potential intVcc which is equal to the reference potential $V_{refc}$ generated by reference potential generator 98 is generated.

Meanwhile, in the burn in mode, an L level burn in signal /BIN is applied to the gate electrode of transistor 900. Here, burn in mode refers to a mode for acceleration test of internal circuit 93, in which a power supply voltage higher than usual is applied to the internal circuit 93. Accordingly, when the L level burn in signal /BIN is applied, transistor 900 is rendered conductive, and reference potential $V_{refc}$ is pulled to the external power supply potential extVcc. Since voltage lowering circuit 32 refers to the reference potential $V_{refc}$ which is equal to the external power supply potential extVcc, an internal power supply potential intVcc which is equal to the external power supply potential extVcc is generated. Accordingly, the external power supply potential extVcc is supplied to the internal circuit 93.

Figure 66:
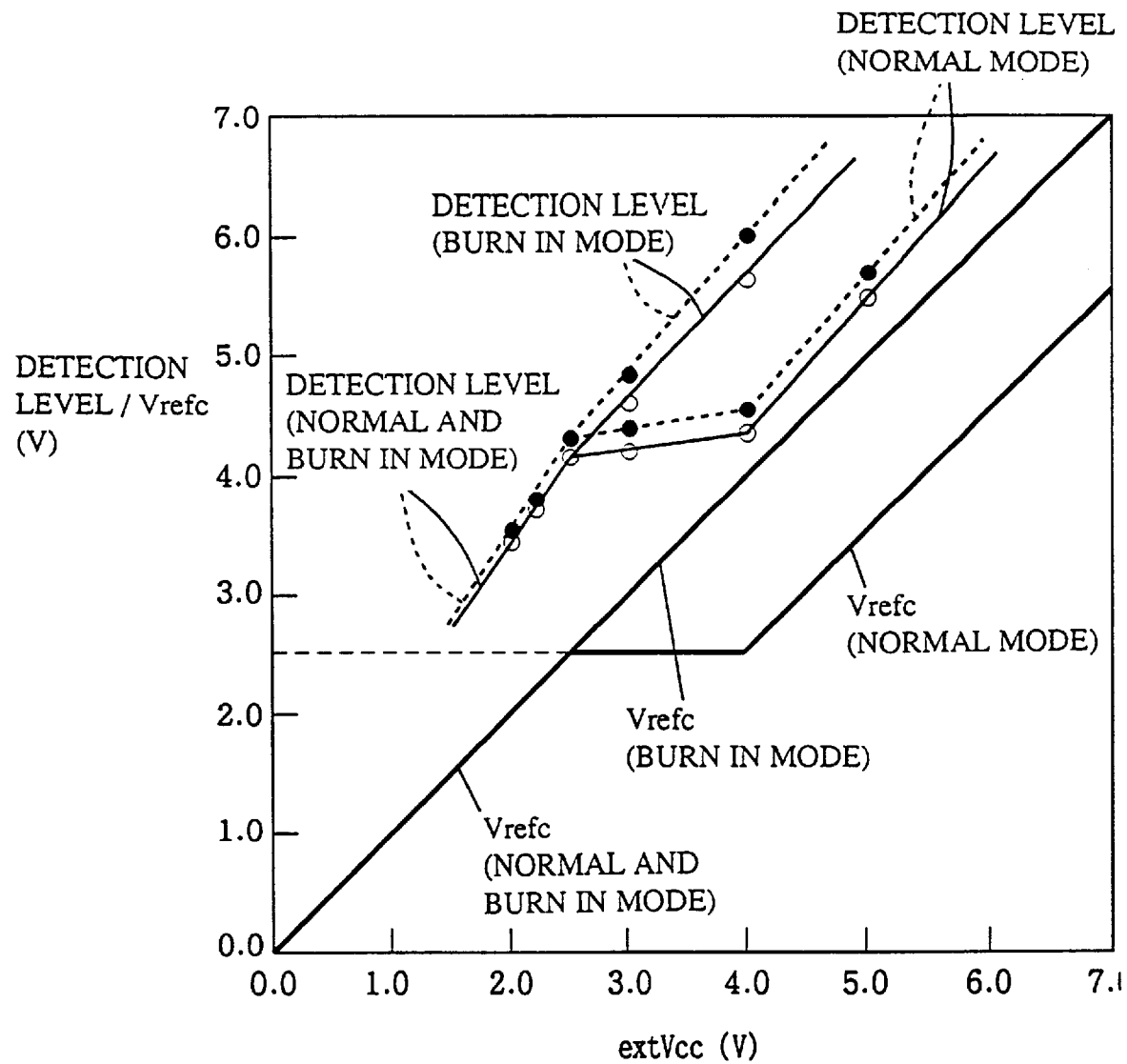
FIG. 66 is a graph showing relation between power supply potential, reference potential and detection level of a boosted potential detecting circuit in the DRAM shown in FIG. 65.

FIG. 66 is a graph showing the reference potential $V_{refc}$ and detection level of boosted potential detecting circuit 81 when external power supply potential extVcc rises from 0V to 7V. In the graph of FIG. 66, the detection level represented by the solid line is the detection level when the boosted potential $V_{pp}$ lowers, while the detection level represented by the dotted line is the detection level when the boosted potential $V_{pp}$ rises.

When an external power supply potential extVcc in the range of from 2.5 to 4.0V is applied, reference potential generator 98 generates a constant reference potential $V_{refc}$ (2.5V in this example). When the supplied external power supply potential extVcc is lower than 2.5V, reference potential generator 98 generates a reference potential $V_{refc}$ which is equal to the supplied external power supply potential extVcc, since it is incapable of generating a reference potential $V_{refc}$ which is higher than the supplied external power supply potential. Further, if the supplied external power supply potential extVcc is higher than 4V, reference potential generator 98 generates a reference potential $V_{refc}$ which is lower than the supplied external power supply potential extVcc by a prescribed voltage. Therefore, as shown in FIG. 66, while the external power supply potential extVcc rises from 0V to 2.5V, reference potential $V_{refc}$ rises along with the rise of the external power supply potential extVcc. In the normal mode, while the external power supply potential extVcc rises from 2.5V to 4V, reference potential $V_{refc}$ is kept constant. Further, when external power supply potential extVcc exceeds 4V, reference potential $V_{refc}$ rises again, while keeping a prescribed space from the supplied external power supply potential extVcc. Such a reference potential generator 98 is disclosed, for example, in Japanese Patent Laying-Open No. 4-263193.

Meanwhile, in the burn in mode, since an L level burn in signal /BIN is applied to the gate electrode of transistor 900, reference potential $V_{refc}$ becomes equal to the external power supply potential extVcc. Therefore, the reference potential $V_{refc}$ in the burn in mode rises along with the rise of external power supply potential extVcc in the burn in mode, as shown in FIG. 66.

Since the detection level of boosted potential detecting circuit 81 is determined based on the reference potential $V_{refc}$, the detection level becomes higher than the reference potential $V_{refc}$ by a prescribed voltage. More specifically, as shown in FIG. 66, the detection level in the normal mode rises with the rise of the external power supply potential extVcc until the external power supply potential extVcc attains 2.5V. When external power supply potential extVcc exceeds 2.5V, the detection level in the normal mode is kept constant. Then, when external power supply potential extVcc exceeds 4.0V, the detection level in the normal mode again rises along with the external power supply potential extVcc. Meanwhile, the detection level in the burn in mode rises with the external power supply potential extVcc.

In this manner, according to Embodiment 47, since the detection level of boosted potential detecting circuit 81 is also increased in the burn in mode, a boosted potential $V_{pp}$ which is higher than that of the normal mode is supplied to the internal circuit 93. Therefore, more accurate burn in test becomes possible.

[Embodiment 48]

Figure 67:
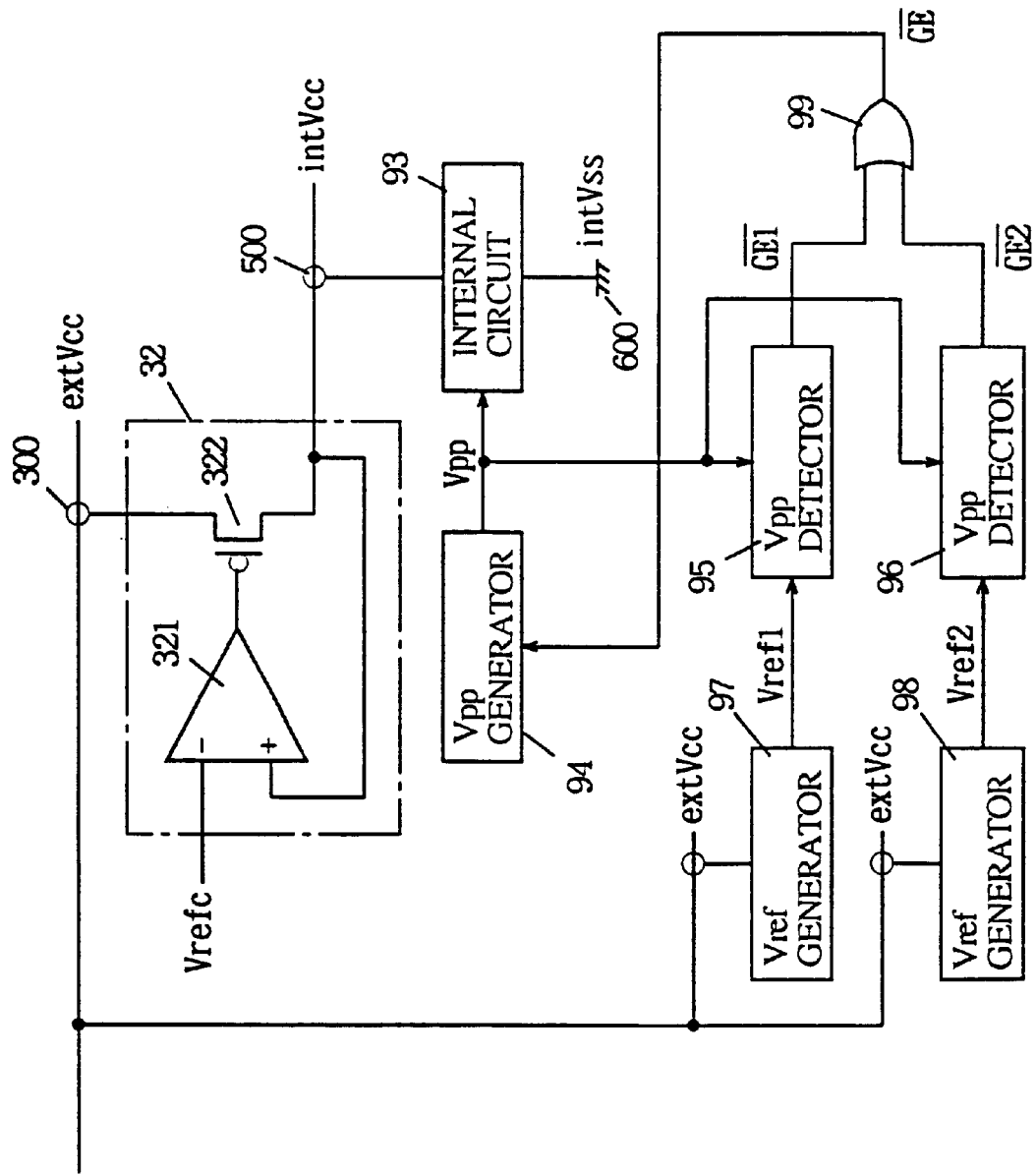
FIG. 67 is a block diagram showing a part of a DRAM in accordance with Embodiment 48 of the present invention.

FIG. 67 is a block diagram showing part of a DRAM in accordance with Embodiment 48 of the present invention. Referring to FIG. 67, different from FIG. 65, Embodiment 48 includes two reference potential generators 97 and 98, two boosted potential detectors 95 and 96, and an OR gate 99. Reference potential generator 97 generates a constant reference potential $V_{ref}1$ based on the external power supply potential extVcc. Reference potential generator 98 is the same as that shown in FIG. 65, and it generates a reference potential $V_{ref}2$ which has a prescribed relation with the external power supply potential extVcc, based on the external power supply potential extVcc.

Boosted potential detector 95 detects the boosted potential $V_{pp}$ in the similar manner as in the above described embodiments, and determines whether or not the detected boosted potential $V_{pp}$ has attained a prescribed detection level. When the boosted potential $V_{pp}$ has not yet attained the prescribed detection level, an L level enable signal /GE1 is generated. The detection level of boosted potential detector 95 is determined by reference potential $V_{ref}1$ generated by reference potential generator 97.

Another boosted potential detector 96 is also structured in the similar manner as the embodiments described above, and it detects a boosted potential $V_{pp}$ generated by boosted potential generator 94 and determines whether or not the detected boosted potential $V_{pp}$ has attained a prescribed detection level. When the boosted potential $V_{pp}$ has not yet attained the prescribed detection level, an L level enable signal GE2 is generated. The detection level of boosted potential detector 96 is determined by the reference potential $V_{ref}2$ generated by reference potential generator 98.

Enable signals /GE1 and /GE2 from boosted potential detectors 95 and 96 are both applied to OR gate 99, and OR gate 99 supplies an enable signal /GE to boosted potential generator 94. Boosted potential generator 94 is activated when the enable signal /GE is at the L level.

Figure 68:
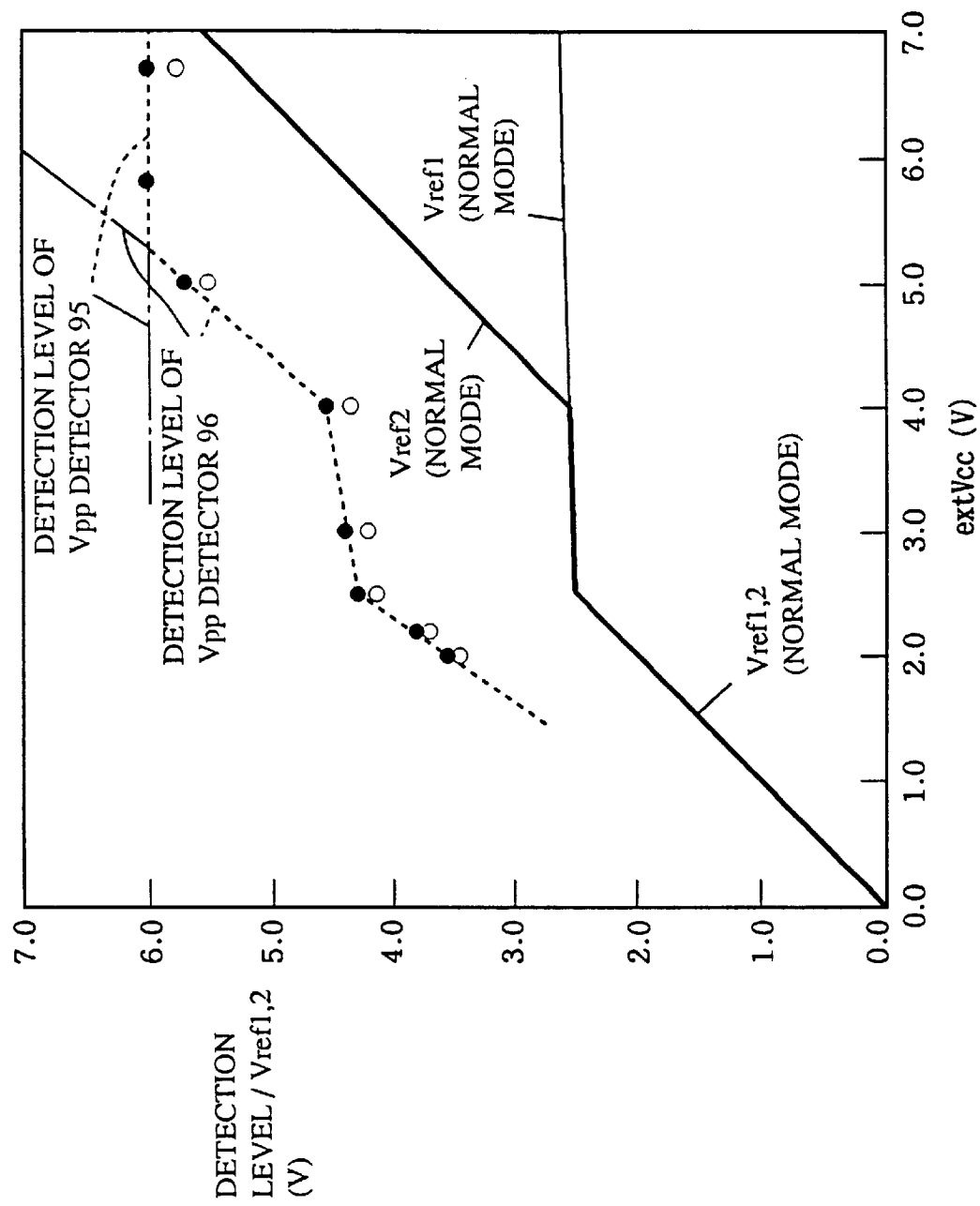
FIG. 68 is a graph showing two detection levels of two boosted potential detectors and relation between reference potentials therefor and external power supply potential, in the DRAM shown in FIG. 67.

FIG. 68 is a graph showing reference potentials $V_{ref}1$ and $V_{ref}2$ as well as the detection levels of respective detectors when external power supply potential extVcc rises. As shown in FIG. 68, when the supplied external power supply potential extVcc exceeds about 2.5V, reference potential $V_{ref}1$ is kept constant. Reference potential $V_{ref}2$ is kept constant when the supplied external power supply potential extVcc exceeds about 2.5V, and the reference potential rises again when the external potential exceeds 4V. Since the detection level of boosted potential detector 95 is determined based on the reference potential $V_{ref}1$, the detection level is also kept constant when the external power supply potential extVcc exceeds about 2.5V. Since detection level of boosted potential detector 96 is determined based on reference potential $V_{ref}2$, this detection level also is kept constant when external power supply potential extVcc exceeds about 2.5V, and rises again when the external potential exceeds 4V.

When the external power supply potential extVcc is about 3V and the boosted potential $V_{pp}$ is lower than the detection level of boosted potential detector 96, enable signals /GE1 and /GE2 both attain to the L level. Therefore, in response to the L level enable signal /GE, boosted potential generator 94 is activated. When the external power supply potential extVcc is about 3V, the boosted potential $V_{pp}$ is lower than the detection level of boosted potential detector 95 and higher than the detection level of boosted potential detector 96, then enable signal /GE1 attains to the L level and enable signal /GE2 attains to the H level. Consequently, enable signal /GE attains to the H level, and boosted potential generator 94 is inactivated.

When external power supply potential extVcc is about 6V and the boosted potential $V_{pp}$ is lower than the detection level of boosted potential detector 95, enable signals /GE1 and /GE2 both attain to the L level. Therefore, enable signal /GE attains to the L level, and boosted potential generator 94 is activated.

When the external power supply potential extVcc is about 6V, i.e., lower than the detection level of boosted potential detector 96 and higher than the detection level of boosted potential detector 95, then enable signal /GE1 attains to the H level and enable signal /GE2 attains to the L level. Therefore, enable signal /GE attains to the H level, and boosted potential generator 94 is inactivated.

In this manner, the detection levels of boosted potential detectors 95 and 96 have mutually different relations with external power supply potential extVcc. However, since enable signals /GE1 and /GE2 output therefrom are supplied through OR gate 99 to boosted potential generator 94 as the enable signal /GE, the boosted potential generator 94 is controlled by the detection level which is lower. Therefore, when the external power supply potential extVcc exceeds about 5.1V, the boosted potential $V_{pp}$ is clamped at about 6V. Embodiment 48 is especially useful when the boosted potential $V_{pp}$ is limited at a prescribed level.

[Embodiment 49]

Figure 69:
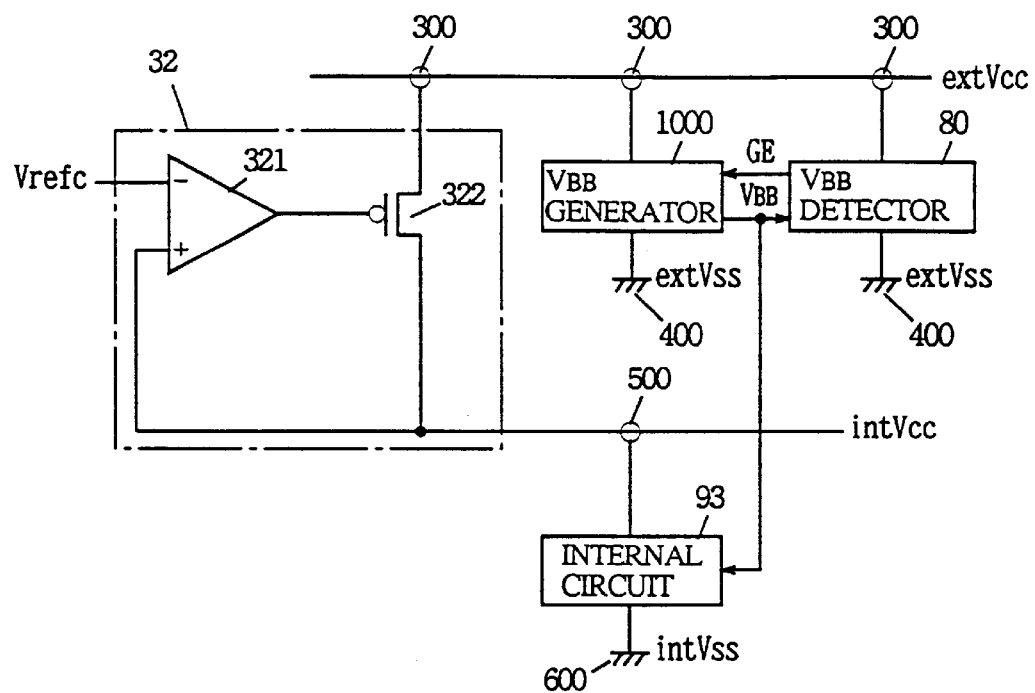
FIG. 69 is a block diagram showing a part of a DRAM in accordance with Embodiment 49 of the present invention.

FIG. 69 is a block diagram showing a part of a DRAM in accordance with Embodiment 49 of the present invention. Referring to FIG. 69, the DRAM includes an internal circuit 93 including a memory cell array, decoders, sense amplifiers and the like; a substrate potential generator 1000 for supplying a substrate potential $V_{BB}$ to transistors constituting the internal circuit 93; a substrate potential detector 80 controlling the substrate potential generator 1000; and a voltage lowering circuit 32 for generating an internal power supply potential intVcc based on the external power supply potential extVcc.

Internal circuit 93 is connected between internal power supply node 500 and internal ground node 600, and performs prescribed operations based on internal power supply potential intVcc. Substrate potential generator 1000 is connected between external power supply node 300 and external ground node 400, and generates a prescribed substrate potential $V_{BB}$. Substrate potential detector 80 has similar structure as that described in the embodiments above, and it detects substrate potential $V_{BB}$ and determines whether or not the detected substrate potential $V_{BB}$ has attained a prescribed detection level. When substrate potential $V_{BB}$ has not yet attained the prescribed detection level, substrate potential generator 1000 is activated in response to an enable signal GE from substrate potential detector 80. Consequently, a constant substrate potential $V_{BB}$ is supplied to internal circuit 93.

When internal circuitry 93 is in the standby state, a current for ensuring minimum operation of internal circuit 93 is supplied from voltage lowering circuit 32. More specifically, when internal circuit 93 is at the standby state, current supplying capability of voltage lowering circuit 32 is made lower.

When substrate potential $V_{BB}$ becomes shallower than the prescribed detection level while the internal circuit 93 is at the standby state, substrate potential generator 100 starts to operate. Generally, current consumption of substrate potential generating circuit 1000 is very large. However, since substrate potential generator 1000 is connected not to the internal power supply node 500 but to the external power supply node 300, the internal power supply potential intVcc never lowers, even when substrate potential generator 1000 operates.

[Embodiment 50]

Figure 70:
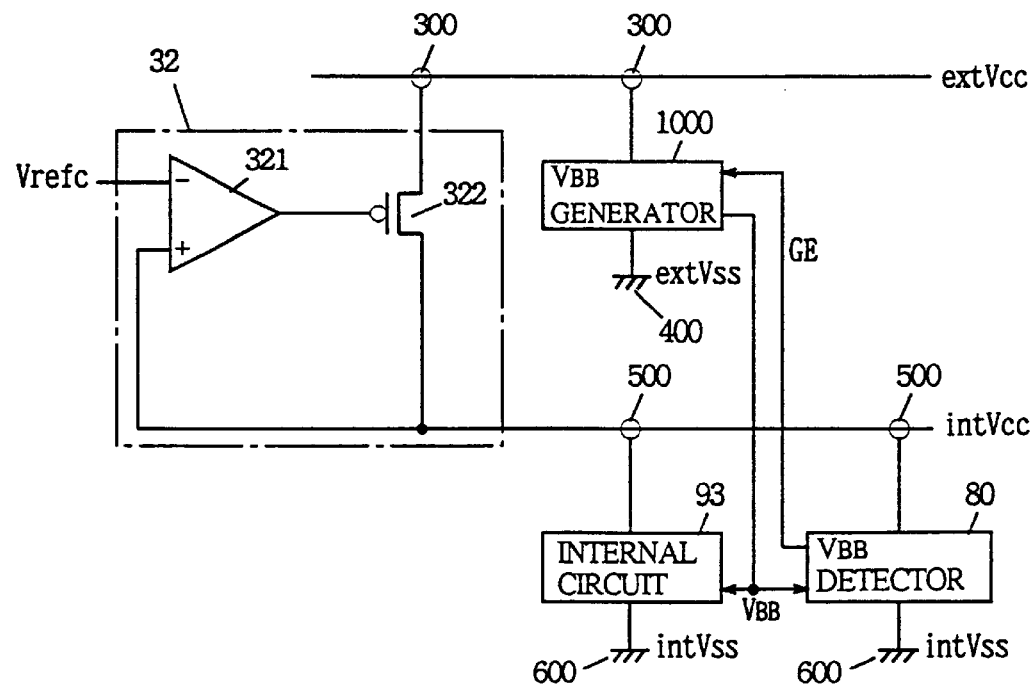
FIG. 70 is a block diagram showing a part of a DRAM in accordance with Embodiment 50 of the present invention.

FIG. 70 is a block diagram showing part of a DRAM in accordance with Embodiment 50 of the present invention. Referring to FIG. 70, different from FIG. 69, in Embodiment 50, substrate potential detector 80 is connected between internal power supply node 500 and internal ground node 600. According to Embodiment 50, even when substrate potential generator 1000 operates while internal circuit 93 is at the standby state, the internal power supply potential intVcc never lowers, since substrate potential generator 1000 is connected between external power supply node 300 and external ground node 400. As is apparent from Embodiment 50, what is necessary is that at least the substrate potential generator 1000 which consumes much current is connected to the external power supply node 300. The substrate potential detector 80 which does not consume much current may be connected to internal power supply node 500.

[Embodiment 51]

Figure 71:
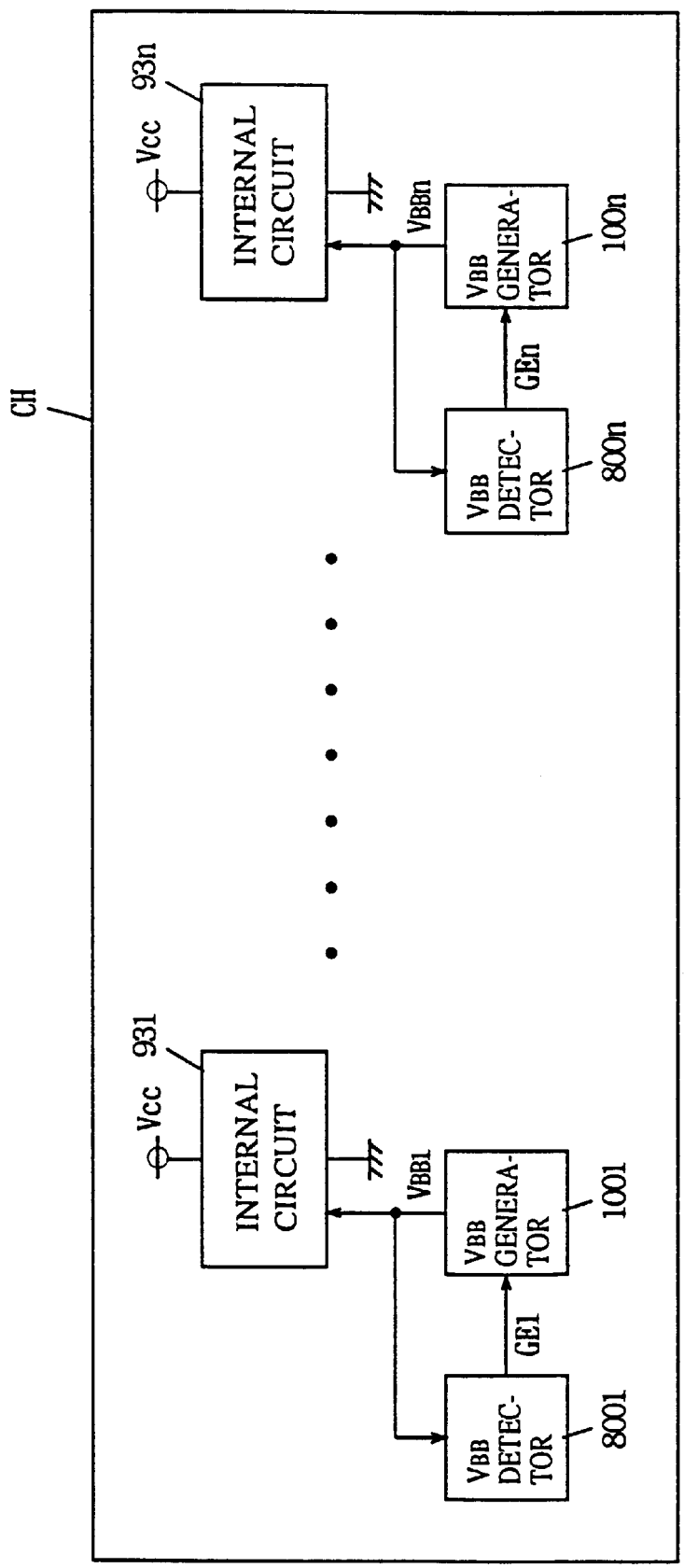
FIG. 71 is a block diagram showing a whole structure of a DRAM in accordance with Embodiment 51 of the present invention.

FIG. 71 is a block diagram showing a whole structure of a DRAM in accordance with Embodiment 51 of the present invention. Referring to FIG. 71, the DRAM includes a plurality of internal circuits 931–93n, substrate potential generators 1001–100n provided corresponding to the internal circuits, and a plurality of substrate potential detectors 8001 to 800n provided corresponding to the substrate potential generators. Internal circuits 931–93n, substrate potential generators 1001–100n and substrate potential detectors 8001–800n are formed on one semiconductor chip CH formed of silicon substrate, for example.

A negative substrate potential $V_{BB}1$ generated by substrate potential generator 1001 is applied to transistors constituting the internal circuit 931. The substrate potential $V_{BB}1$ is detected by substrate potential detector 8001. When the detected substrate potential $V_{BB}1$ is shallower than the detection level of substrate potential detecting circuit 8001, substrate potential generator 1001 is activated in response to an enable signal GE1 from substrate potential detector 8001. Therefore, a constant substrate potential $V_{BB}1$ is always applied to internal circuit 931. Operations of other internal circuits are the same as those of internal circuit 931. However, substrate potential detectors 8001 to 800n have mutually different detection levels. Every detection level may be different from each other, or some detection levels may be the same. More specifically, at least one detection level have to be different from other detection levels.

According to Embodiment 51, since detection levels of substrate potential detectors 8001–800n are different, different substrate potentials $V_{BB}1$ to $V_{BB}n$ are supplied to internal circuits 931 to 93n. Therefore, in an internal circuit to which a shallow substrate potential is applied, transistors constituting the internal circuit operates at high speed. Meanwhile, in an internal circuit to which a deep substrate potential is supplied, there is hardly a leak current flowing through the transistors constituting the internal circuit.

[Embodiment 52]

Figure 72:
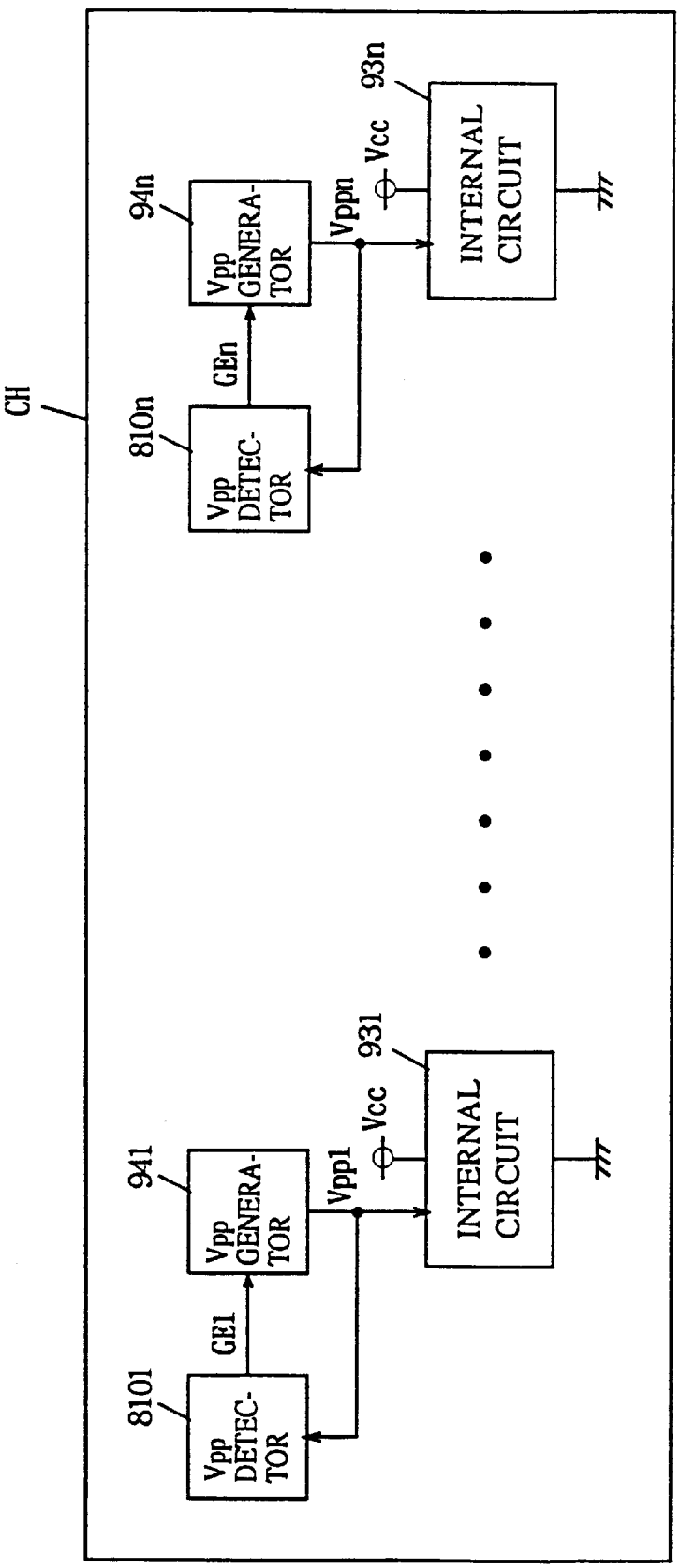
FIG. 72 is a block diagram showing a whole structure of a DRAM in accordance with Embodiment 52 of the present invention.

FIG. 72 is a block diagram showing a whole structure of a DRAM in accordance with Embodiment 52 of the present invention. Referring to FIG. 72, in the DRAM, boosted potential generators 941–94n are arranged in place of substrate potential generators 1001–100n of FIG. 71. In place of substrate potential detectors 8001–800n of FIG. 71, boosted potential detectors 8101–810n are arranged. Detection levels of boosted potential detectors 8101–810n are different from each other as in Embodiment 51. Accordingly, different boosted potentials $V_{pp}1$–$V_{pp}n$ are supplied to internal circuits 931–93n.

The boosted potential supplied to the internal circuit may be used as the substrate potential of P channel MOS transistor constituting the internal circuit, or it may be used as a power supply in the internal circuit.

When the boosted potential is supplied as the substrate potential to a P channel MOS transistor, the P channel MOS transistor constituting the internal circuit operates at high speed when the internal circuit is provided with low boosted potential. Meanwhile, in an internal circuit to which high boosted potential is applied, there is hardly a leak current flowing through the P channel MOS transistor constituting the internal circuit.

When the boosted potential is supplied as the power supply in the internal circuit, in the internal circuit to which high boosted potential is supplied, the transistors constituting the internal circuit operate at high speed. The boosted potential supplied to the internal circuit may be used as the power supply in the entire internal circuit. However, it should preferably used as the power supply at a part of the internal circuit. This is because the supplying capability of boosted potential generators 941 to 94n is generally not so large.

[Embodiment 53]

Figure 73:
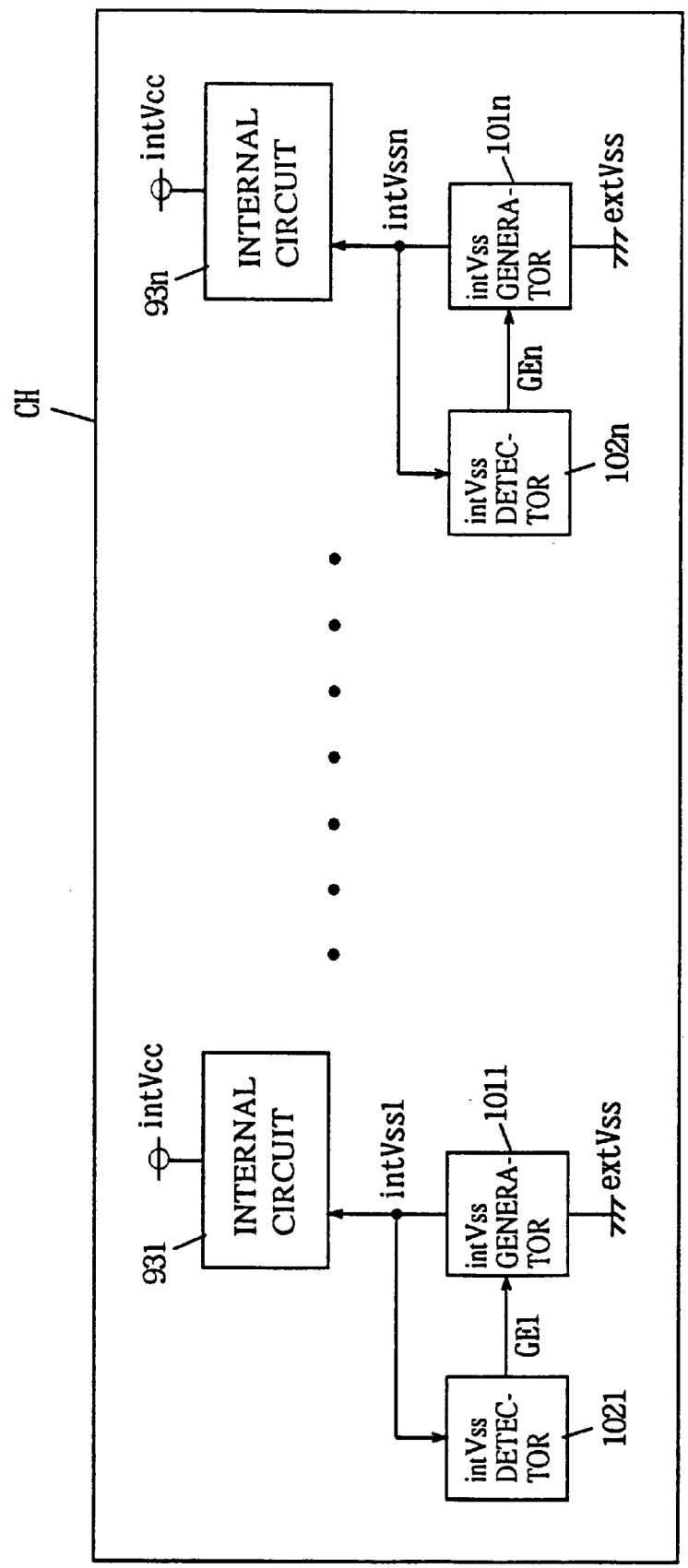
FIG. 73 is a block diagram showing a whole structure of a DRAM in accordance with Embodiment 53 of the present invention.

FIG. 73 is a block diagram showing a whole structure of a DRAM in accordance with Embodiment 53 of the present invention. Referring to FIG. 73, different from FIG. 71, in Embodiment 53, internal ground potential generators 1011 to 101n are arranged in place of substrate potential generators 1001–100n. In place of substrate potential detectors 8001 to 800n of FIG. 71, internal power supply potential detectors 1021–102n are arranged. Detection levels of internal ground potential detectors 1021 to 102n are different from each other. Therefore, mutually different internal ground potentials intVss1 to intVssn are supplied to internal circuits 931 to 93n.

[Embodiment 54]

Figure 74:
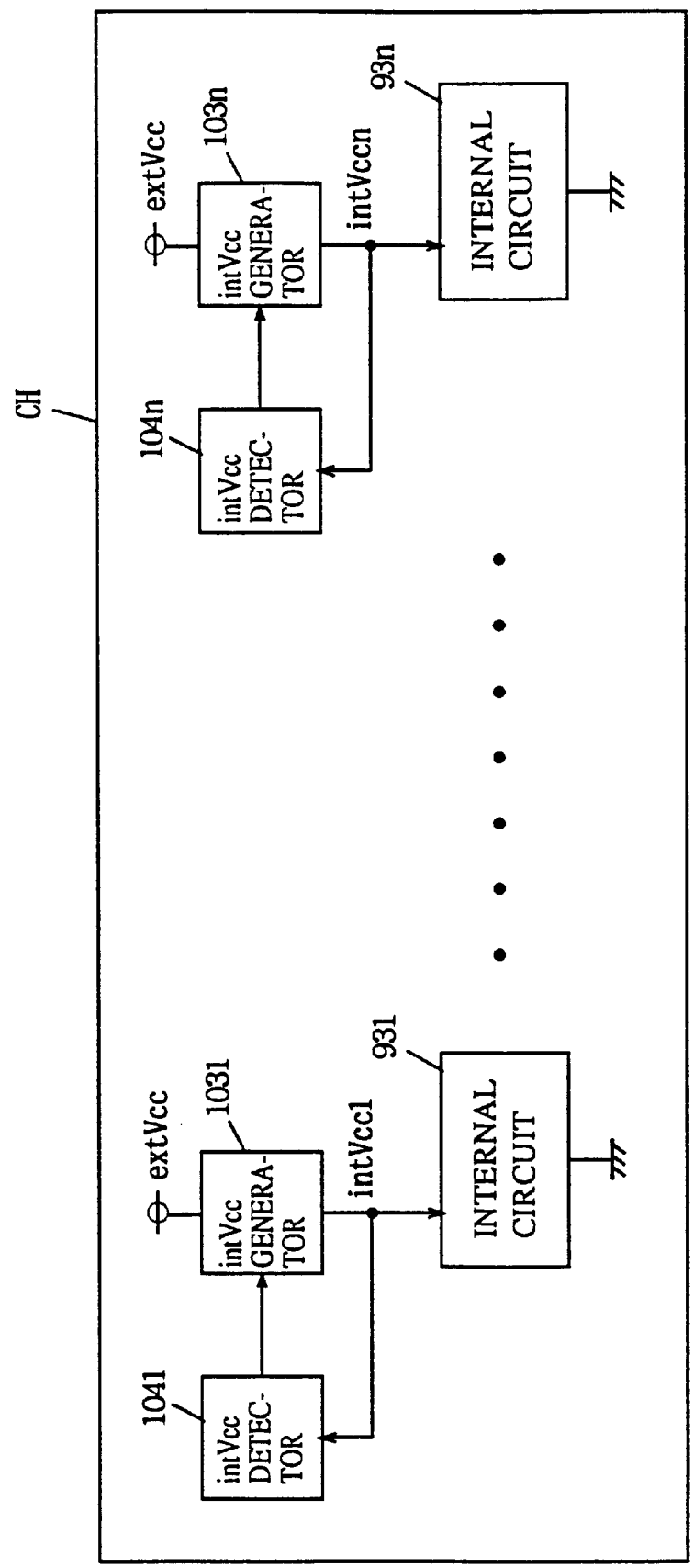
FIG. 74 is a block diagram showing a whole structure of a DRAM in accordance with Embodiment 54 of the present invention.

FIG. 74 is a block diagram showing a whole structure of a DRAM in accordance with Embodiment 54 of the present invention. Referring to FIG. 74, different from FIG. 71, in Embodiment 53, internal power supply potential generators 1031–103n are arranged in place of substrate potential generators 1001–100n. In place of substrate potential detectors 8001–800n of FIG. 71, internal power supply potential detectors 1041 to 104n are arranged. Detection levels of internal power supply potential detectors 1041–104n are different from each other. Therefore, mutually different internal power supply potentials intVcc1 to intVccn are supplied to internal circuits 931 to 93n.

As is apparent from Embodiments 53 and 54 described above, the internal potential supplied to internal circuits 931 to 93n includes substrate potential, boosted potential, internal ground potential and internal power supply potential. It is possible to combine Embodiment 53 of FIG. 73 with Embodiment 54 of FIG. 74. More specifically, a plurality of internal power supply potential generators 1031–103n and internal power supply potential detectors 1041–104n may be arranged corresponding to internal circuits 931 to 93n, as well as a plurality of internal ground potential generators 1011 to 101n and internal ground potential detectors 1021 to 102n.

[Embodiment 55]

Figure 75:
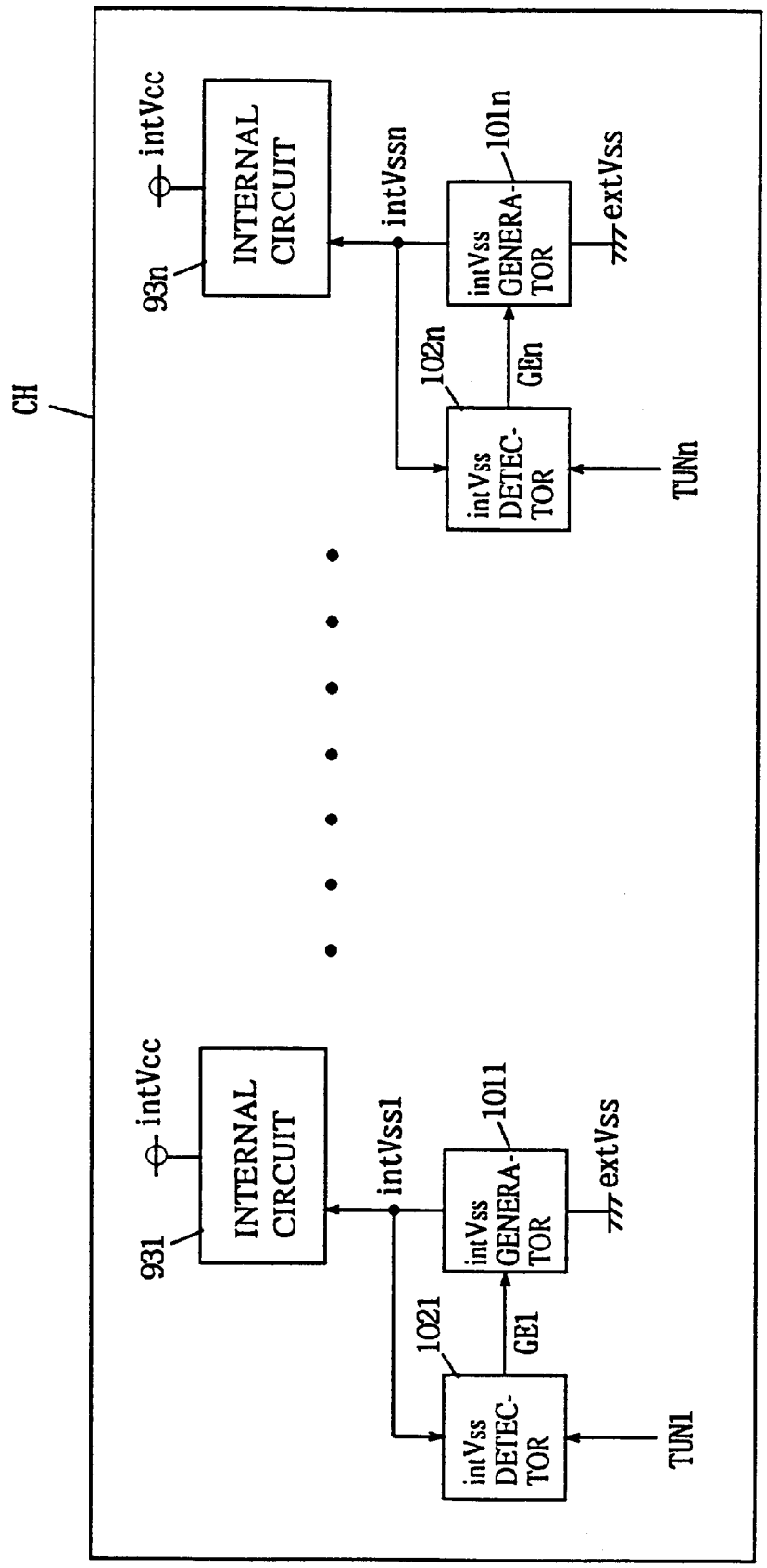
FIG. 75 is a block diagram showing a whole structure of a DRAM in accordance with Embodiment 55 of the present invention.

FIG. 75 is a block diagram showing a whole structure of a DRAM in accordance with Embodiment 55 of the present invention. Referring to FIG. 75, different from FIG. 73, in Embodiment 55, tuning signals TUN1 to TUNn are respectively supplied to internal ground potential detectors 1021–102n. Detection levels of internal ground potential detectors 1021–102n change in response to tuning signals TUN1 to TUNn. Therefore, detection levels of internal ground potential detectors 1021 to 102n may be appropriately tuned. Further, tuning may be carried out independently in each of the internal ground potential detectors. Further, one tuning signal may be applied to several internal ground potential detectors, so that detection levels of the internal ground potential detectors are set at the same value.

[Embodiment 56]

Figure 76:
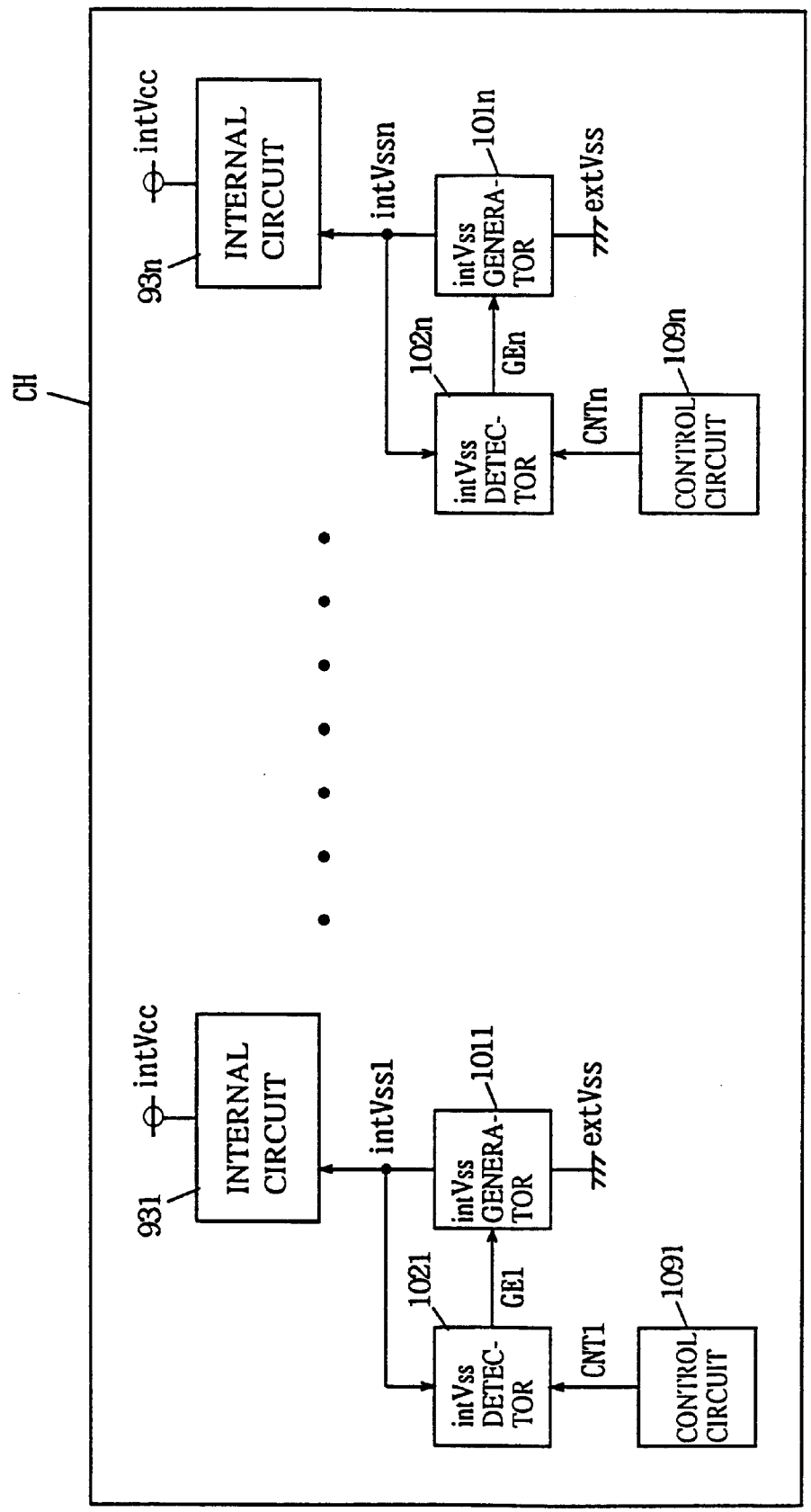
FIG. 76 is a block diagram showing a whole structure of a DRAM in accordance with Embodiment 56 of the present invention.

FIG. 76 is a block diagram showing a whole structure of a DRAM in accordance with Embodiment 56 of the present invention. Referring to FIG. 76, the DRAM includes, in addition to the structure shown in FIG. 73, a plurality of control circuits 1091 to 109n. The control circuits are provided for internal ground potential detectors 1021 to 102n, respectively. Control signals CNT1 to CNTn which change with time are supplied to internal ground potential detectors 1021 to 102n from control circuits 1091 to 109n. Control circuits 1091–109n may be controlled by a signal applied externally to the semiconductor chip CH, or alternatively, it may be controlled by operational temperature or an external power supply potential. When control circuit is controlled by operational temperature, it may be adapted that when the operational temperature exceeds a prescribed level, a control signal is applied to the internal ground potential detector, and in response to the control signal, detection level of the internal ground potential detector changes. When the control circuit is controlled by the external powers supply potential, it may be adapted such that when the external power supply potential exceeds a prescribed level, a control signal is applied from the control circuit to the internal ground potential detector, and in response to the control signal, detection level of the internal ground potential detector changes. Further, change of the detection level may be performed independently in each internal ground potential detector, or it may be performed collectively in several internal ground potential detectors.

[Embodiment 57]

Figure 77:
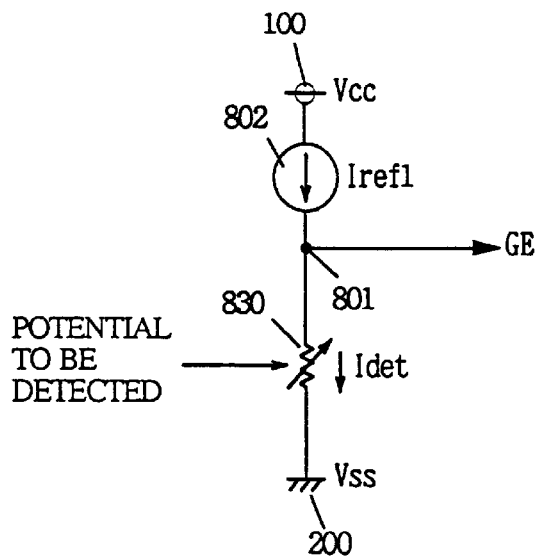
FIG. 77 is a schematic diagram showing principle of an internal potential detecting circuit in accordance with Embodiment 57 of the present invention.

FIG. 77 is an illustration showing a principle of the internal potential detecting circuit in accordance with Embodiment 57 of the present invention.

Referring to FIG. 77, the internal potential detecting circuit includes an output node 801, a constant current source 802 for supplying a constant reference current $I_{ref}1$ to output node 801, and a resistance element 830 connected between output node 801 and ground node 200 and having its resistance value changed in response to a potential to be detected. Here, resistance element 830 has its resistance value increased as the detected potential lowers. Accordingly, the detection current $I_{det}$ flowing through resistance element 830 decreases. Consequently, output node 801 is charged and an H level enable signal GE is generated.

Figure 78:
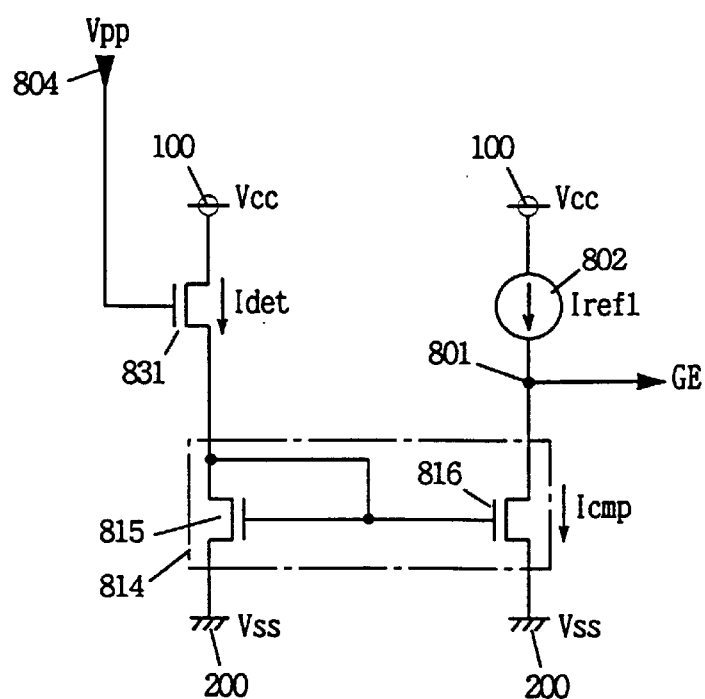
FIG. 78 is a schematic diagram showing a specific structure of the internal potential detecting circuit shown in FIG. 77.

FIG. 78 is a circuit diagram showing a specific structure of the internal potential detecting circuit shown in FIG. 77. Here, the resistance element 830 of FIG. 77 is formed by an N channel MOS transistor 831, of which gate electrode is connected to detection node 804. A boosted potential $V_{pp}$ is applied to detection node 804. A current mirror circuit 814 is provided in the internal potential detecting circuit. The current mirror circuit 814 includes a diode connected N channel MOS transistor 815, and an N channel MOS transistor 816 having its gate electrode connected to the gate electrode of transistor 815. More specifically, in the internal potential detecting circuit shown in FIG. 78, what is provided from output node 801 is not the detection current $I_{det}$ itself, but the current for comparison $I_{cmp}$, which is equal to the detection current $I_{det}$, generated by current mirror circuit 814.

In the internal potential detecting circuit in accordance with Embodiment 57, when the boosted potential $V_{pp}$ applied to detection node 804 lowers, conduction resistance of transistor 831 is increased, and the detection current $I_{det}$ flowing through transistor 831 decreases. Therefore, current for comparison $I_{cmp}$ generated by current mirror circuit 814 also decreases as the detection current $I_{det}$. I this manner, when the boosted potential $V_{pp}$ decreases to be lower than the prescribed detection level, current for comparison $I_{cmp}$ becomes smaller than the reference current $I_{ref}1$, hence an H level enable signal GE is generated at output node 801, and in response to the H level enable signal GE, a boosted potential generating circuit (not shown) is activated.

By the internal potential detecting circuit in accordance with Embodiment 57, whether or not the boosted potential $V_{pp}$ has attained the prescribed level is determined. Further, since constant reference current $I_{ref}1$ is supplied to output node 801 even when power supply potential Vcc fluctuates, the detection level of internal potential detecting circuit does not fluctuate. Therefore, when the boosted potential generating circuit is controlled by using the internal potential detecting circuit, a constant boosted potential $V_{pp}$ which is not dependent on the fluctuation of power supply potential Vcc can be obtained.

[Embodiment 58]

Figure 79:
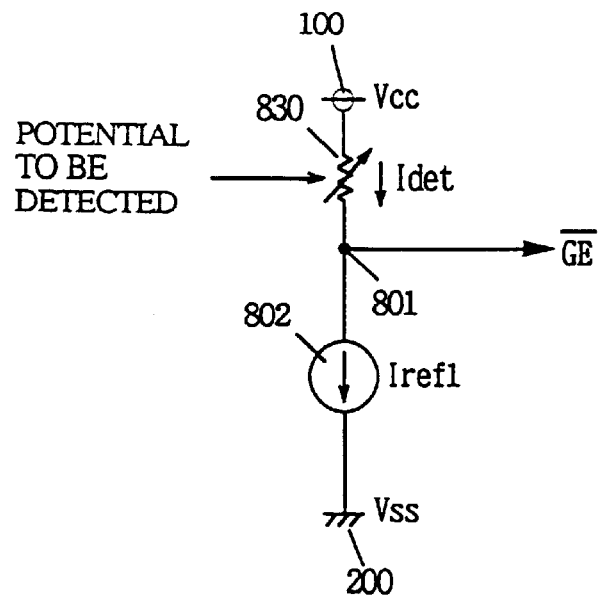
FIG. 79 is an illustration showing principle of an internal potential detecting circuit in accordance with Embodiment 58 of the present invention.

FIG. 79 is an illustration showing a principal of an internal potential detecting circuit in accordance with Embodiment 58 of the present invention. Referring to FIG. 79, the internal potential detecting circuit includes an output node 801, a constant current source 802 for supplying a constant reference current $(-I_{ref}1)$ to output node 801, and a resistance element 830 connected between power supply node 100 and output node 801 of which resistance value is changed in response to the potential to be detected.

Figure 80:
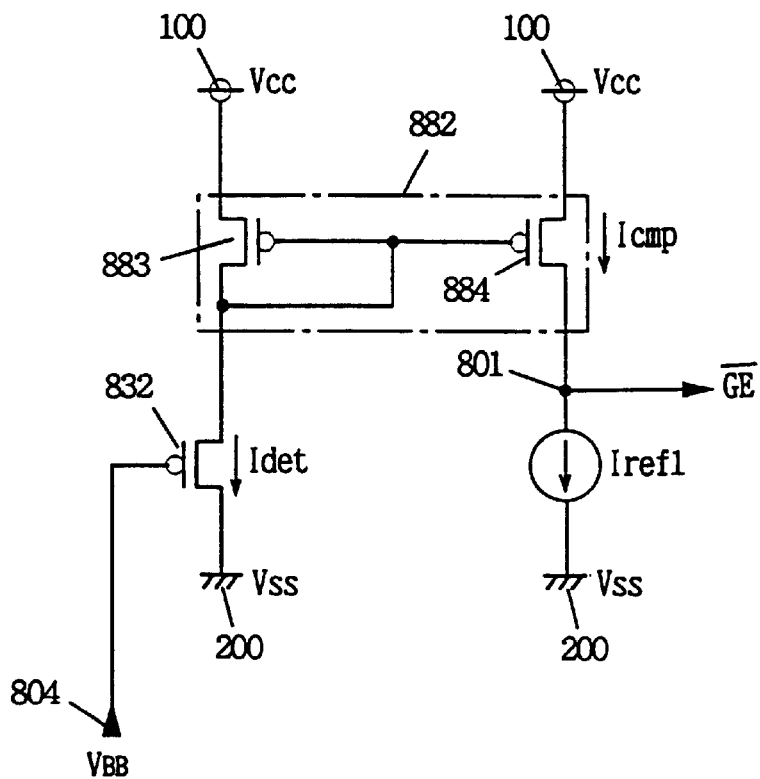
FIG. 80 is a schematic diagram showing a specific structure of the internal potential detecting circuit shown in FIG. 79.
Figure 81:
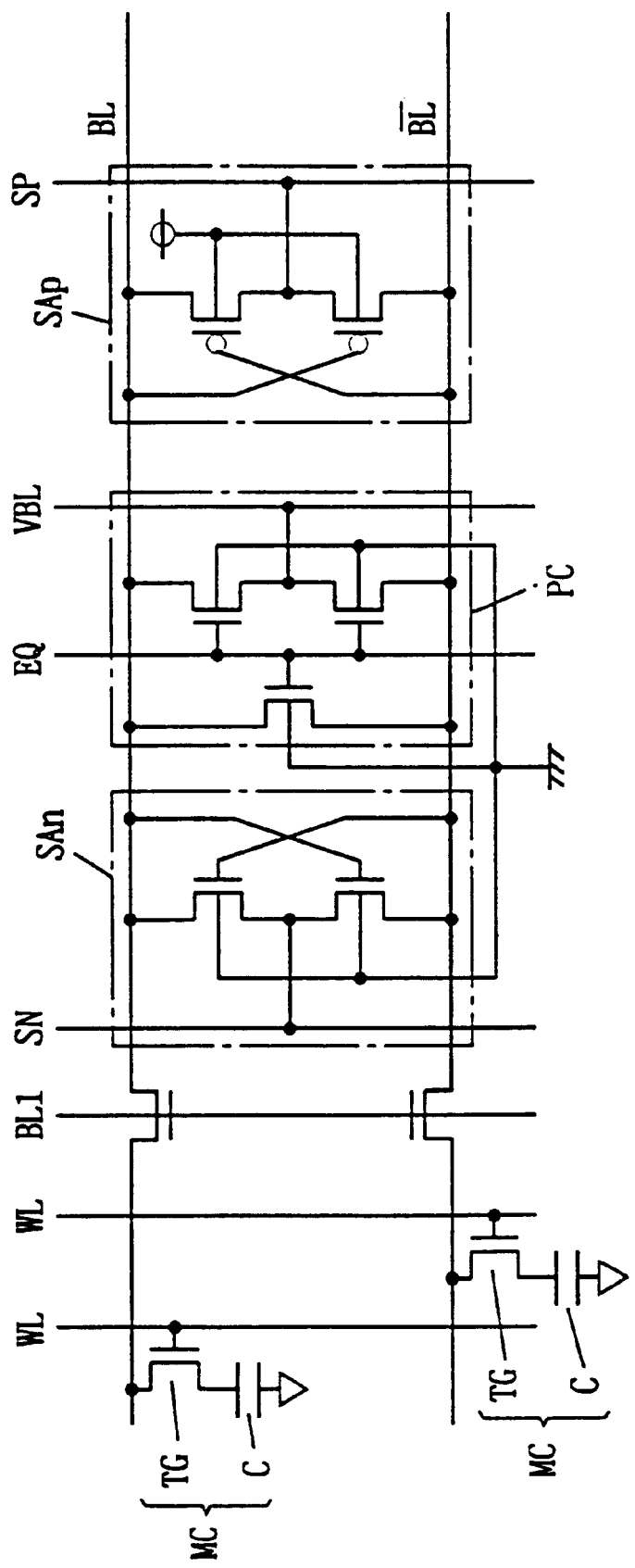
FIG. 81 is a schematic diagram showing a main structure of a conventional DRAM.
Figure 82:
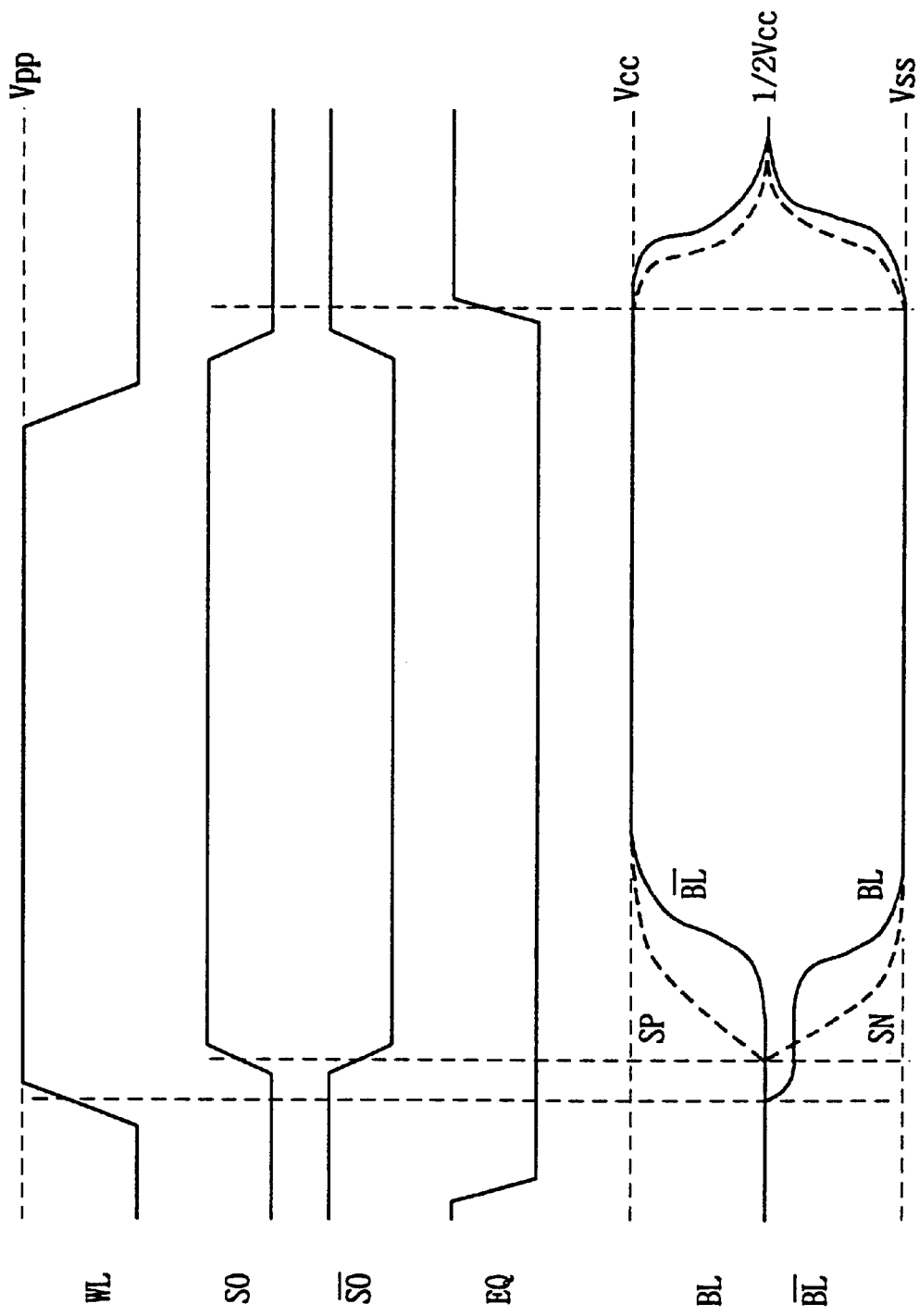
FIG. 82 is a timing chart showing an operation of the DRAM shown in FIG. 81.

FIG. 80 is a circuit diagram showing a specific structure of the internal potential detecting circuit shown in FIG. 79. Referring to FIG. 80, the resistance element 830 of FIG. 79 is formed by a P channel MOS transistor 832, of which gate electrode is connected to detection node 804. Substrate potential $V_{BB}$ is applied to detection node 804. In the internal potential detecting circuit, a current mirror circuit 882 consisting of P channel MOS transistors 883 and 884 is provided. More specifically, in the internal potential detecting circuit shown in FIG. 80, not the detection current $I_{det}$ is directly supplied to output node 801, but current for comparison $I_{cmp}$ generated by current mirror circuit 882 in response to detection current $I_{det}$ is directly supplied to output node 801.

In the internal potential detecting circuit, when the substrate potential $V_{BB}$ applied to detection node 804 is increased, conduction resistance of transistor 832 increases, and accordingly, detection current $I_{det}$ decreases. Since current for comparison $I_{cmp}$ decreases in response to the detection current $I_{det}$, output node 801 is discharged by the reference current $I_{ref}1$. Therefore, when substrate potential $V_{BB}$ becomes higher than the prescribed level, current for comparison $I_{cmp}$ becomes larger than the referent current $I_{ref}1$, and enable signal /GE attains to the L level. In response to the L level enable signal /GE, substrate potential generating circuit is activated.

In the internal potential detecting circuit in accordance with Embodiment 58, whether or not the substrate potential $V_{BB}$ has attained the prescribed level is determined. Further, since constant reference current $I_{ref}1$ flows from output node 801 even when ground potential Vss fluctuates, the detection level of the internal potential detecting circuit does not fluctuate. Therefore, when the substrate potential generating circuit is controlled by using the internal potential detecting circuit, a constant substrate potential $V_{BB}$ which is not dependent on the fluctuation of ground potential Vss can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A reference potential generating circuit for generating a reference potential between first and second potentials, comprising:

an output node at which said reference potential is generated;

a first transistor of a first conductivity type having one conduction electrode connected to said output node, and another conduction electrode connected to a first node to which a third potential is applied;

a second transistor of a second conductivity type having one conduction electrode connected to said output node, and another conduction electrode connected to a second node to which a fourth potential is applied;

a third transistor of the first conductivity type having one conduction electrode connected to said output node, another conduction electrode connected to a third node to which a fifth potential is applied, and a channel length longer than that of said first transistor;

a fourth transistor of the second conductivity type having one conduction electrode connected to said output node, another conduction electrode connected to a fourth node to which a sixth potential is applied, and a channel length longer than that of said second transistor;

first applying means for applying a first control potential higher than said reference potential by at least a threshold voltage of said first transistor to control electrodes of said first and third transistors; and second applying means for applying a second control potential lower than said reference potential by at least a threshold voltage of said second transistor to control electrodes of said second and fourth transistors.

2. A reference potential generating circuit for generating a reference potential between first and second potentials, comprising:

(a) an output node at which said reference potential is generated;

(b) a power supply voltage converting circuit including
      first potential converting means for generating a third potential based on said first potential, and
      second potential converting means for generating a fourth potential based on said second potential; and (c) intermediate potential generating means for generating an intermediate potential between said third and fourth potentials as said reference potential, including
      a first transistor of a first conductivity type having one conduction electrode connected to said output node and another conduction electrode connected to a first node to which a fifth potential is applied, a second transistor of a second conductivity type having one conduction electrode connected to said output node, and another conduction electrode connected to a second node to which a sixth potential is applied, a third transistor of the second conductivity type having one conduction electrode connected to a third node to which said third potential is applied, another conduction electrode connected to a control electrode of said first transistor, and a control electrode connected to said output node, a fourth transistor of the first conductivity type having one conduction electrode connected to a fourth node to which said fourth potential is applied, another conduction electrode connected to a control electrode of said second transistor, and a control electrode connected to said output node, a fifth transistor of the first conductivity type having one conduction electrode, and another conduction electrode and a control electrode connected to each other and to said another conduction electrode of said third transistor, and a sixth transistor of the second conductivity type having one conduction electrode connected to said one conduction electrode of said fifth transistor, and another conduction electrode and a control electrode connected to each other and to said another conduction electrode of said fourth transistor.

3. The reference potential generating circuit according to claim 2, further comprising:

base potential generating means for generating a first base potential for said third potential, and a second base potential for said fourth potential, respectively; wherein said first potential converting means includes
      first comparing means for comparing said third potential with said first base potential, and
      means responsive to an output from said first comparing means for increasing said third potential when said third potential is lower than said first base potential; and said second potential converting means includes
      second comparing means for comparing said fourth potential with said second base potential, and
      means responsive to an output from said second comparing means for decreasing said fourth potential when said fourth potential is higher than said second base potential.

4. The reference potential generating circuit according to claim 3, wherein said base potential generating means includes:

a first output node at which said first base potential is generated;

a second output node at which said second base potential is generated;

current means for supplying a reference current;

a first output resistance element connected between said first and second output nodes, part of said reference current flowing therethrough;

a second output resistance element connected between said second output node and a fifth node to which the second potential is applied, said part of the reference current flowing therethrough; and feedback means for detecting remaining current of said reference current other than said part of the reference current, to increase the reference current supplied from said current means when said remaining current decreases, and to decrease the reference current supplied from said current means when said remaining current increases.

5. The reference potential generating circuit according to claim 3, wherein said base potential generating means includes:
- a first output node at which said first base potential is generated;
- a second output node at which said second base potential is generated;
- a first output resistance element connected between said first and second output nodes;
- a second output resistance element connected between said second output node and a fifth node to which said second potential is applied;
- a seventh transistor of the second conductivity type having one conduction electrode connected to a sixth node to which said first potential is applied, and another conduction electrode connected to said first output node; and
- control potential generating means for generating a prescribed control potential and supplying the generated control potential to a control electrode of said seventh transistor, including
  - a first path extending from a seventh node to an eighth node,
  - a second path extending from said seventh node to said eighth node,
  - a first current mirror circuit responsive to a current flowing through said first path for controlling a current flowing through said second path,
  - a second current mirror circuit responsive to the current flowing through said second path for controlling the current flowing through said first path,
  - a control node positioned in said first path and between said first and second current mirror circuits, connected to the control electrode of said seventh transistor, at which said control potential is generated, and
  - a resistance element connected between said second current mirror circuit and said eighth node in said first path.

6. The reference potential generating circuit according to claim 5, wherein said resistance element includes an MOS transistor having its gate electrode connected to said second output node.

7. The reference potential generating circuit according to claim 3, wherein said base potential generating means includes:
(a) first output node at which said first base potential is generated;
(b) a second output node at which said second base potential is generated;
(c) a first output resistance element connected between said first and second output nodes;
(d) a second output resistance element connected between said second output node and a fifth node to which said second potential is applied;
(e) a seventh transistor of the second conductivity type having one conduction electrode connected to a sixth node to which said first potential is applied and another conduction electrode connected to said first output node; and (f) control potential generating means for generating a prescribed control potential and supplying the generated control potential to a control electrode of said seventh transistor, including
- a first path extending from a seventh node to an eighth node,
- a second path extending from said seventh node to said eighth node,
- a first current mirror circuit responsive to a current flowing through said first path for controlling a current flowing through said second path,
- a second current mirror circuit responsive to the current flowing through said second path for controlling the current flowing said first path,
- a control node positioned in said first path and between said first and second current mirror circuits, connected to the control electrode of said seventh transistor, at which said control potential is generated,
- a first resistance element connected between said control node and said first current mirror circuit in said first path, and
- a second resistance element connected between said second current mirror circuit and said eighth node in said first path.

8. The reference potential generating circuit according to claim 7, wherein
- said first resistance element has one of positive and negative temperature coefficients, and
- said second resistance element has the other of the positive and negative temperature coefficients.

9. The reference potential generating circuit according to claim 7, wherein said first resistance element includes an eighth transistor of the second conductivity type having a control electrode connected to said eighth node.

10. The reference potential generating circuit according to claim 3, formed on one semiconductor substrate, comprising
- substrate potential detecting means for detecting substrate potential of said semiconductor substrate, comparing the detected substrate potential with said second base potential, for activating a substrate potential generating circuit for said semiconductor substrate.

11. The reference potential generating circuit according to claim 10, further comprising
- hysterisis means for providing said substrate potential detecting means with a prescribed hysterisis characteristic.

12. The reference potential generating circuit according to claim 2, formed on one semiconductor substrate, comprising
- substrate potential detecting means for detecting substrate potential of said semiconductor substrate, comparing the detected substrate potential with said fourth potential, for activating a substrate potential generating circuit for said semiconductor substrate.

13. An internal potential generating circuit for generating an internal potential, comprising:
- an output node at which the internal potential is generated;
- a reference potential generating circuit disposed to generate first and second reference potentials;
- a first transistor having one conduction electrode connected to said output node, another conduction electrode connected to a first node and a control electrode receiving the first reference potential;
- a second transistor having one conduction electrode connected to said output node, another conduction electrode connected to a second node and a control electrode receiving the second reference potential;

a third transistor having one conduction electrode connected to said output node, another conduction electrode connected to a third node and a control electrode receiving the first reference potential and having a threshold voltage larger in absolute value than that of said first transistor; and a fourth transistor having one conduction electrode connected to said output node, another conduction electrode connected to a fourth node and a control electrode receiving the second reference potential and having a threshold voltage larger in absolute value than that of said second transistor.

14. The internal potential generating circuit according to claim 13, wherein said third transistor has a channel length longer than that of said first transistor, and said fourth transistor has a channel length longer than that of said second transistor.

15. The internal potential generating circuit according to claim 13, wherein said first transistor has a back gate receiving a first substrate potential, said second transistor has a back gate receiving a second substrate potential, said third transistor has a back gate receiving a third substrate potential different from the first substrate potential, and said fourth transistor has a back gate receiving a fourth substrate potential different from the second substrate potential.

16. The internal potential generating circuit according to claim 13, wherein said third transistor has a channel width wider than that of said first transistor, and said fourth transistor has a channel width wider than that of said second transistor.

17. The internal potential generating circuit according to claim 14, wherein said third transistor has a channel width wider than that of said first transistor, and said fourth transistor has a channel width wider than that of said second transistor.

18. An internal potential generating circuit for generating an internal potential, comprising:

an output node at which the internal potential is generated;

a reference potential generating circuit connected between a first power supply node and a first ground node and generating first and second reference potentials;

a first transistor having one conduction electrode connected to said output node, another conduction electrode connected to a second power supply node and a control electrode receiving the first reference potential; and a second transistor having one conduction electrode connected to said output node, another conduction electrode connected to a second ground node and a control electrode receiving the second reference potential; wherein power supply potentials different from each other are respectively applied to the first and second power supply nodes and/or ground potentials different from each other are respectively applied to the first and second ground nodes.

19. A semiconductor circuit device comprising:

a first internal power supply circuit including a first transistor connected between a first external power supply node and a first internal power supply node, said first internal power supply circuit converting a first external power supply potential on the first external power supply node into a first internal power supply potential lower than the first external power supply potential to supply the first internal power supply node with the first internal potential;

a second internal power supply generating circuit including a second transistor connected between a second external power supply node and a second internal power supply node, said internal power supply generating circuit converting a second external power supply potential on the second external power supply node into a second internal power supply potential higher than the second external power supply potential to supply the second internal power supply node with the second internal potential; and means for controlling said first and second internal power supply circuits to conserve a difference between the first and second internal power supply potentials when the first and second internal power supply potentials vary.

20. The semiconductor circuit device according to claim 19, wherein said first internal power supply circuit further includes a first differential amplifier controlling said first transistor in response to the first internal power supply potential and a first reference potential;

said second internal power supply circuit further includes a second differential amplifier controlling said second transistor in response to the second internal power supply potential and a second reference potential; and said means for controlling includes a reference potential generating circuit disposed to generate the first and second reference potentials having a constant difference therebetween.

* * * * *